United States Patent
Okada et al.

(10) Patent No.: US 6,824,891 B2
(45) Date of Patent: Nov. 30, 2004

(54) LIGHT-EMITTING DEVICE AND MATERIAL THEREFOR

(75) Inventors: Hisashi Okada, Minami Ashigara (JP); Toshihiro Ise, Minami Ashigara (JP); Masayuki Mishima, Minami Ashigara (JP); Toshiki Taguchi, Minami Ashigara (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 09/935,711

(22) Filed: Aug. 24, 2001

(65) Prior Publication Data

US 2002/0055014 A1 May 9, 2002

(30) Foreign Application Priority Data

Aug. 24, 2000 (JP) .................................. P. 2000-254171
Feb. 15, 2001 (JP) .................................. P. 2001-038718
Aug. 3, 2001 (JP) .................................. P. 2001-236419

(51) Int. Cl.$^7$ .......................... H05B 33/14; C08F 26/06
(52) U.S. Cl. ....................... 428/690; 428/917; 313/504; 257/102; 257/103; 257/40; 252/301.16; 526/259; 526/261
(58) Field of Search ................................. 428/690, 917; 313/504; 257/40, 102, 103; 252/301.35, 301.16; 526/259, 261

(56) References Cited

U.S. PATENT DOCUMENTS 6,057,048 A * 5/2000 Hu et al. ..................... 428/690
6,310,360 B1 * 10/2001 Forrest et al. ................ 257/40

FOREIGN PATENT DOCUMENTS

JP 08-012967 A * 6/1994 ........... C09K/11/06
JP 8-78163 * 3/1996

OTHER PUBLICATIONS

C.W. Tang and S.A. VanSlyke, "Organic electroluminescent diodes", Applied Physics Letters, vol. 51, p. 913–915 (1987).

M.A. Baldo, S. Lamansky, P.E. Burrows, M.E. Thompson and S.R. Forrest, "Very high-efficiency green organic light-emitting devices based on electrophosphorescence", Applied Physics letters, vol. 75, p. 4–6 (1999).

* cited by examiner

*Primary Examiner*—Dawn Garrett
(74) *Attorney, Agent, or Firm*—Sughrue Mion, PLLC

(57) ABSTRACT

A light-emitting device comprising a pair of electrodes formed on a substrate, and organic compound layers comprising a light-emitting layer provided in between the electrodes, wherein at least one of the organic compound layers comprises a heterocyclic compound having at least two hetero atoms and a phosphorescent compound.

28 Claims, No Drawings

LIGHT-EMITTING DEVICE AND MATERIAL THEREFOR

FIELD OF THE INVENTION

This invention relates to a light-emitting device and a material therefor. More particularly, it relates to a light-emitting device having high brightness, high luminescence efficiency, and excellent durability.

BACKGROUND OF THE INVENTION

Various light-emitting devices have now been intensively researched and developed. In particular, organic electroluminescent (EL) devices are attracting attention as promising light-emitting devices that emit light with high luminescence brightness at a low voltage. For example, an EL device having an organic thin film formed by vacuum evaporation of an organic compound is known (*Applied Physics Letters*, vol. 51, p. 913 (1987)). This device comprises a laminate of tris(8-hydroxyquinolinato)aluminum (Alq) as an electron-transporting material and an amine compound as a hole-transporting material to exhibit markedly improved EL characteristics over conventional single layer type devices.

Application of an organic EL device to color displays have recently been studied. Before a high performance color display can be developed, it is necessary to improve light emission characteristics each of blue, green and red light.

*Applied Physics Letters*, vol. 75, p. 4 (1999) reports a green light-emitting device which makes use of light emission from an iridium complex for improving light emission characteristics. The device reported achieves an external quantum efficiency of 8%, which is higher than the 5% level that had been regarded as an upper limit that could be reached by predecessors. However, it has insufficient durability, still needing improvement.

Of organic light-emitting devices, while it is those having an organic substance deposited by vacuum evaporation that accomplish high brightness light emission, it is desirable to make a device by a coating method from the standpoint of simplification of production process, processability, and increase of a display area. However, light-emitting devices prepared by general coating methods are inferior to those prepared by vacuum evaporation in luminescence brightness and efficiency, which has been an outstanding problem waiting for solution.

SUMMARY OF THE INVENTION

An object of the present invention is to provide a light-emitting device which provides high brightness and high light emission efficiency and has excellent durability.

The object of the invention is accomplished by the following means.

(1) A light-emitting device comprising:
a pair of electrodes formed on a substrate; and
organic compound layers comprising a light-emitting layer provided in between the electrodes,
wherein at least one of the organic compound layers comprises a heterocyclic compound having at least two hetero atoms and a phosphorescent compound.
(2) The light-emitting device according to (1) above, wherein the phosphorescent compound is an organic metal complex.
(3) The light-emitting device according to (2) above, wherein the organic metal complex is an ortho-metalated metal complex.
(4) The light-emitting device according to (1) above, wherein the heterocyclic compound is represented by formula (I):

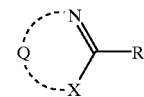

(I)

wherein R represents a hydrogen atom or a substituent; X represents —O—, —S—, =N— or =N—$R^a$; $R^a$ represents a hydrogen atom, an aliphatic hydrocarbon group, an aryl group or a heterocyclic group; and Q represents an atomic group necessary for forming a hetero ring together with N and X.

(5) A polymer comprising a repeating unit represented by formula (D-I):

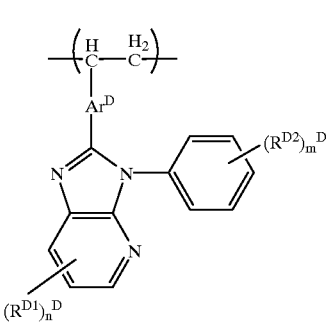

(D-I)

wherein $Ar^D$ represents an arylene group or a divalent heterocyclic group; $R^{D1}$ and $R^{D2}$ each independently represent a hydrogen atom or a substituent; $n^D$ represents an integer of 0 to 3; and $m^D$ represents an integer of 0 to 5.

(6) The light-emitting device according to (1) above, wherein the heterocyclic compound is a polymer comprising a repeating unit represented by formula (D):

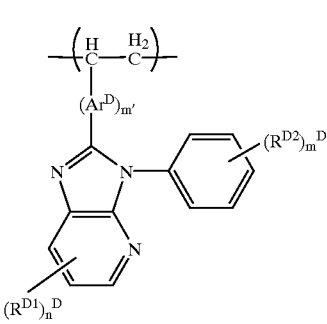

(D)

wherein $Ar^D$ represents an arylene group or a divalent heterocyclic group; $R^{D1}$ and $R^{D2}$ each independently represent a hydrogen atom or a substituent; $n^D$ represents an integer of 0 to 3; $m^D$ represents an integer of 0 to 5, and m' represents 0 or 1.

(7) The light-emitting device according to (6) above, wherein the substituent is a group selected from the group consisting of an alkyl group, an alkenyl group, an alkynyl group, an aryl group, an alkoxy group, an aryloxy group, an acyl group, a halogen atom, a cyano group, a heterocyclic group, and a silyl group.

(8) A polymer comprising a repeating unit represented by formula (E-I):

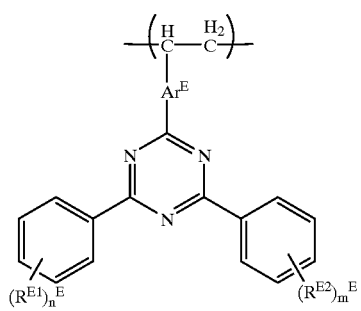

(E-I)

wherein $Ar^E$ represents an arylene group or a divalent heterocyclic group; $R^{E1}$ and $R^{E2}$ each independently represent a hydrogen atom or a substituent; $n^E$ and $m^E$ each independently represent an integer of 0 to 5.

(9) The light-emitting device according to (1) above, wherein the heterocyclic compound is a polymer comprising a repeating unit represented by formula (E):

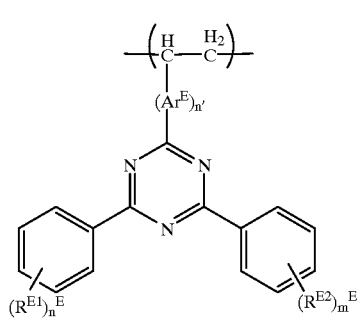

(E)

wherein $Ar^E$ represents an arylene group or a divalent heterocyclic group; $R^{E1}$ and $R^{E2}$ each independently represent a hydrogen atom or a substituent; $n^E$ and $m^E$ each independently represent an integer of 0 to 5; and n' represents 0 or 1.

(10) The light-emitting device according to (9) above, wherein the substituent is a group selected from the group consisting of an alkyl group, an alkenyl group, an alkynyl group, an aryl group, an alkoxy group, an aryloxy group, an acyl group, a halogen atom, a cyano group, a heterocyclic group, and a silyl group.

(11) The light-emitting device according to (3) above, wherein the ortho-metalated metal complex is an iridium complex.

(12) The light-emitting device according to (1) above, wherein the organic compound layers comprise a polymer.

(13) The light-emitting device according to (1) above, wherein the phosphorescent compound has a phosphorescence quantum yield at room temperature of at least 25%.

(14) The light-emitting device according to (3) above, wherein the ortho-metalated metal complex contains 5 to 100 carbon atoms.

(15) The light-emitting device according to (3) above, wherein the ortho-metalated metal complex is a compound having a partial structure represented by formula (K-1):

(K-1)

wherein M represents a transition metal; $Q_{k1}$ represents an atomic group necessary for forming a 5- or 6-membered aromatic ring; and $Q_{k2}$ represents an atomic group necessary for forming a 5- or 6-membered aromatic azole ring;
or tautomer of the compound.

DETAILED DESCRIPTION OF THE INVENTION

The heterocyclic compound having at least two hetero atoms is a monocyclic, polycyclic or condensed-ring compound having two or more atoms other than a carbon atom and a hydrogen atom in its heterocyclic skeleton. The heterocyclic skeleton preferably contains two or more hetero atoms selected from nitrogen, oxygen and sulfur. A still preferred heterocyclic skeleton is an aromatic heterocyclic ring having at least one nitrogen atom, particularly two or more nitrogen atoms in the nucleus. The hetero atoms can be at either a condensed position or a non-condensed position.

Examples of the heterocyclic skeleton having at least two hetero atoms are pyrazole, imidazole, pyrazine, pyrimidine, indazole, purine, phthalazine, naphthyridine, quinoxaline, quinazoline, cinnoline, pteridine, phenanthroline, pyrroloimidazole, pyrrolotriazole, pyrazoloimidazole, pyrazolotriazole, pyrazolopyrimidine, pyrazolotriazine, imidazoimidazole, imidazopyridazine, imidazopyridine, imidazopyrazine, triazolopyridine, benzimidazole, naphthimidazole, benzoxazole, naphthoxazole, benzothiazole, naphthothiazole, benzotriazole, tetraazaindene, and triazine. Preferred of them are imidazopyridazine, imidazopyridine, imidazopyrazine, benzimidazole, naphthimidazole, benzoxazole, naphtoxazole, benzothiazole, naphthothiazole, and triazine. Still preferred are imidazopyridine, imidazopyrazine, benzimidazole, naphthimidazole, and triazine. Particularly preferred are imidazopyridine, benzimidazole, naphthimidazole, and triazine. Imidazopyridine and triazine are the most preferred.

The heterocyclic compounds having at least two hetero atoms are preferably those represented by formula (I):

(I)

wherein R represents a hydrogen atom or a substituent; X represents —O—, —S—, =N— or =N—$R^a$; $R^a$ represents a hydrogen atom, an aliphatic hydrocarbon group, an aryl group or a heterocyclic group; and Q represents an atomic group necessary for forming a hetero ring together with N and X; R and X or Q may be connected together to form a ring.

The substituent as R includes an alkyl group (preferably one having 1 to 30, particularly 1 to 20, especially 1 to 10, carbon atoms, e.g., methyl, ethyl, isopropyl, t-butyl, n-octyl, n-decyl, n-hexadecyl, cyclopropyl, cyclopentyl and cyclohexyl), an alkenyl group (preferably one having 2 to 30, particularly 2 to 20, especially 2 to 10, carbon atoms, e.g., vinyl, allyl, 2-butenyl, and 3-pentenyl), an alkynyl group (preferably one having 2 to 30, particularly 2 to 20, especially 2 to 10, carbon atoms, e.g., propargyl and 3-pentynyl), an aryl group (preferably one containing 6 to 30 carbon atoms, particularly 6 to 20 carbon atoms, especially 6 to 12 carbon atoms, e.g., phenyl, p-methylphenyl, and naphthyl), an amino group (preferably one having up to 30 carbon atoms, particularly up to 24 carbon atoms, especially up to 20 carbon atoms, e.g., amino, methylamino, dimethylamino, diethylamino, dibenzylamino, diphenylamino, ditolylamino, and dinaphthylamino, still preferably diphenylamino, ditolylamino or dinaphthylamino), an alkoxy group (preferably one having 1 to 30, particularly 1 to 20, especially 1 to 10, carbon atoms, e.g., methoxy, ethoxy, butoxy, 2-ethylhexyloxy), an aryloxy group (preferably one having 6 to 30, particularly 6 to 20, especially 6 to 12 carbon atoms, e.g., phenoxy, 1-naphthoxy, and 2-naphthoxy), a heterocylic oxy group (preferably one having 2 to 20, particularly 3 to 16, especially 4 to 12, carbon atoms, e.g., pyridinooxy, pyrimidinooxy, pyridazinooxy, and benzimidazolyloxy), a silyloxy group (preferably one having 3 to 40, particularly 7:3 to 30, especially 3 to 20, carbon atoms, e.g., trimethylsilyloxy, t-butyldimethylsilyloxy and triphenylsilyloxy), an acyl group (preferably one containing 1 to 30, particularly 1 to 20, especially 2 to 12, carbon atoms, e.g., acetyl, benzoyl, formyl, and pivaloyl), an alkoxycarbonyl group (preferably one having 2 to 30, particularly 2 to 20, especially 2 to 12, carbon atoms, e.g., methoxycarbonyl and ethoxycarbonyl), an aryloxycarbonyl group (preferably one having 7 to 30, particularly 7 to 20, especially 7 to 12, carbon atoms, e.g., phenoxycarbonyl), an acyloxy group (preferably one having 2 to 30, particularly 2 to 20, especially 2 to 10, carbon atoms, e.g., acetoxy and benzoyloxy), an acylamino group (preferably one having 2 to 30, particularly 2 to 20, especially 2 to 10, carbon atoms, e.g., acetylamino and benzoylamino), an alkoxycarbonylamino group (preferably one having 2 to 30, particularly 2 to 20, especially 2 to 12, carbon atoms, e.g., a methoxycarbonylamino), an aryloxycarbonylamino group (preferably one containing 7 to 30, particularly 7 to 20, especially 7 to 12 carbon atoms, e.g., phenoxycarbonylamino), a sulfonylamino group (preferably one having 1 to 30, particularly 1 to 20, especially 1 to 12, carbon atoms, e.g., methanesulfonylamino and benzenesulfonylamino), a sulfamoyl group (preferably one having up to 30, particularly up to 20, especially up to 12, carbon atoms, e.g., sulfamoyl, methylsulfamoyl, dimethylsulfamoyl, and phenylsulfamoyl), a carbamoyl group (preferably one containing 1 to 30, particularly 1 to 20, especially 1 to 12, carbon atoms, e.g., carbamoyl, methylcarbamoyl, diethylcarbamoyl, and phenylcarbamoyl), an alkylthio group (preferably one having 1 to 30, particularly 1 to 20, especially 1 to 12, carbon atoms, e.g., methylthio and ethylthio), an arylthio group (preferably one having 6 to 30, particularly 6 to 20, especially 6 to 12, carbon atoms, e.g., phenylthio), a heterocyclic thio group (preferably one having 1 to 30, particularly 1 to 20, especially 1 to 12, carbon atoms, e.g., pyridylthio, 2-benzimidazolylthio, 2-benzoxazolylthio, and 2-benzthiazolylthio), a sulfonyl group (preferably one having 1 to 30, particularly 1 to 20, especially 1 to 12, carbon atoms, e.g., mesyl and tosyl), a sulfinyl group (preferably one having 1 to 30, particularly 1 to 20, especially 1 to 12, carbon atoms, e.g., methanesulfinyl and benzenesulfinyl), a ureido group (preferably one having 1 to 30, particularly 1 to 20, especially 1 to 12, carbon atoms, e.g., ureido, methylureido, and phenylureido), a phosphoric acid amido group (preferably one having 1 to 30, particularly 1 to 20, especially 1 to 12, carbon atoms, e.g., a diethylphosphoric acid amido and phenylphosphoric acid amido), a hydroxyl group, a mercapto group, a halogen atom (e.g., fluorine, chlorine, bromine and iodine), a cyano group, a sulfo group, a carboxyl group, a nitro group, a hydroxamic acid group, a sulfino group, a hydrazino group, an imino group, a heterocyclic group (preferably one having 1 to 30 carbon atoms, particularly 1 to 12 carbon atoms, the hetero atom including nitrogen, oxygen and sulfur, e.g., imidazolyl, pyridyl, quinolyl, furyl, thienyl, piperidyl, morpholino, benzoxazolyl, benzimidazolyl, benzothiazolyl, carbazolyl, and azepinyl ), and a silyl group (preferably one containing 3 to 40, particularly 3 to 30, especially 3 to 24, carbon atoms, e.g., trimethylsilyl and triphenylsilyl). These substituents can further have a substituent(s). Where they have two or more substituents, the substituents may be the same or different or, if possible, may be linked to form a ring.

The substituent as R is preferably an aliphatic hydrocarbon group, an aryl group or a heterocyclic group, still preferably an aryl group or an aromatic heterocyclic group, particularly preferably an aryl group or a 5- or 6-membered aromatic heterocyclic group, especially preferably an aryl group or a 5- or 6-membered aromatic heterocyclic group containing at least one of nitrogen, sulfur and oxygen atoms. An aryl group is the most preferred.

X represents —O—, —S—, =N— or =N—$R^a$, wherein $R^a$ represents a hydrogen atom, an aliphatic hydrocarbon group, an aryl group or a heterocyclic group.

The aliphatic hydrocarbon group as represented by $R^a$ includes a straight-chain, branched or cyclic alkyl group (preferably one having 1 to 20 carbon atoms, particularly 1 to 12 carbon atoms, especially 1 to 8 carbon atoms, e.g., methyl, ethyl, isopropyl, t-butyl, n-octyl, n-decyl, n-hexadecyl, cyclopropyl, cyclopentyl or cyclohexyl), an alkenyl group (preferably one having 2 to 20, particularly 2 to 12, especially 2 to 8, carbon atoms, e.g., vinyl, allyl, 2-butenyl, and 3-pentenyl), and an alkynyl group (preferably one having 2 to 20, particularly 2 to 12, especially 2 to 8, carbon atoms, e.g., propargyl and 3-pentynyl), with an alkyl group being preferred.

The aryl group as represented by $R^a$ is a monocyclic or condensed aryl group preferably having 6 to 30, particularly 6 to 20, especially 6 to 12, carbon atoms, such as phenyl, 2-methylphenyl, 3-methylphenyl, 4-methylphenyl, 2-methoxyphenyl, 3-trifluoromethylphenyl, pentafluorophenyl, 1-naphthyl and 2-naphthyl.

The heterocyclic group as $R^a$ is a monocyclic or condensed heterocyclic group which preferably contains 1 to 20, particularly 1 to 12, especially 2 to 10, carbon atoms, preferably an aromatic heterocyclic group having at least one of a nitrogen atom, an oxygen atom, a sulfur atom and a selenium atom. Specific examples of the heterocyclic group as $R^a$ are pyrrolidine, piperidine, piperazine, morpholine, thiophene, selenophene, furan, pyrrole, imidazole, pyrazole, pyridine, pyrazine, pyridazine, pyrimidine, triazole, triazine, indole, indazole, purine, thiazoline, thiazole, thiadiazole, oxazoline, oxazole, oxadiazole, quinoline, isoquinoline, phthalazine, naphthyridene, quinoxaline, quinazoline, cinnoline, pteridine, acridine, phenanthroline, phenazine, tetrazole, benzimidazole, benzoxazole, benzothiazole, benzotriazole, tetraazaindene, carbazole, and azepin. Preferred of them are furan, thiophene, pyridine, pyrazine, pyrimidine, pyridazine, triazine, quinoline, phthalazine, naphthyridine, quinoxaline, and quinazoline. Furan, thiophene, pyridine and quinoline are still preferred. Quinoline is particularly preferred.

The aliphatic hydrocarbon group, the aryl group or the heterocyclic group as $R^a$ can have a substituent(s). The substituents include the groups and the atoms enumerated above as the substituent R. The preference among the substituents R also applies to the substituents of $R^a$.

$R^a$ is preferably an alkyl group, an aryl group, or an aromatic heterocyclic group, still preferably an aryl group or an aromatic heterocyclic group, particularly preferably an aryl group.

X is preferably O, N or N—$R^a$, still preferably N or N—$R^a$, particularly preferably N or N—Ar, wherein Ar is an aryl group (preferably one having 6 to 30, particularly 6 to 20, especially 6 to 12, carbon atoms) or an aromatic heterocyclic group (preferably one having 1 to 20, particularly 1 to 12, especially 2 to 10, carbon atoms), preferably an aryl group.

Q represents an atomic group necessary to form a hetero ring together with N and X. The hetero ring completed by Q is preferably an aromatic hetero ring, particularly a 5- to 8-membered aromatic hetero ring, especially a 5- or 6-membered aromatic hetero ring.

Specific examples of the hetero ring formed by Q include imidazole, oxazole, thiazole, selenazole, tellurazole, triazole, tetrazole, oxadiazole, thiadiazole, oxatriazole, thiatriazole, pyrimidine, pyridazine, pyrazine, triazine, and tetrazine. Preferred of them are imidazole, oxazole, thiazole and triazine, with imidazole, oxazole, and triazine being still preferred. Imidazole and triazine are particularly preferred.

The hetero ring formed by Q may form a condensed ring with other ring(s) and may have a substituent(s). The substituents of Q include the groups and atoms recited as R. Preferred of them include an alkyl group, an alkenyl group, an alkynyl group, an aryl group, an amino group, an alkoxy group, an aryloxy group, an acyl group, an alkoxycarbonyl group, an aryloxycarbonyl group, an acyloxy group, an acylamino group, a sulfonylamino group, a sulfamoyl group, a carbamoyl group, an alkylthio group, an arylthio group, a sulfonyl group, a halogen atom, a cyano group, and a heterocyclic group. Still preferred are an alkyl group, an alkenyl group, an aryl group, an alkoxy group, an aryloxy group, a halogen atom, a cyano group, and a heterocyclic group. Particularly preferred are an alkyl group, an aryl group, an alkoxy group, an aryloxy group, and an aromatic heterocyclic group. An alkyl group, an aryl group, an alkoxy group, and an aromatic heterocyclic group are especially preferred.

Of the compounds represented by formula (I) those represented by formula (II) shown below and triazine compounds (described later) are preferred.

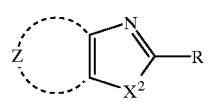

(II)

wherein R is as defined above (the preference described above also applies); $X^2$ represents —O—, —S— or =N—$R^a$, wherein $R^a$ is as defined above (the preference described above also applies); and z represents an atomic group necessary for forming an aromatic ring.

In formula (II), $X^2$ is preferably —O— or =N—$R^a$, still preferably =N—$R^a$, particularly preferably =N—Ar, wherein Ar represents an aryl group (preferably one having 6 to 30, particularly 6 to 20, especially 6 to 12, carbon atoms) or an aromatic heterocyclic group (preferably one having 1 to 20, particularly 1 to 12, especially 2 to 10, carbon atoms), preferably an aryl group.

The aromatic ring completed by Z includes an aromatic hydrocarbon ring and an aromatic heterocyclic ring, such as benzene, pyridine, pyrazine, pyrimidine, pyridazine, triazine, pyrrole, furan, thiophene, selenophene, tellurophene, imidazole, thiazole, selenazole, tellurazole, thiadiazole, oxadiazole, and pyrazole. Preferred of them are benzene, pyridine, pyrazine, pyrimidine, and pyridazine. Still preferred are benzene, pyridine, and pyrazine, with benzene and pyridine being particularly preferred. Pyridine is the most desirable.

The aromatic ring formed by Z may form a condensed ring together with other ring(s) and may have a substituent(s). The substituent include those recited as R. Preferred substituents of the aromatic ring formed by Z include an alkyl group, an alkenyl group, an alkynyl group, an aryl group, an amino group, an alkoxy group, an aryloxy group, an acyl group, an alkoxycarbonyl group, an aryloxycarbonyl group, an acyloxy group, an acylamino group, an alkoxycarbonylamino, an aryloxycarbonylamino, a sulfonylamino group, a sulfamoyl group, a carbamoyl group, an alkylthio group, an arylthio group, a sulfonyl group, a halogen atom, a cyano group, and a heterocyclic group. Preferred of them are an alkyl group, an alkenyl group, an aryl group, an alkoxy group, an aryloxy group, a halogen atom, a cyano group, and a heterocyclic group. Still preferred are an alkyl group, an aryl group, an alkoxy group, an aryloxy group, and an aromatic heterocyclic group. An alkyl group, an aryl group, an alkoxy group, and an aromatic heterocyclic group are particularly preferred.

Of the compounds represented by formula (II), still preferred are those represented by formula (A-II) or (B-II):

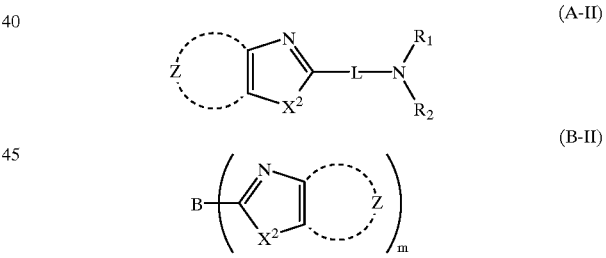

In formula (A-II), $X^2$ and Z are as defined for formula (II) (the preference also applies); $R_1$ and $R_2$, which may be the same or different, each represent a hydrogen atom, an aliphatic hydrocarbon group, an aryl group or a heterocyclic group; L represents a linking group; a combination of $R_1$ and $R_2$, a combination of $R_1$ and L, a combination of $R_2$ and L, or a combination of $X^2$ and L may be taken together to form a ring where possible.

The aliphatic hydrocarbon group as represented by $R_1$ and $R_2$ includes a straight-chain, branched or cyclic alkyl group (preferably one having 1 to 30 carbon atoms, particularly 1 to 20 carbon atoms, especially 1 to 12 carbon atoms, e.g., methyl, ethyl, isopropyl, t-butyl, n-octyl, n-decyl, n-hexadecyl, cyclopropyl, cyclopentyl or cyclohexyl), an alkenyl group (preferably one having 2 to 30, particularly 2 to 20, especially 2 to 12, carbon atoms, e.g., vinyl, allyl, 2-butenyl, and 3-pentenyl), and an alkynyl group (preferably one having 2 to 30, particularly 2 to 20, especially 2 to 12, carbon atoms, e.g., propargyl and 3-pentynyl), with an alkyl group and an alkenyl group being preferred. It is particularly preferred that $R_1$ and $R_2$ be each a methyl group, an ethyl group, a propyl group, a butyl group or an allyl group, or $R_1$ and $R_2$ be connected to L to form a condensed ring (e.g., a julolidine ring), or $R_1$ and $R_2$ be connected each other to form a condensed ring (e.g., a pyrrole ring or an azepin ring).

The aryl group as represented by $R_1$ and $R_2$ is a monocyclic or condensed aryl group, preferably a mono- to tetracyclic aryl group having 6 to 30 carbon atoms (e.g., phenyl, naphthyl, anthryl, phenanthryl or pyrenyl), still preferably a phenyl group having 6 to 20 carbon atoms or a naphthyl group having 10 to 24 carbon atoms, particularly preferably a phenyl group having 6 to 12 carbon atoms or a naphthyl group having 10 to 16 carbon atoms.

The heterocyclic group as $R_1$ and $R_2$ is a 3- to 10-membered saturated or unsaturated heterocyclic group containing at least one of a nitrogen atom, an oxygen atom, a sulfur atom and a selenium atom, which may be a monocyclic ring or may further be condensed with other ring(s), preferably a 3- to 10-membered aromatic heterocyclic group containing at least one of a nitrogen atom, an oxygen atom, a sulfur atom and a selenium atom, still preferably a 5- or 6-membered aromatic heterocyclic group, particularly preferably a 5- or 6-membered heterocyclic group containing a nitrogen atom or a sulfur atom.

Specific examples of the hetero ring as $R_1$ and $R_2$ are pyrrolidine, piperidine, piperazine, morpholine, thiophene, selenophene, furan, pyrrole, imidazole, pyrazole, pyridine, pyrazine, pyridazine, pyrimidine, triazole, triazine, indole, indazole, purine, thiazoline, thiazole, thiadiazole, oxazoline, oxazole, oxadiazole, quinoline, isoquinoline, phthalazine, naphthyridene, quinoxaline, quinazoline, cinnoline, pteridine, acridine, phenanthroline, phenazine, tetrazole, benzimidazole, benzoxazole, benzothiazole, benzotriazole, and tetraazaindene. Preferred of them are thiophene, triazole, oxazole, pyridine, triazine, and quinoline. Still preferred are thiophene, pyridine, triazine, and quinoline. Thiophene is particularly preferred.

The aliphatic hydrocarbon group, the aryl group or the heterocyclic group as $R_1$ and $R_2$ can have a substituent(s). The substituents include the groups and the atoms recited above as the substituent R. The preference among the substituents R also applies here.

$R_1$ and $R_2$ each preferably represent an alkyl group, an aryl group, or an aromatic heterocyclic group, still preferably an aryl group or an aromatic heterocyclic group, particularly preferably an aryl group.

The linking group as represented by L preferably includes a single bond and a linking group made up of C, N, O, S, Se, Te, Si, Ge, etc., still preferably a single bond, an alkylene group, an alkenylene group, an alkynylene group, an arylene group, a divalent hetero ring (preferably an aromatic hetero ring, particularly one containing an azole ring, a thiophene ring or a furan ring) or a combination of N and these linking groups, particularly preferably an arylene group, a divalent aromatic hetero ring or a combination of N and these linking groups, especially preferably an arylene group or a divalent aromatic hetero ring. Phenylene, thienylene or a combination of N and these groups are desirable. Phenylene is the most desirable. Where possible, L is connected to $R_1$ or $R_2$ to form a ring.

The linking group L may have a substituent(s). The substituents include those described as R. Preferred substituents include an alkyl group, an alkenyl group, an alkynyl group, an aryl group, an alkoxy group, an aryloxy group, an acyl group, a halogen atom, a cyano group, a heterocyclic group, and a silyl group. Still preferred of them are an alkyl group, an alkenyl group, an alkynyl group, an aryl group, an alkoxy group, an aryloxy group, a halogen atom, a cyano group, and an aromatic heterocyclic group, with an alkyl group, an aryl group and an aromatic heterocyclic group being particularly preferred.

In formula (B-II), $X^2$ and Z are as defined above (the preference also applies); B represents a linking group; and m represents an integer of 2 or greater.

The linking group represented by B is preferably one made up of C, N, O, S, Si, Ge, etc., still preferably an alkylene group, an alkenylene group, an alkynylene group, an arylene group, a polyvalent aromatic ring, or a combination of N and these linking groups. The polyvalent aromatic ring may be a carbon ring or a hetero ring, the hetero ring being preferably one containing an azole ring, a thiophene ring or a furan ring. Particularly preferred linking group is an arylene group, a trivalent aromatic ring or a combination of N and these linking groups. A trivalent aromatic ring or its combination with N is especially preferred. A 1,3,5-benzenetriyl group is the most preferred.

m in formula (B-II) is preferably 2 to 8, still preferably 2 to 6, particularly preferably 2 to 4, especially preferably 2 or 3, the most preferably 3.

Specific examples of the linking groups represented by B (inclusive of examples of L) include a single bond and the following groups.

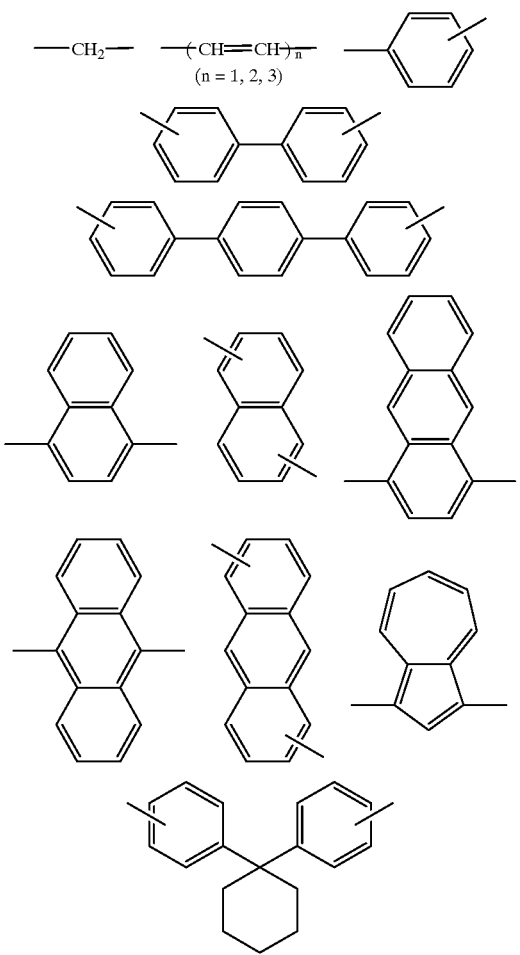

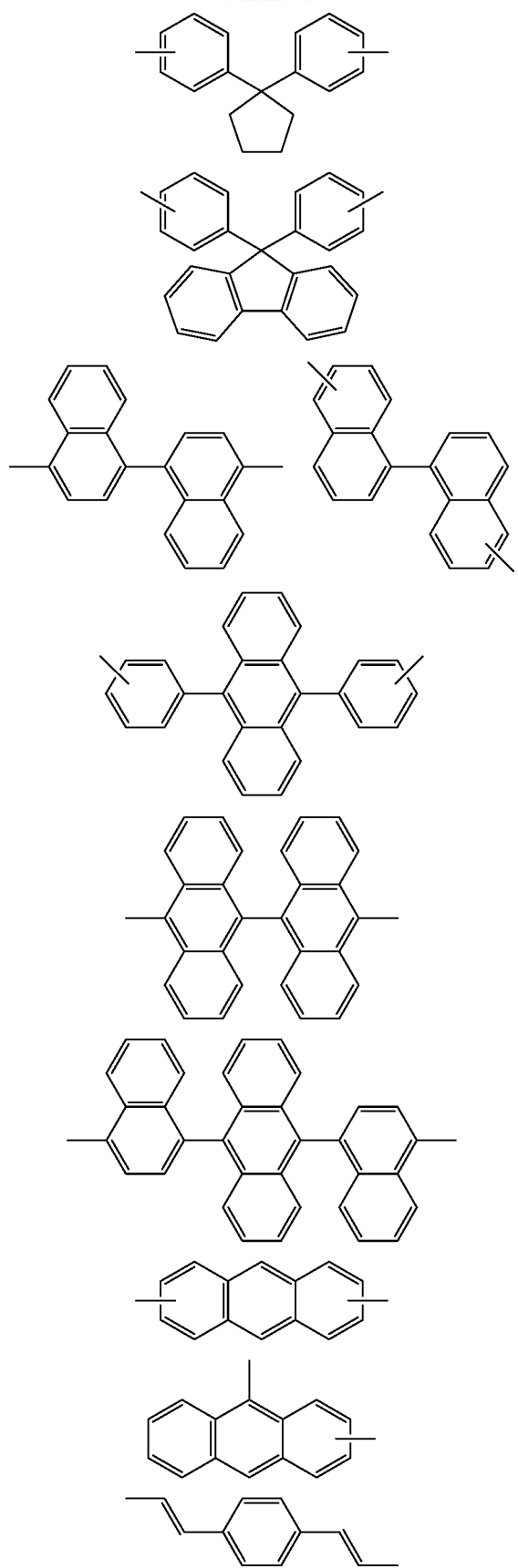
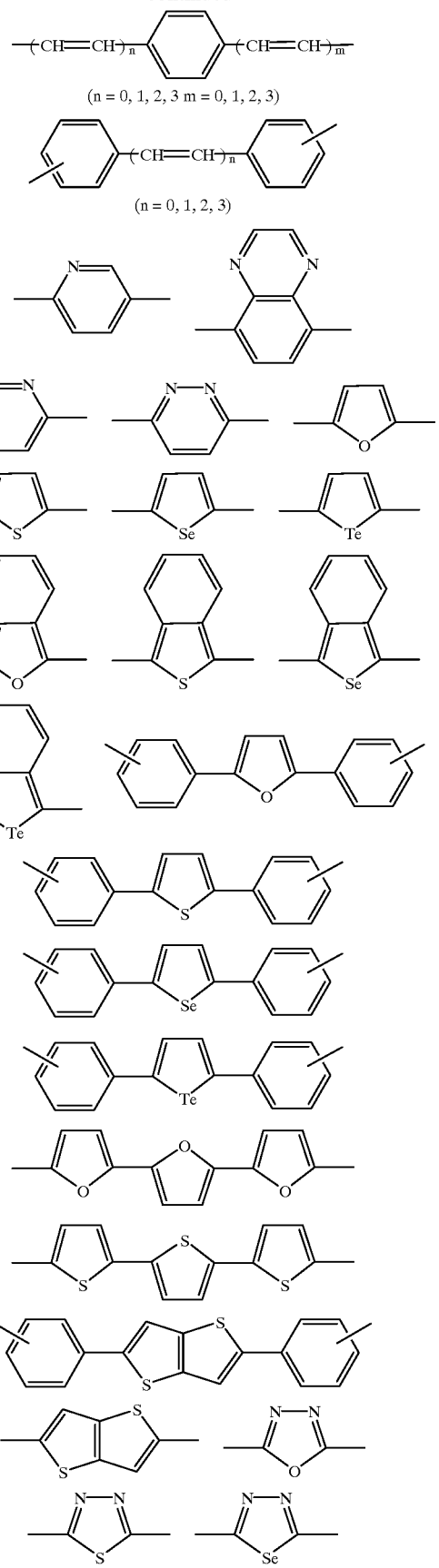

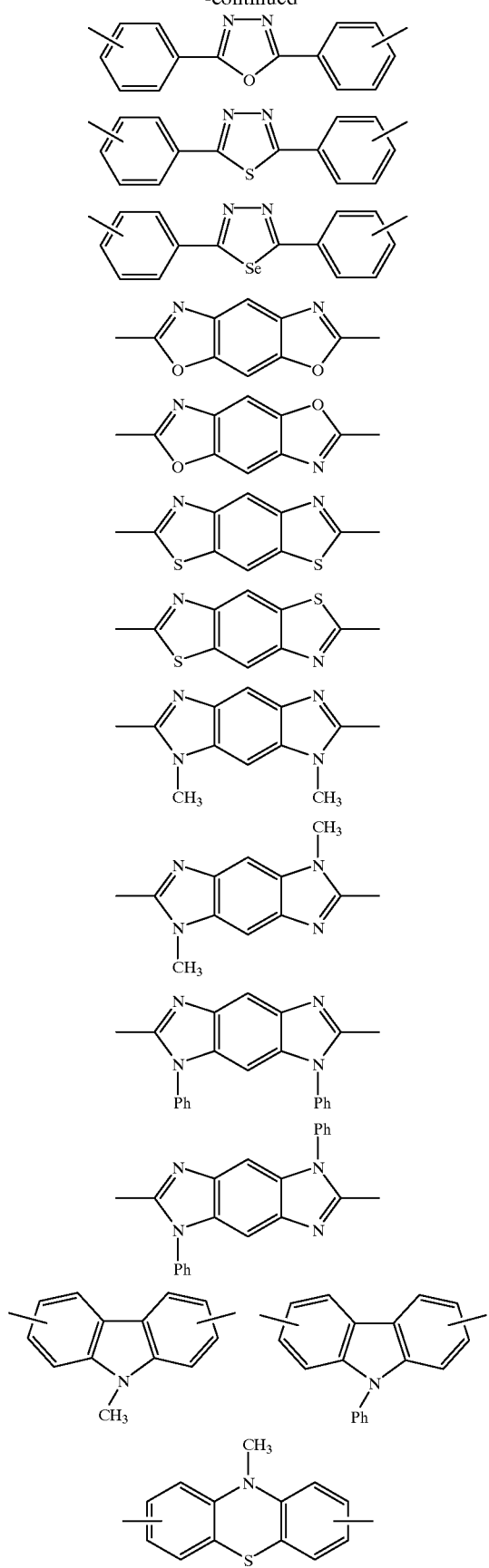
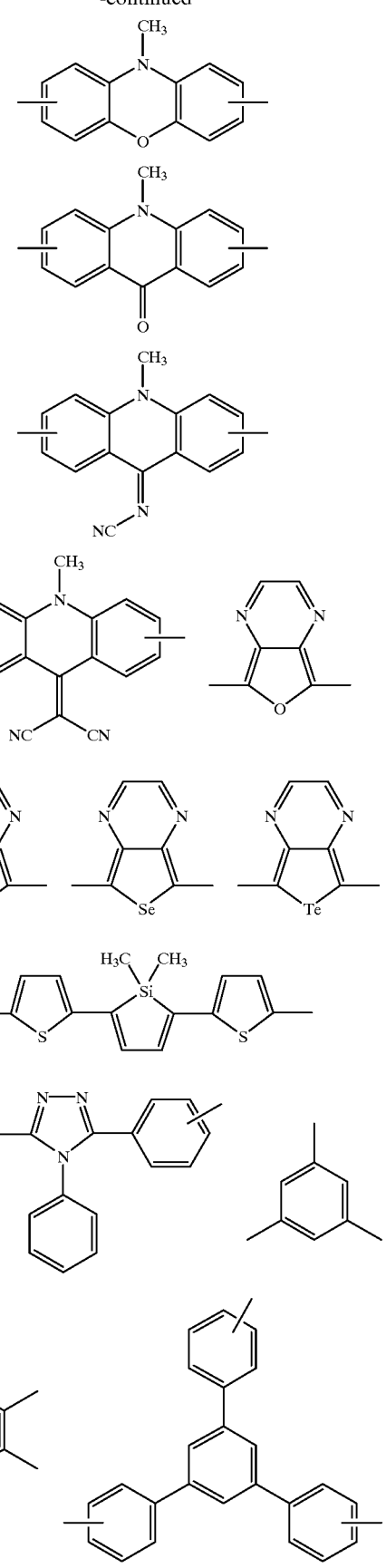

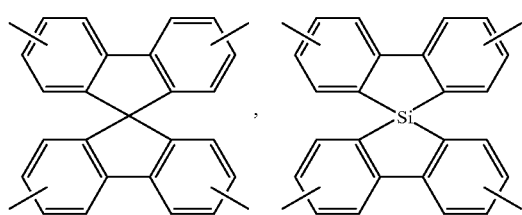
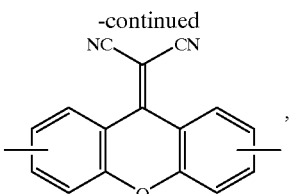
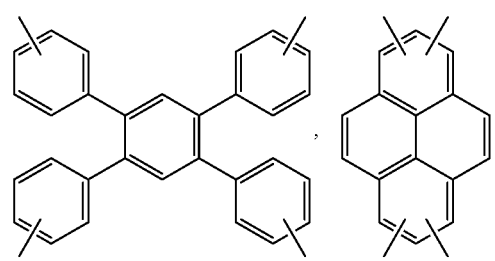
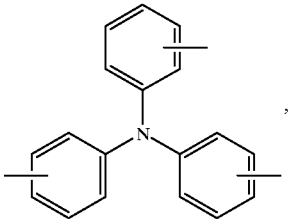
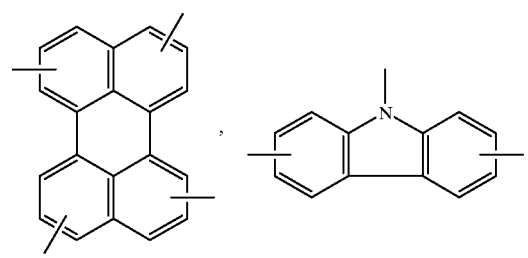
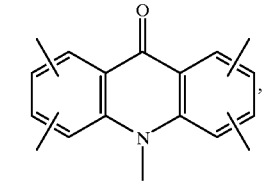
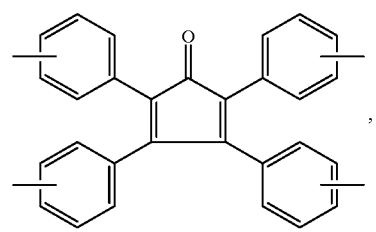
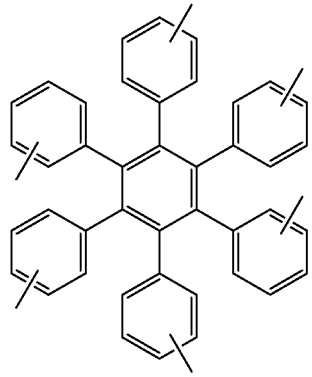
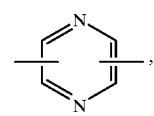
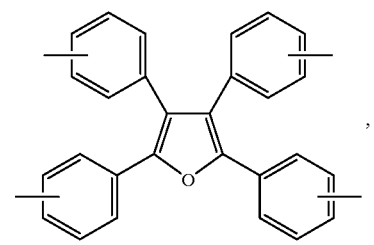
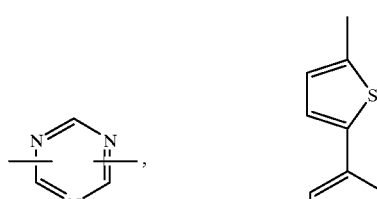
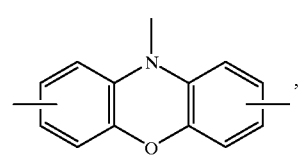
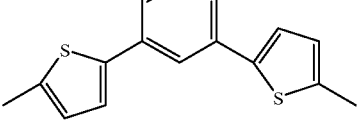
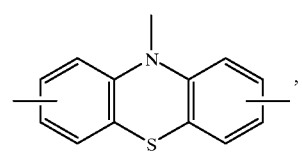
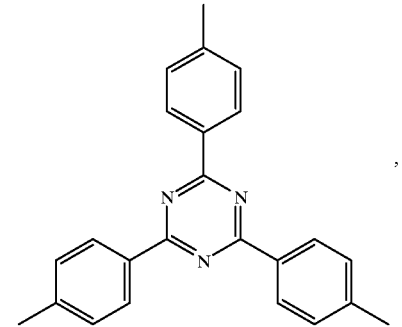

-continued

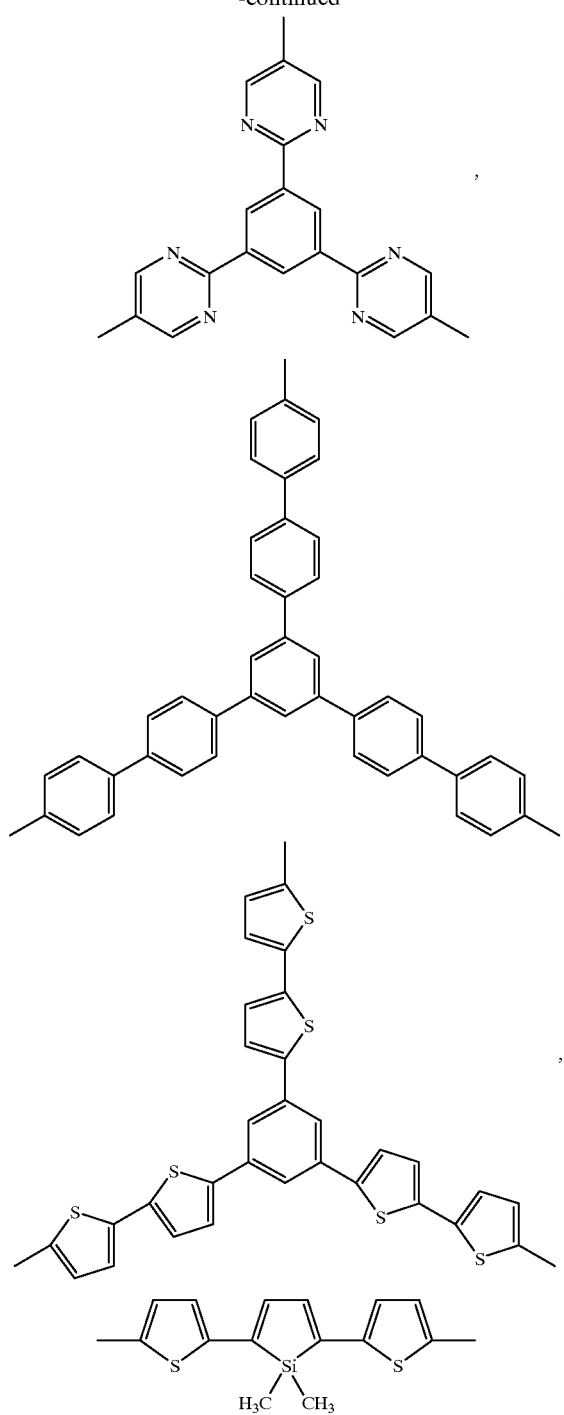

Preferred compounds amongst the compounds of formula (A-II) are represented by formula (A-III):

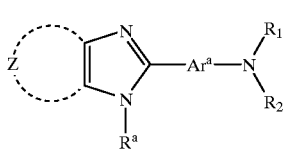
(A-III)

wherein Z, $R_1$, $R_2$, $R^a$ are as defined above (the preference also applies); $Ar^a$ represents an arylene group or a divalent aromatic heterocyclic group.

The preference and specific examples of the arylene group and the divalent aromatic heterocyclic group as $Ar^a$ are the same as described as for L in formula (A-II). The arylene group and the divalent aromatic heterocyclic group as $Ar^a$ can have a substituent(s). The substituents include those recited as R. Preferred substituents are an alkyl group, an alkenyl group, an alkynyl group, an aryl group, an alkoxy group, an aryloxy group, an acyl group, a halogen atom, a cyano group, a heterocyclic group, and a silyl group. Still preferred are an alkyl group, an alkenyl group, an alkynyl group, an aryl group, an alkoxy group, an aryloxy group, a halogen atom, a cyano group, and an aromatic heterocyclic group, with an alkyl group, an aryl group and an aromatic heterocyclic group being particularly preferred.

Of the compounds represented by formula (A-II) still preferred are those represented by formula (A-IV) or (A-V):

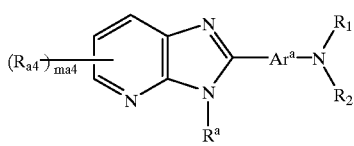
(A-IV)

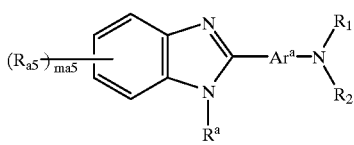
(A-V)

wherein $R_1$, $R_2$, $R^a$, and $Ar^a$ are as defined above (the preference also applies); $R_{a4}$ and $R_{a5}$ each represent a substituent; $m_{a4}$ represents an integer of 0 to 3; and $m_{a5}$ represents an integer of 0 to 4.

The substituents as $R_{a4}$ and $R_{a5}$ include those recited above as R. $R_{a4}$ and $R_{a5}$ each preferably represent an alkyl group, an alkenyl group, an alkynyl group, an aryl group, an alkoxy group, an aryloxy group, an acyl group, a halogen atom, a cyano group, a heterocyclic group or a silyl group, particularly an alkyl group, an alkenyl group, an alkynyl group, an aryl group, an alkoxy group, an aryloxy group, a halogen atom, a cyano group or an aromatic heterocyclic group, especially an alkyl group, an aryl group or an aromatic heterocyclic group. Where possible, the substituents $R_{a4}$ in formula (A-IV) and $R_{a5}$ in formula (A-V) may be taken together to form a ring, respectively.

$m_{a4}$ is preferably 0 to 2, still preferably 0 or 1, particularly preferably 0. $m_{a5}$ is preferably 0 to 3, still preferably 0 to 2, particularly 0 or 1, especially 0.

Of the compounds represented by formula (A-II) particularly preferred are those represented by formula (A-VI) or (A-VII):

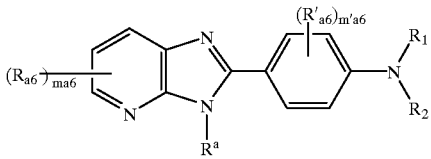
(A-VI)

-continued (A-VII)

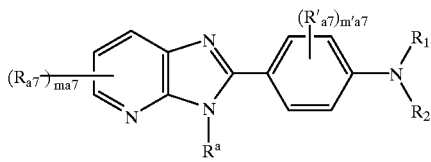

wherein $R_1$, $R_2$, and $R^a$ are as defined above (the preference described above also applies); and $R_{a6}$, $R_{a7}$, and $m_{a6}$ have the same meaning as $R_{a4}$, $R_{a5}$, $m_{a4}$, and $m_{a5}$, respectively (the preference of $R_{a4}$, $R_{a5}$, $m_{a4}$, and $m_{a5}$ also applies respectively); $R'_{a6}$ and $R'_{a7}$ each represent a substituent; $m'_{a6}$ and $m'_{a7}$ each represent an integer of 0 to 4.

The substituents as $R'_{a6}$ and $R'_{a7}$ include those recited above as R. $R'_{a6}$ and $R'_{a7}$ each preferably represent an alkyl group, an alkenyl group, an alkynyl group, an aryl group, an alkoxy group, an aryloxy group, an acyl group, a halogen atom, a cyano group, a heterocyclic group or a silyl group, particularly an alkyl group, an alkenyl group, an alkynyl group, an aryl group, an alkoxy group, an aryloxy group, a halogen atom, a cyano group or an aromatic heterocyclic group, especially an alkyl group, an aryl group or an aromatic heterocyclic group. Where possible, the substituents $R'_{a6}$ in formula (A-VI) and $R'_{a7}$ in formula (A-VII) may be taken together to form a ring, respectively.

$m'_{a6}$ and $m'_{a7}$ are each preferably 0 to 3, still preferably 0 to 2, particularly preferably 0 or 1, especially preferably 0.

The compounds of formula (A-VI) are particularly preferred of the compounds of formula (A-II).

Of the compounds represented by formula (B-II) preferred are those represented by formula (B-III):

(B-III)

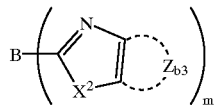

wherein B, $X^2$, and m are as defined above (the preference also applies); and $Z_{b3}$ represents an atomic group necessary to form an aromatic hetero ring.

The aromatic hetero ring formed by $Z_{b3}$ is preferably a 5- or 6-membered aromatic hetero ring, still preferably a 5- or 6-membered nitrogen-containing aromatic heterocyclic ring, particularly preferably a 6-membered nitrogen-containing aromatic heterocyclic ring. Specific examples of the aromatic hetero ring formed by $Z_{b3}$ include furan, thiophene, pyran, pyrrole, imidazole, pyrazole, pyridine, pyrazine, pyrimidine, pyridazine, triazine, thiazole, oxazole, isothiazole, isoxazole, thiadiazole, oxadiazole, triazole, selenazole, and tellurazole. Preferred among them are pyridine, pyrazine, pyrimidine, and pyridazine. Still preferred are pyridine and pyrazine, with pyridine being particularly preferred.

The aromatic hetero ring completed by $Z_{b3}$ may form a condensed ring with other ring(s) and may have a substituent(s). The substituents include those recited as R. The preference among them also applies.

Of the compounds represented by formula (B-II), those represented by formula (B-IV) are still preferred.

(B-IV)

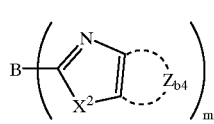

wherein B, $X^2$, and m are as defined above (the preference is the same as described above); and $Z_{b4}$ represents an atomic group necessary for forming a nitrogen-containing aromatic hetero ring.

The nitrogen-containing aromatic hetero ring formed by $Z_{b4}$ is preferably a 5- or 6-membered nitrogen-containing aromatic hetero ring, still preferably a 6-membered nitrogen-containing aromatic hetero ring. Specific examples of the nitrogen-containing aromatic hetero ring formed by $Z_{b4}$ include pyrrole, imidazole, pyrazole, pyridine, pyrazine, pyrimidine, pyridazine, triazine, thiazole, oxazole, isothiazole, isoxazole, thiadiazole, oxadiazole, triazole, selenazole, and tellurazole. Preferred among them are pyridine, pyrazine, pyrimidine, and pyridazine. Still preferred are pyridine and pyrazine, with pyridine being particularly preferred.

The aromatic hetero ring completed by $Z_{b4}$ may form a condensed ring with other ring(s) and may have a substituent(s). The substituents include the groups and the atoms recited as R. The preference among them also applies here.

Of the compounds represented by formula (B-II), those represented by formula (B-V) are still preferred.

(B-V)

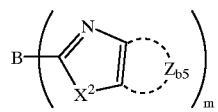

wherein B, $X^2$, and m are as defined above (the preference also applies); and $Z_{b5}$ represents an atomic group necessary for forming a 6-membered nitrogen-containing aromatic hetero ring.

The 6-membered nitrogen-containing aromatic hetero ring completed by $Z_{b5}$ includes pyridine, pyrazine, pyrimidine, pyridazine, and triazine. Preferred of them are pyridine, pyrazine, pyrimidine, and pyridazine. Still preferred are pyridine and pyrazine, with pyridine being particularly preferred.

The 6-membered nitrogen-containing aromatic hetero ring completed by $Z_{b5}$ may form a condensed ring with other ring(s) and may have a substituent (s). The substituents include those recited as R. The preference among them also applies.

Of the compounds represented by formula (B-II), those represented by formula (B-VI) are still preferred.

(B-VI)

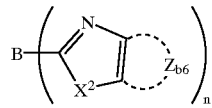

wherein B and $X_2$ are as defined above (the preference also applies); $Z_{b6}$ has the same meaning as $Z_{b5}$ in formula (B-V) (the preference is also the same); and n is an integer of 2 to 8, preferably 2 to 6, still preferably 2 to 4, particularly preferably 2 or 3, especially preferably 3.

Of the compounds represented by formula (B-II), those represented by formula (B-VII) are still preferred.

(B-VII)

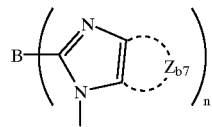

wherein B, n, and $R^a$ are as defined above (the preference also applies); and $Z_{b7}$ has the same meaning as $Z_{b5}$ in formula (B-V) (the preference is also the same).

Of the compounds represented by formula (B-II), those represented by formula (B-VIII) are particularly preferred.

(B-VIII)

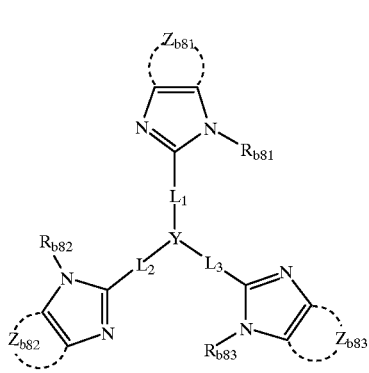

wherein $R^{b81}$, $R^{b82}$, and $R^{b83}$ have the same meaning as $R^a$ (the preference also applies); $Z_{b81}$, $Z_{b82}$, and $Z_{b83}$ have the same meaning as $Z_{b5}$ (the preference is also the same); $L_1$, $L_2$, and $L_3$ have the same meaning as L in formula (A-II); and Y represents a nitrogen atom or a 1,3,5-benzenetriyl group.

The linking group represented by $L_1$, $L_2$, and $L_3$ is preferably a single bond, an arylene group, a divalent aromatic hetero ring or a combination thereof, still preferably a single bond, a benzene ring, a naphthalene ring, an anthracene ring, a pyridine ring, a pyrazine ring, a thiophene ring, a furan ring, an oxazole ring, a thiazole ring, an oxadiazole ring, a tiadiazole ring, a triazole ring, or a combination thereof, particularly preferably a single bond, a benzene ring, a thiophene ring or a combination thereof, especially preferably a single bond, a benzene ring or a combination thereof. A single bond is the most preferred.

$L_1$, $L_2$, and $L_3$ may have a substituent(s). The substituents include those described as R. The preference of R also applies here.

The 1,3,5-benzenetriyl group as Y can have a substituent(s) at the 2-, 4- and/or 6-position(s). The substituents include an alkyl group, an aryl group, and a halogen atom. Y is preferably a nitrogen atom or an unsubstituted 1,3,5-benzenetriyl group, still preferably an unsubstituted 1,3,5-benzenetriyl group.

Of the compounds represented by formula (B-II), those represented by formula (B-IX) are especially preferred.

(B-IX)

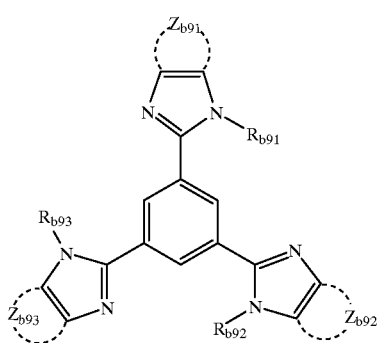

wherein $R^{b91}$, $R^{b92}$, and $R^{b93}$ have the same meaning as $R^a$ (the preference also applies); and $Z_{b91}$, $Z_{b92}$, and $Z_{b93}$ have the same meaning as $Z_{b5}$ (the preference is also the same).

Of the compounds represented by formula (B-II), those represented by formula (B-X) are the most preferred.

(B-X)

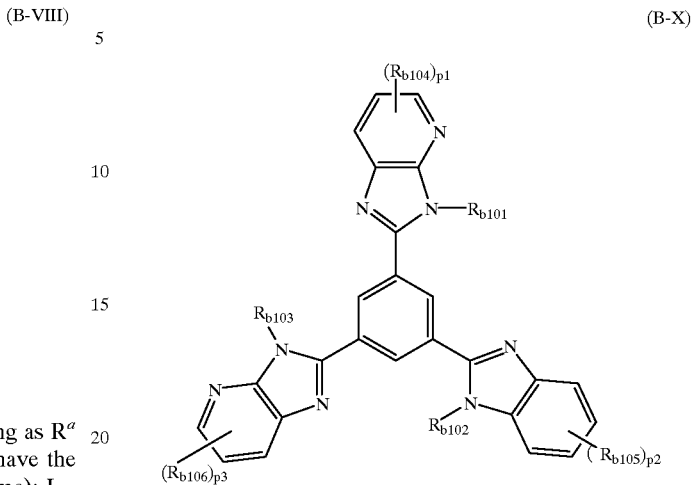

wherein $R_{b101}$, $R_{b102}$, and $R_{b103}$ have the same meaning as $R^a$ (the preference also applies); $R_{b104}$, $R_{b105}$, and $R_{b106}$ each represent a substituent; and p1, p2, and p3 each represent an integer of 0 to 3.

The substituents as $R_{b104}$, $R_{b105}$, and $R_{b106}$ include those recited as R, and the preference of R applies here. p1, p2, and p3 is preferably 0 to 2, still preferably 0 or 1, particularly preferably 0.

The triazine compounds, which are another preferred group of heterocyclic compounds represented by formula (I), are preferably compounds represented by formula (C-II):

(C-II)

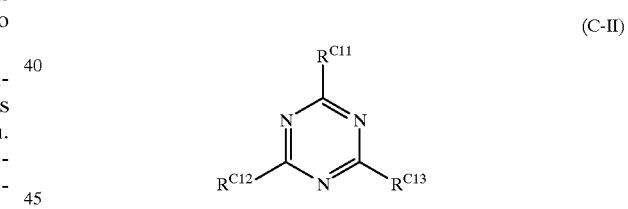

wherein $R^{c11}$, $R^{c12}$, and $R^{c13}$ have the same meaning as $R_1$ and $R_2$ in formula (A-II) (the preference also applies).

The group represented by $R^{c11}$, $R^{c12}$, and $R^{c13}$ can have a substituent(s). The substituents include those recited as R, preferably an aliphatic hydrocarbon group, an aryl group, a heterocyclic group, an amino group, and a halogen atom, still preferably an alkyl group and an amino group.

The heterocyclic compounds containing at least two hetero atoms which can be used in the invention may be compounds forming metal complex.

The heterocyclic compounds containing at least two hetero atoms which can be used in the invention also include high-molecular weight compounds (i.e., polymers) having a heterocyclic skeleton containing at least two hetero atoms in the side chain or the main chain thereof. These polymers preferably have a weight average molecular weight (Mw) of 1,000 to 5,000,000, particularly 5,000 to 2,000,000, especially 10,000 to 1,000,000.

The polymers preferably comprise a repeating unit represented by formula (D) or (E):

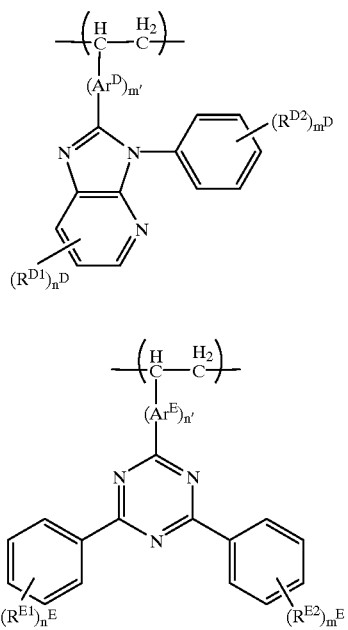

wherein $Ar^D$ and $Ar^E$ each represent an arylene group or a divalent aromatic heterocyclic group, preferably an arylene group; $R^{D1}$, $R^{D2}$, $R^{E1}$, and $R^{E2}$ each represent a hydrogen atom or a substituent; $n^D$ represents an integer of 0 to 3, preferably 0 to 1; $m^D$, $n^E$, and $m^E$ each represent an integer of 0 to 5, preferably 0 to 1; and m' and n' each represent 0 or 1, preferably 1.

The substituents as $R^{D1}$, $R^{D2}$, $R^{E1}$, and $R^{E2}$ include those recited as R. $R^{D1}$, $R^{D2}$, $R^{E1}$, and $R^{E2}$ are each preferably a hydrogen atom, an alkyl group, an alkenyl group, an alkynyl group, an aryl group, an alkoxy group, an aryloxy group, an acyl group, a halogen atom, a cyano group, a heterocyclic group, or a silyl group, still preferably a hydrogen atom, an alkyl group, an alkenyl group, an alkynyl group, an aryl group, an alkoxy group, an aryloxy group, a halogen atom, a cyano group, or an aromatic heterocyclic group, particularly preferably a hydrogen atom, an alkyl group, an aryl group, or an aromatic heterocyclic group. A hydrogen atom or an alkyl group is especially preferred. $n^D$ is preferably 0 or 1. $m^D$, $n^E$ and $m^E$ are each preferably 0 or 1. m' and n' each represent 0 or 1, preferably 1.

The polymer having the repeating unit of formula (D) or (E) may be either a homopolymer or a copolymer with other monomer(s), which may be a random copolymer or a block copolymer.

Specific examples of the heterocyclic compounds having at least two hetero atoms which can be used in the present invention are shown below for illustrative purposes only but not for limitation.

1.

2.

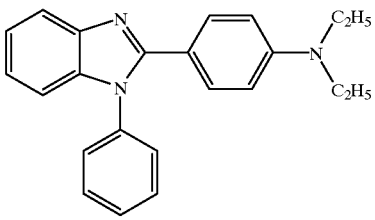

3.

4.

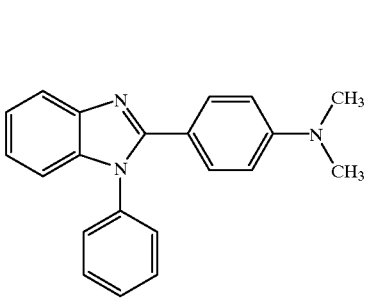

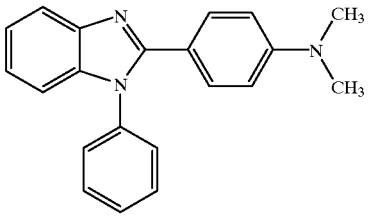

5.

6.

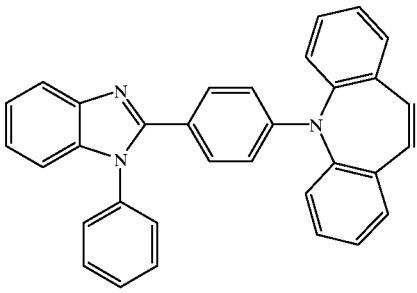

-continued
7.
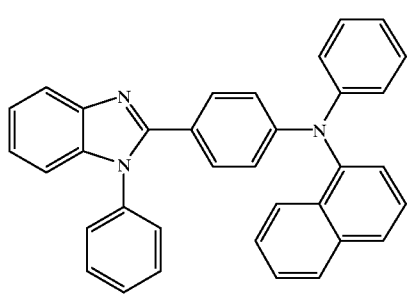
8.
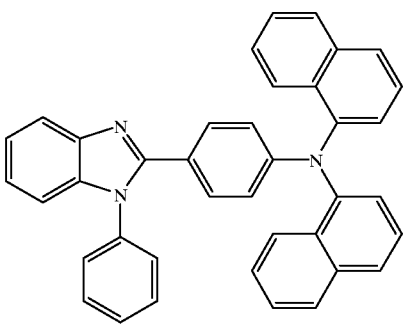
9.
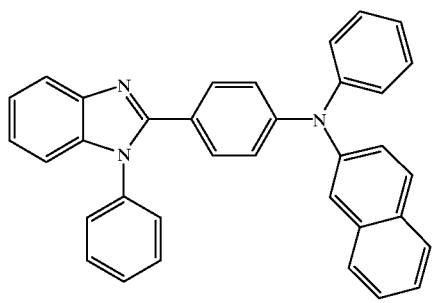
10.
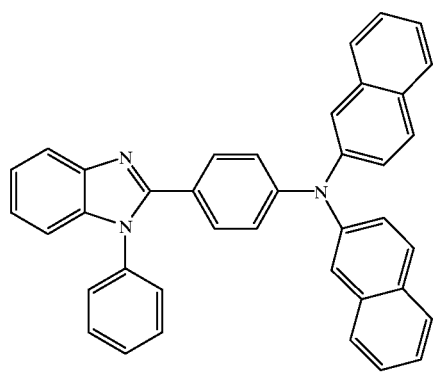
11.
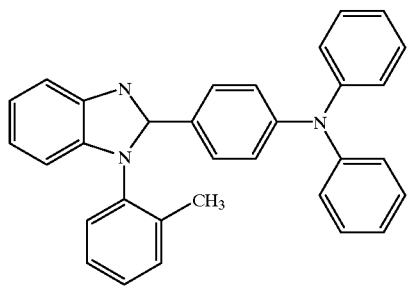
12.
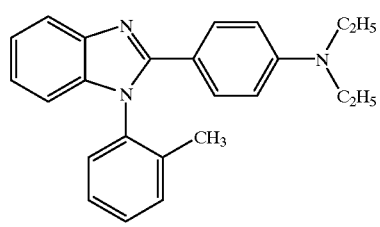
13.
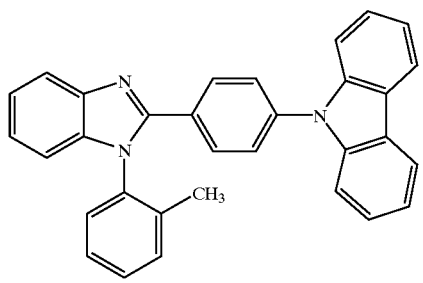
14.
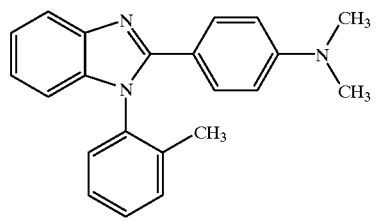
15.
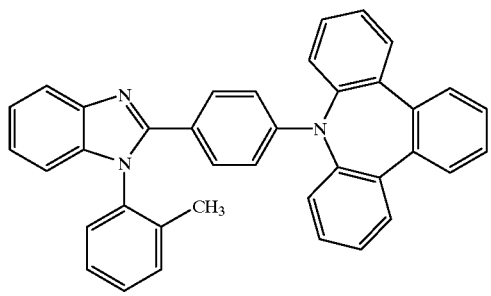
16.
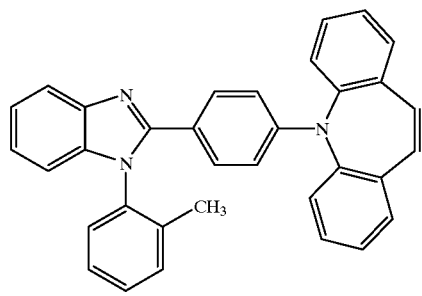

-continued
17.
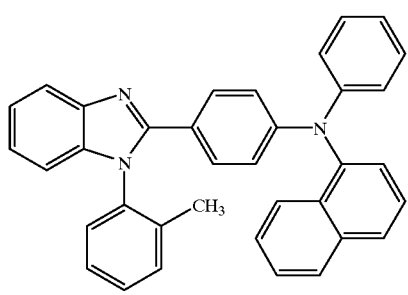
18.
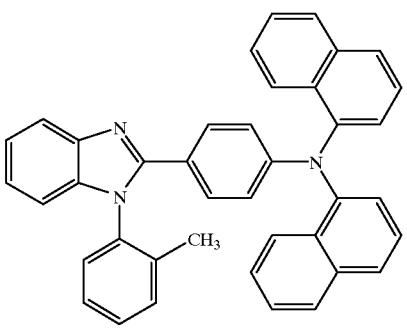
19.
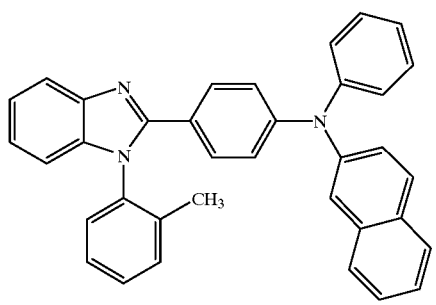
20.
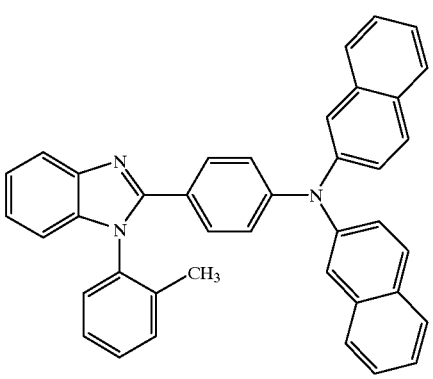
21.
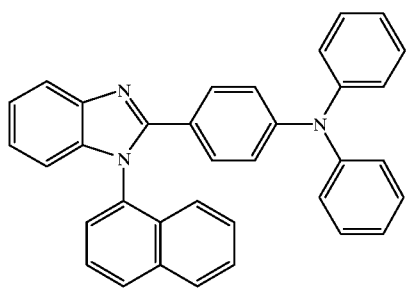
22.
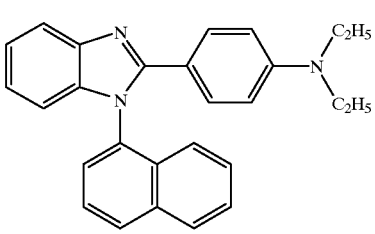
23.
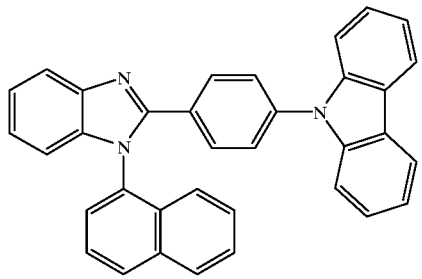
24.
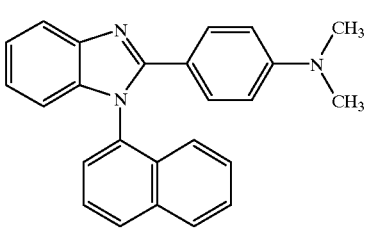
25.
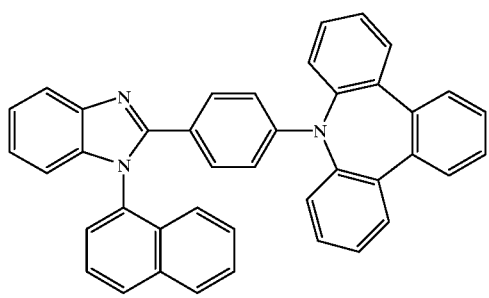
26.
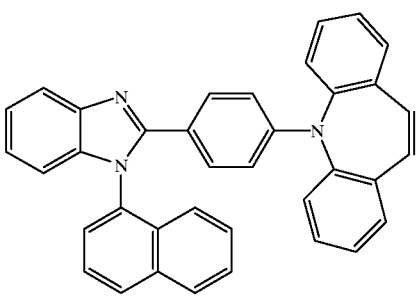

-continued
27.
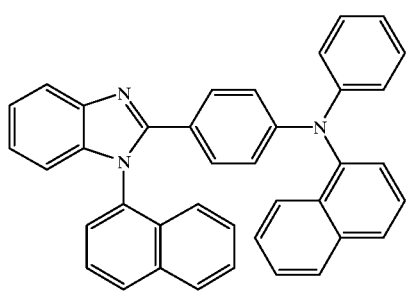
28.
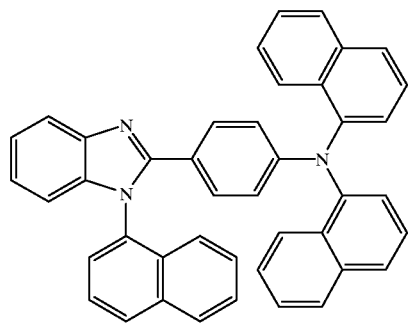
29.
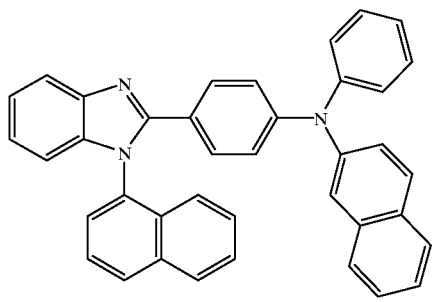
30.
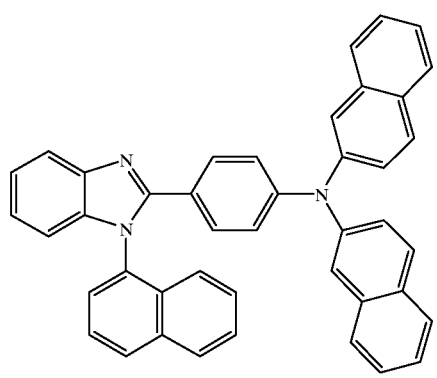
31.
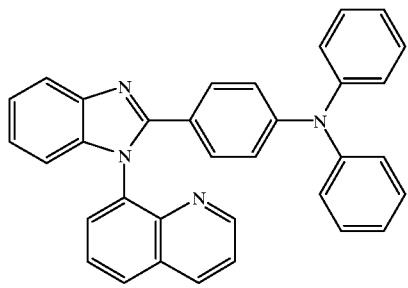
32.
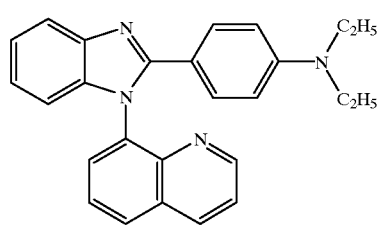
33.
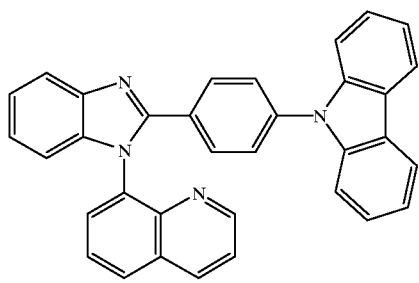
34.
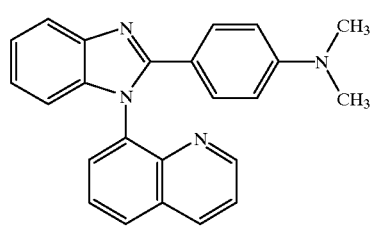
35.
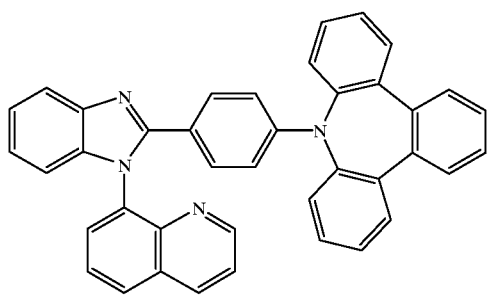
36.
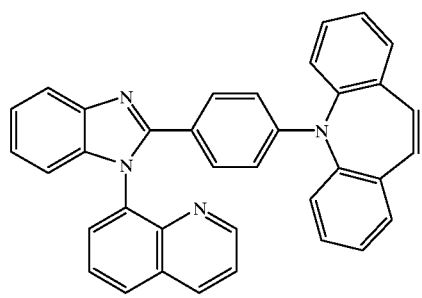

-continued
37.
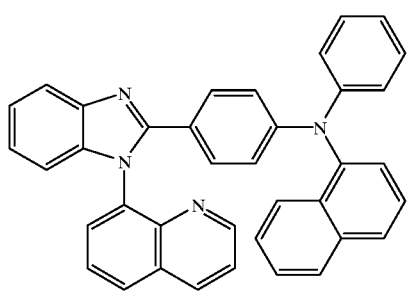
38.
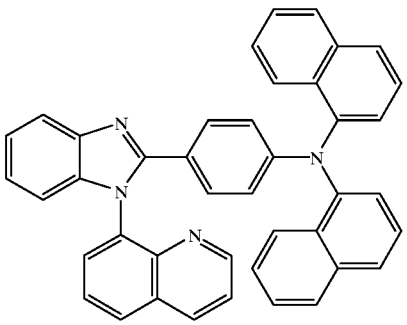
39.
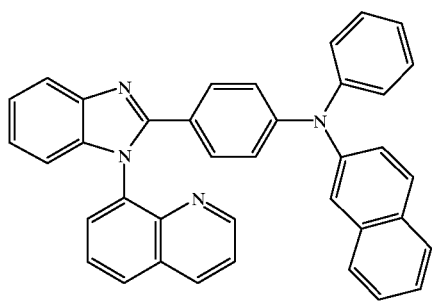
40.
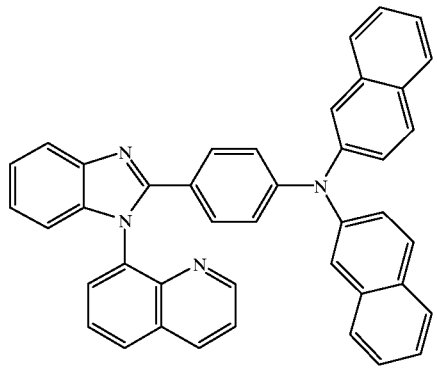
41.
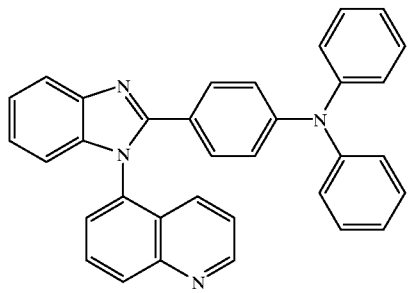
42.
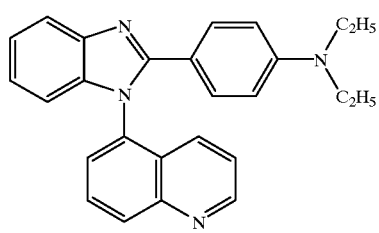
43.
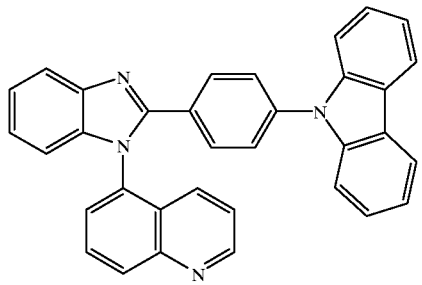
44.
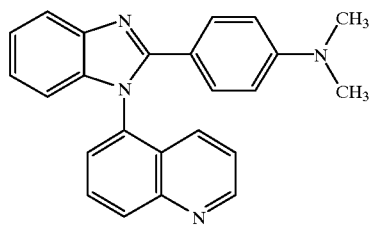
45.
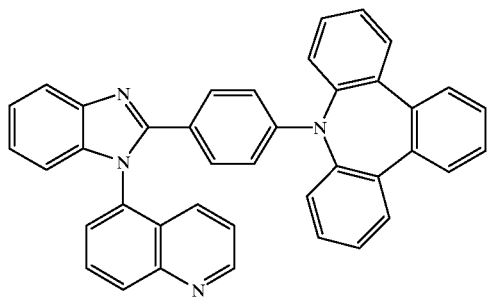
46.
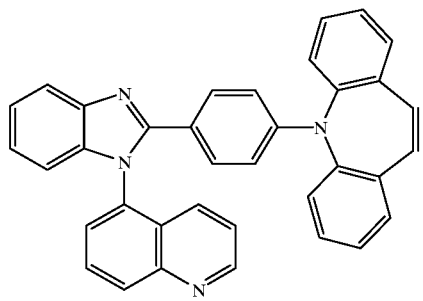

-continued
47.
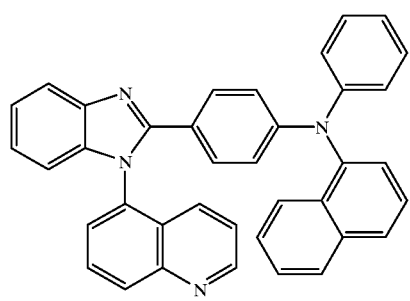
48.
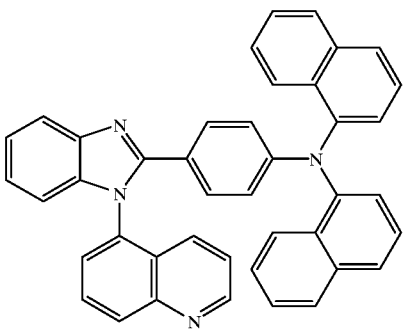
49.
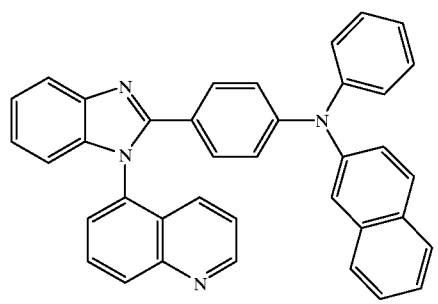
50.
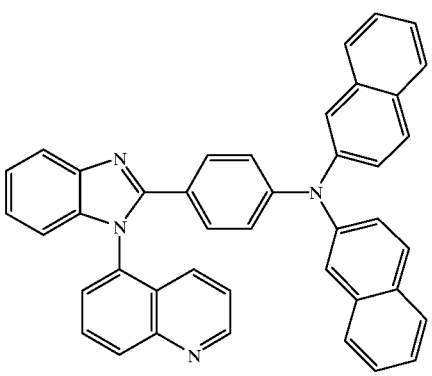
51.
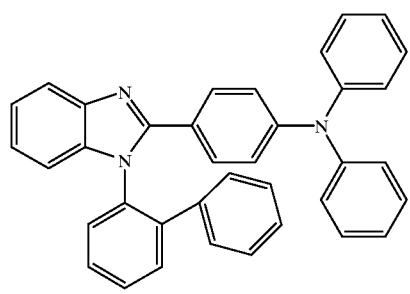
52.
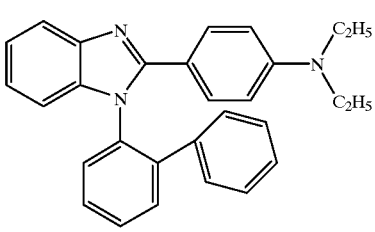
53.
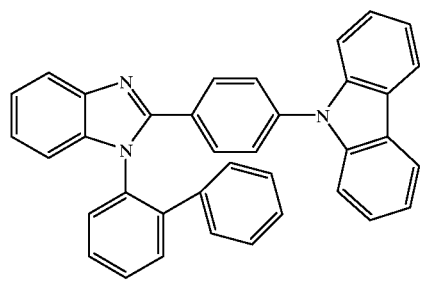
54.
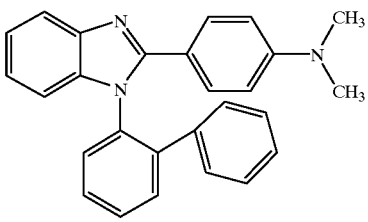
55.
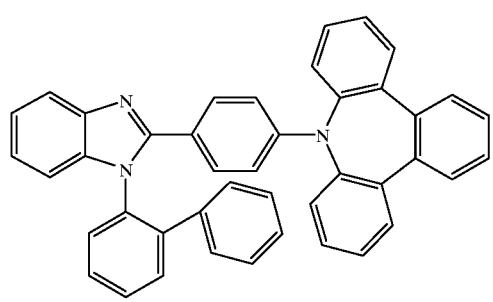
56.
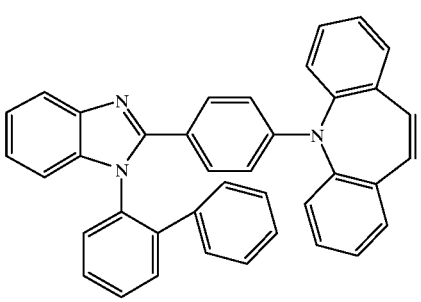

57.
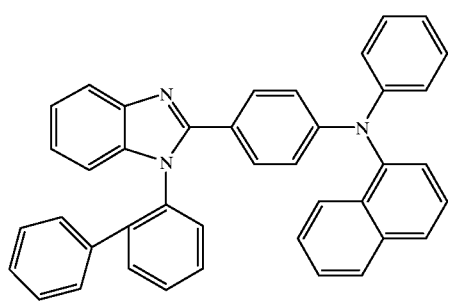
58.
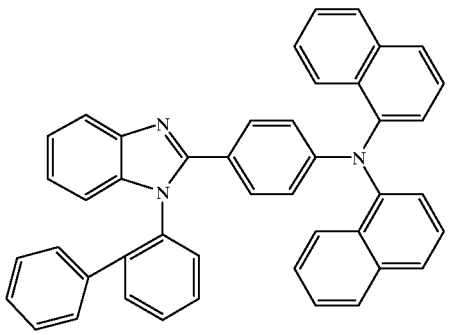
59.
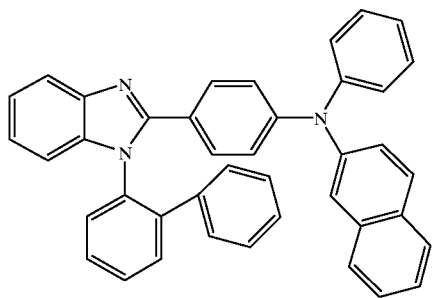
60.
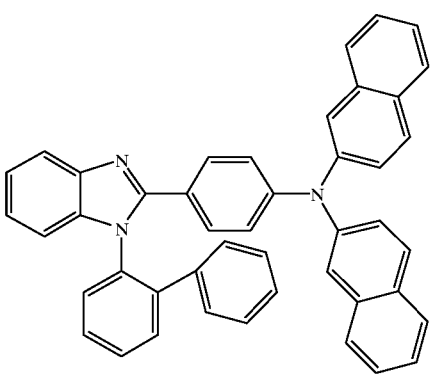
61.
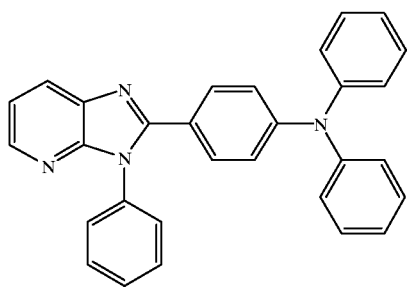
62.
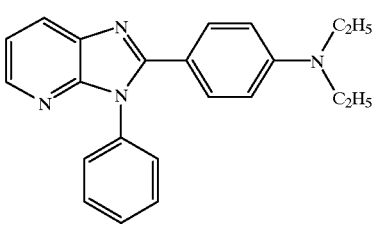
63.
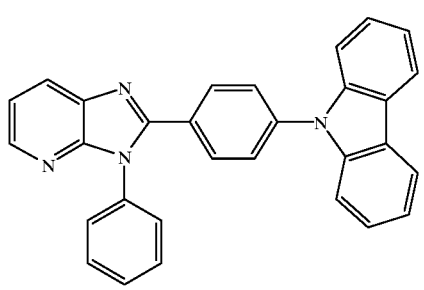
64.
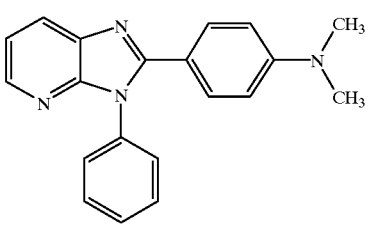
65.
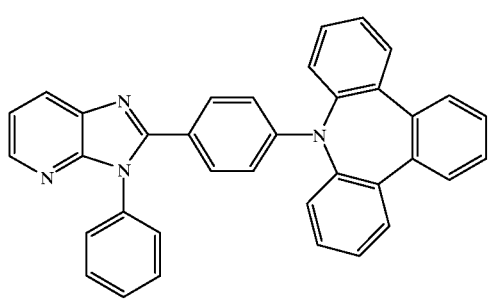
66.
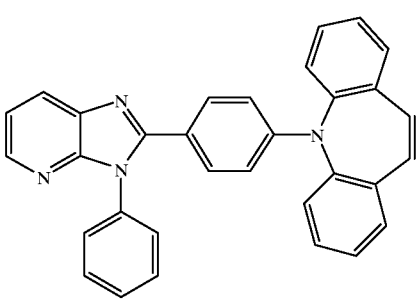

-continued
67.
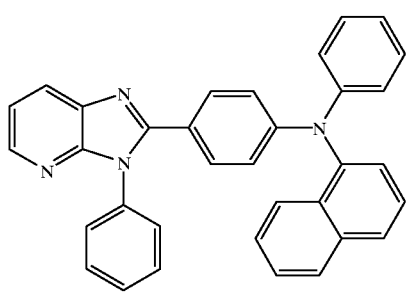
68.
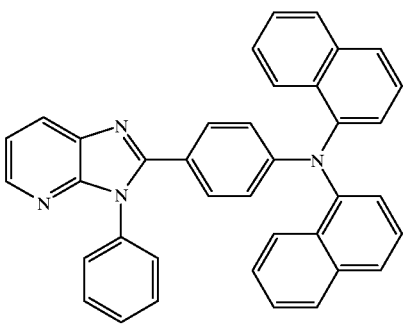
69.
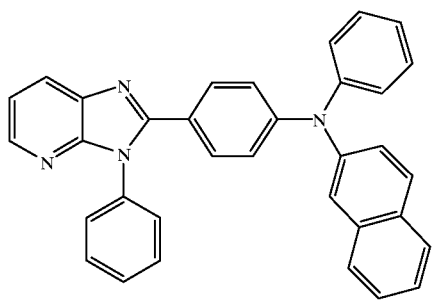
70.
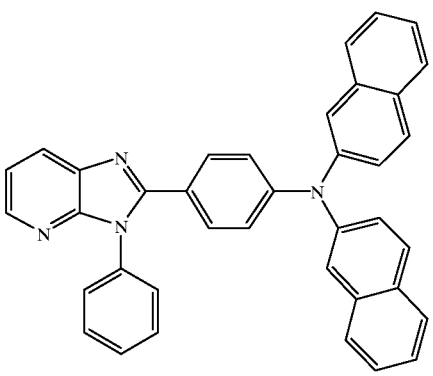
71.
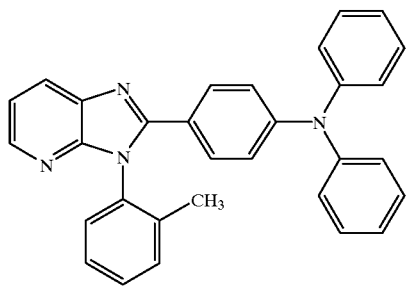
72.
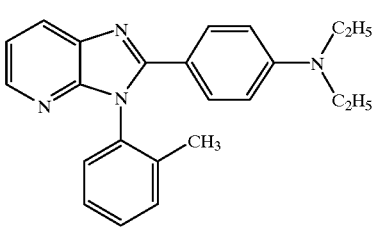
73.
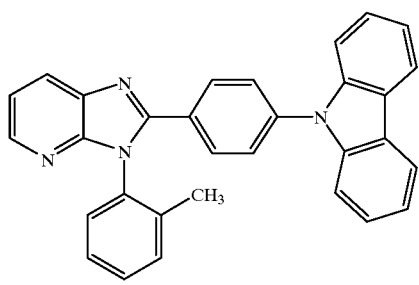
74.
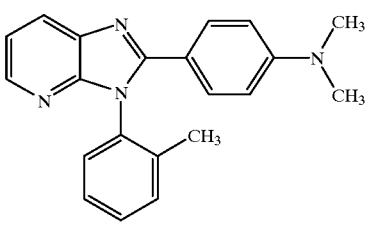
75.
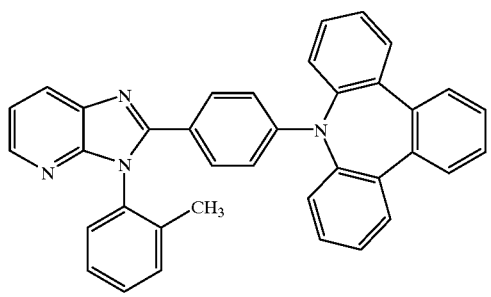
76.
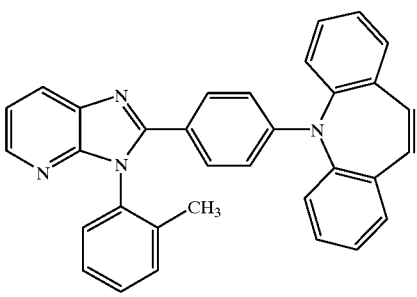

-continued
77.
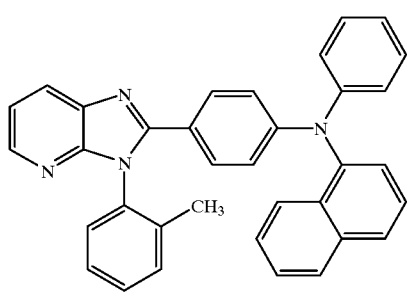
78.
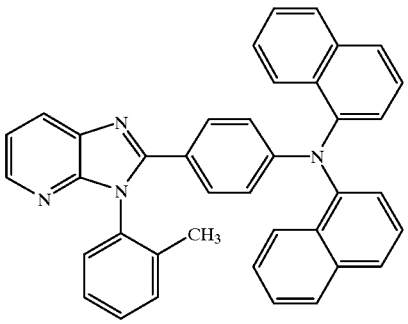
79.
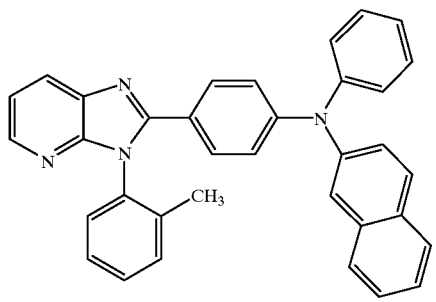
80.
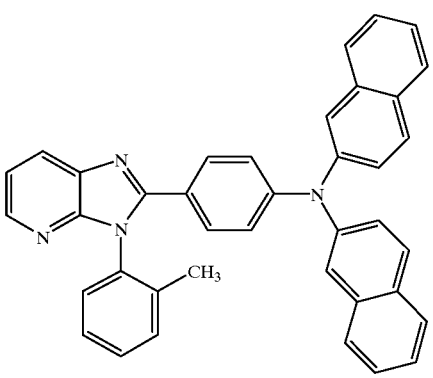
81.
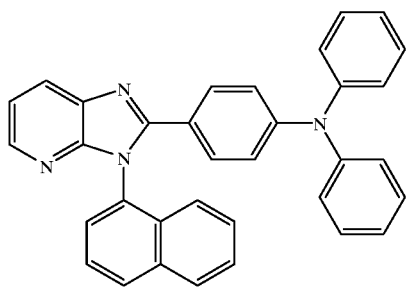
82.
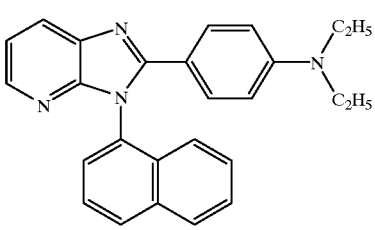
83.
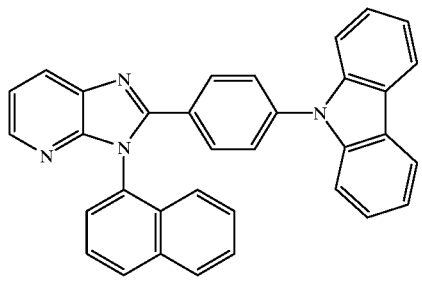
84.
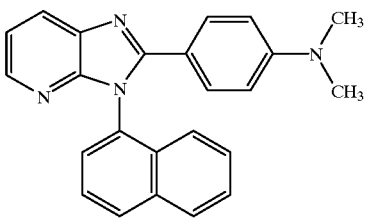
85.
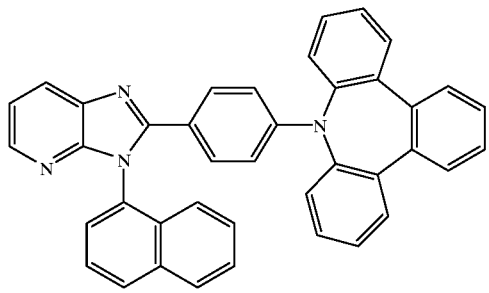
86.
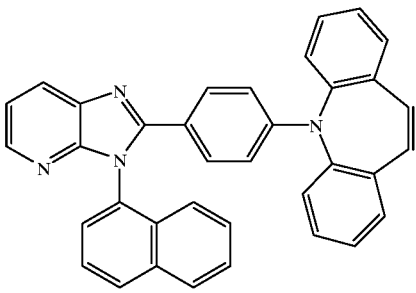

-continued
87.
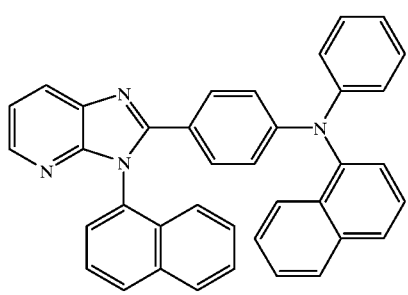
88.
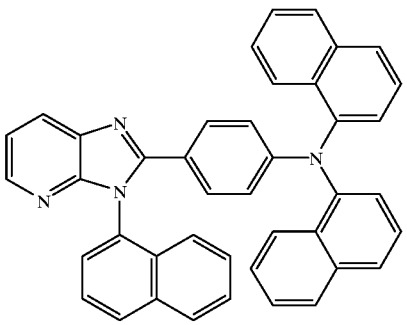
89.
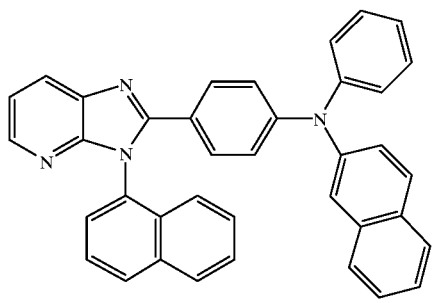
90.
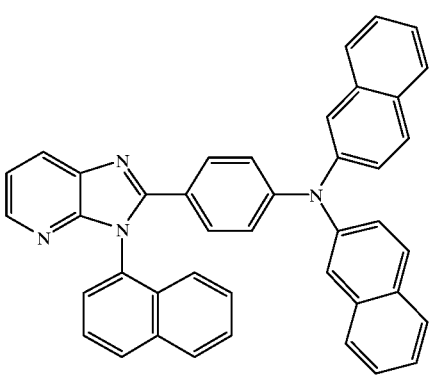
91.
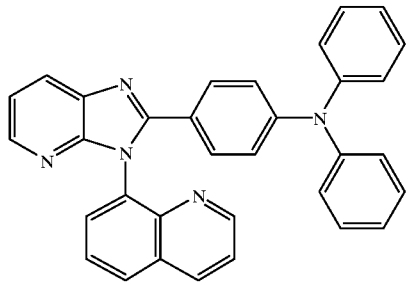
92.
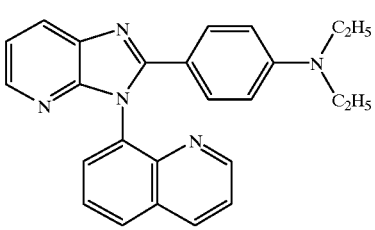
93.
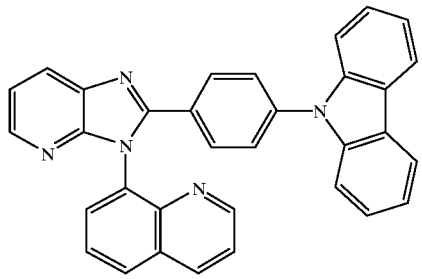
94.
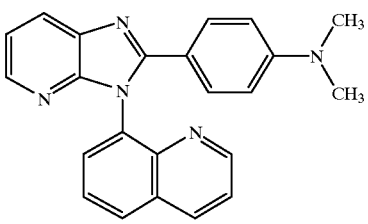
95.
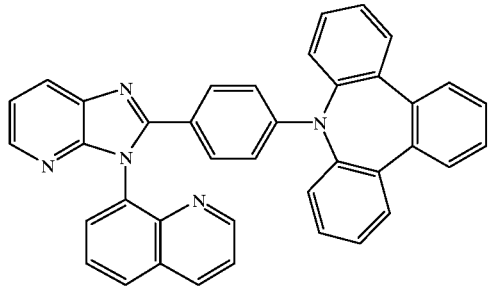
96.
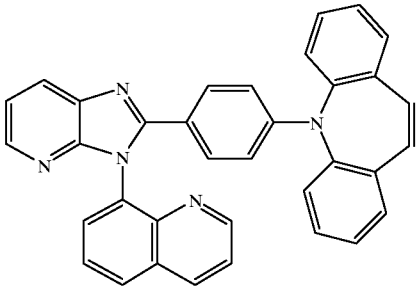

-continued
97.
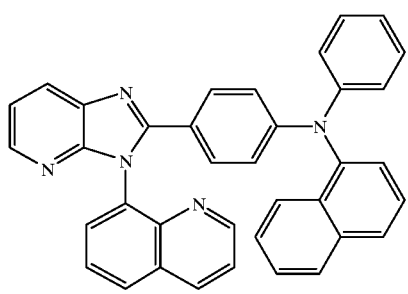
98.
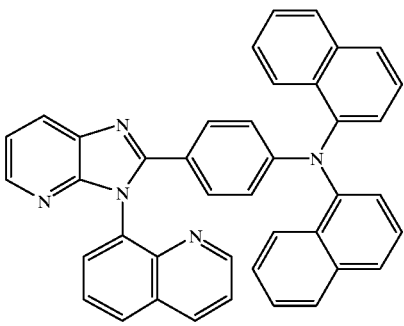
99.
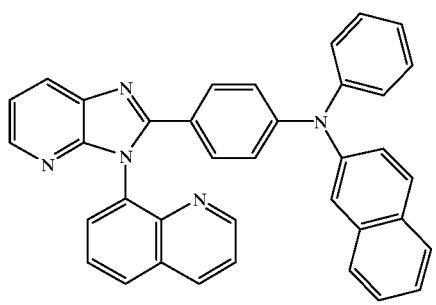
100.
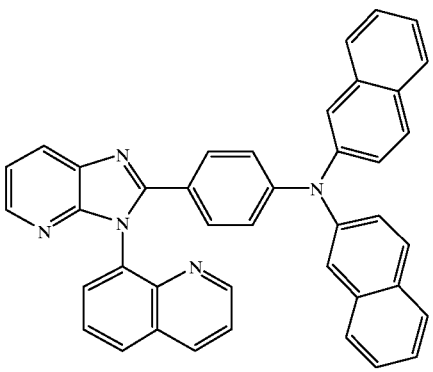
101.
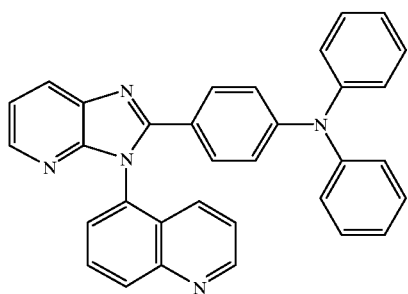
102.
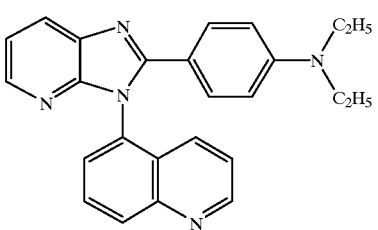
103.
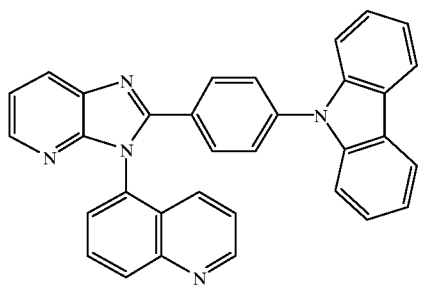
104.
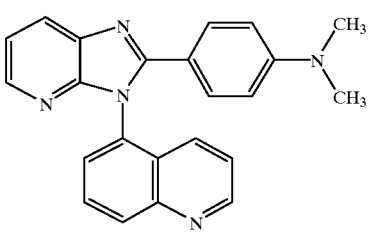
105.
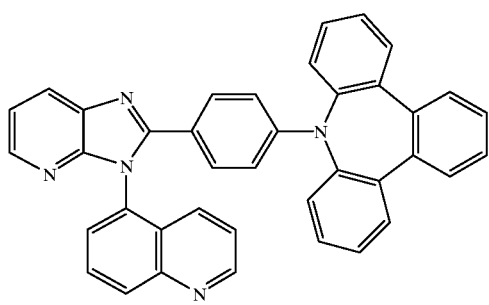
106.
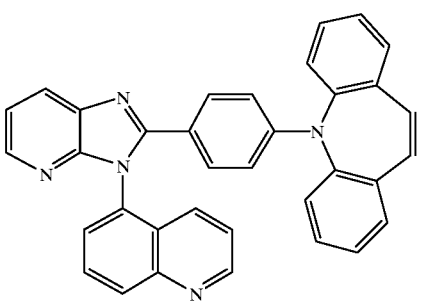

-continued
107.
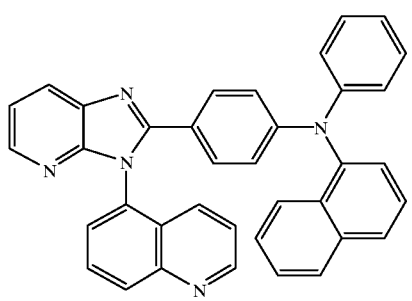
108.
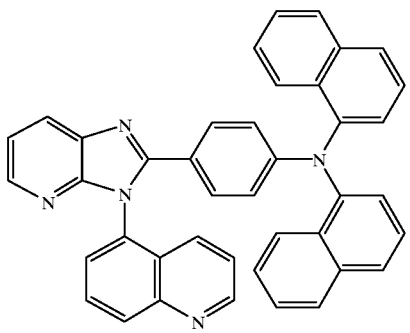
109.
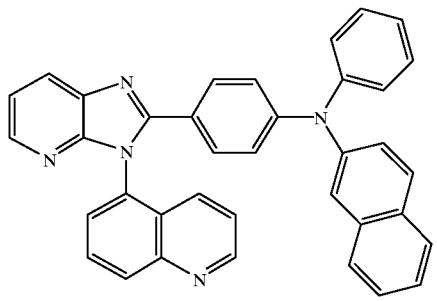
110.
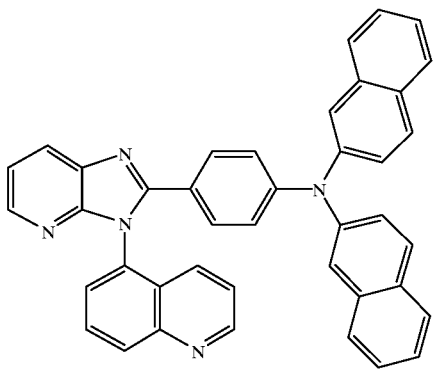
111.
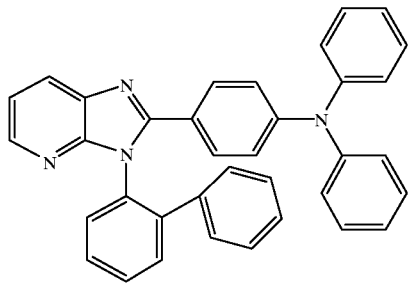
112.
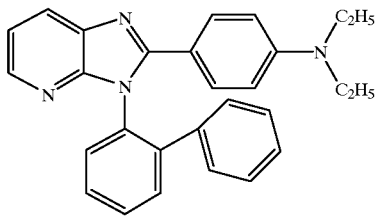
113.
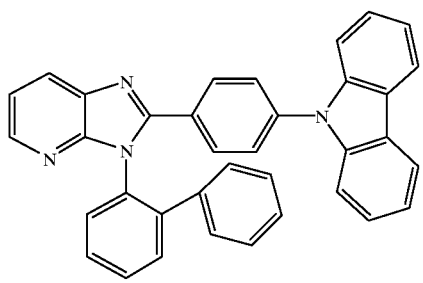
114.
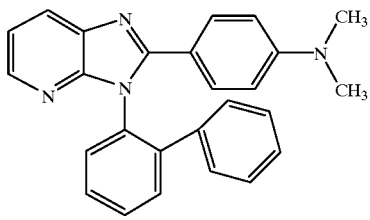
115.
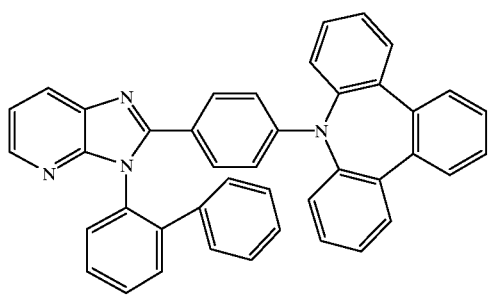
116.
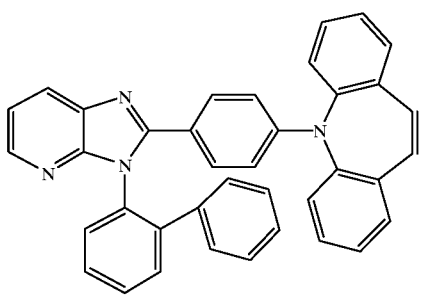

-continued
117.
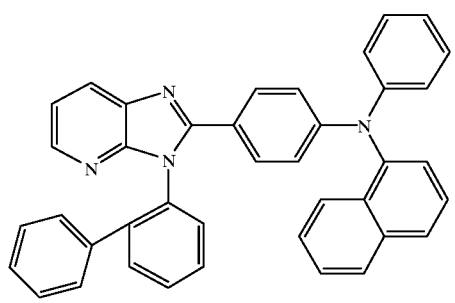
118.
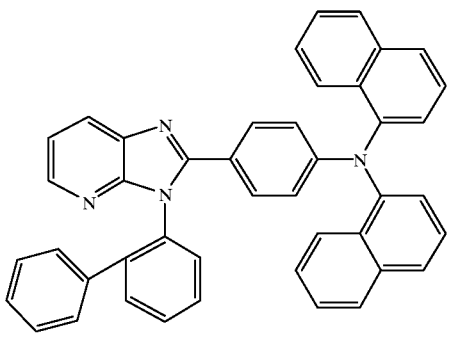
119.
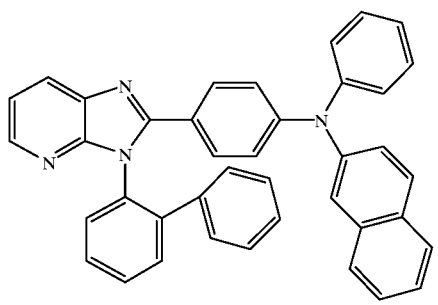
120.
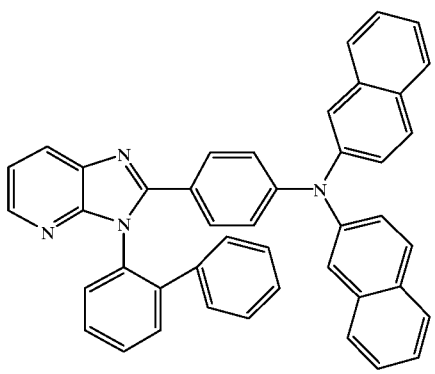
121.
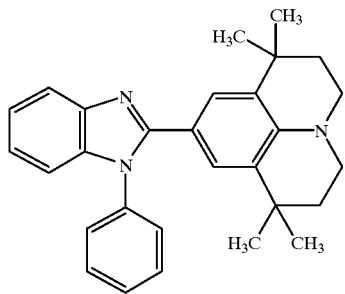
122.
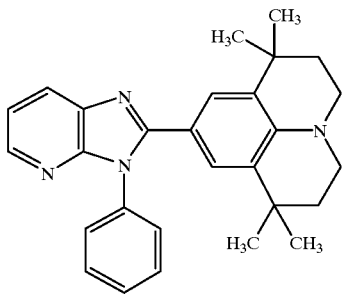
123.
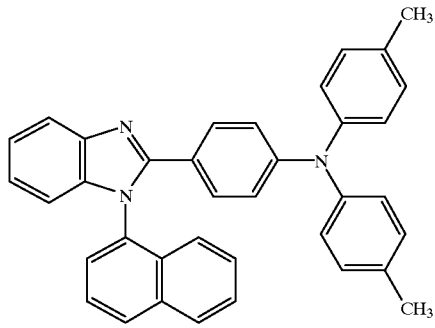
124.
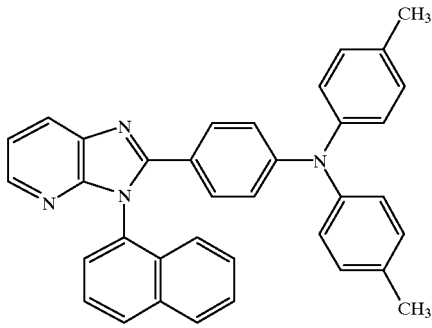

-continued
125.
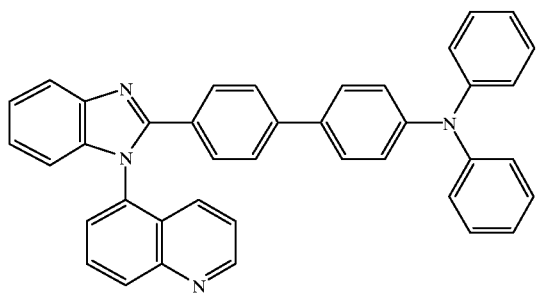
126.
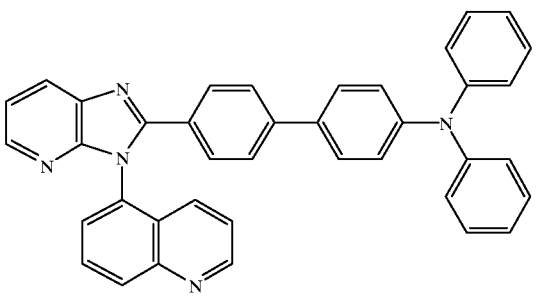
127.
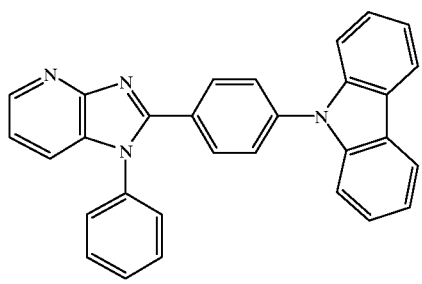
128.
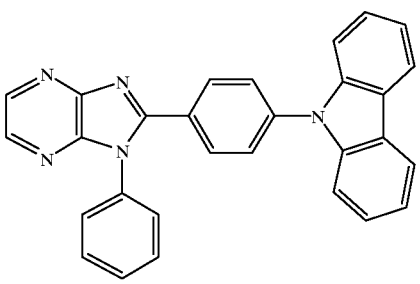
129.
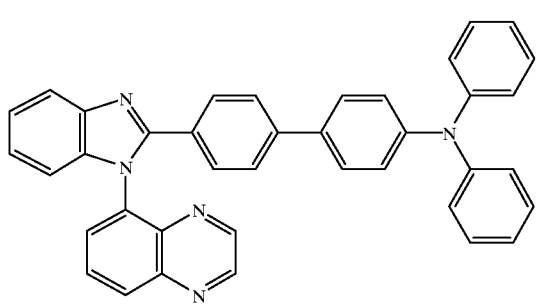
130.
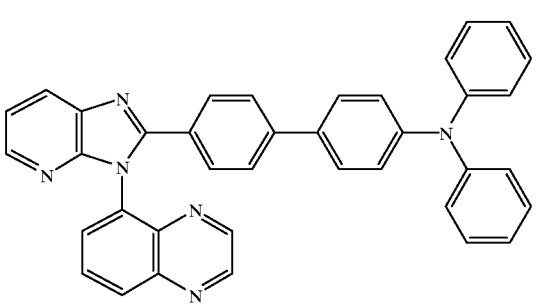
131.
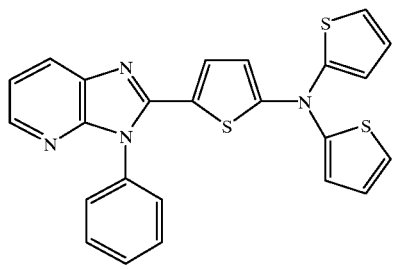
132.
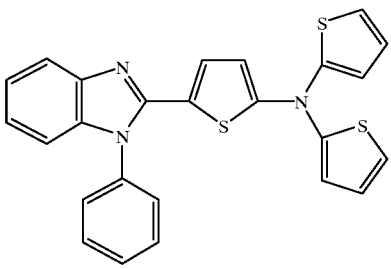
133.
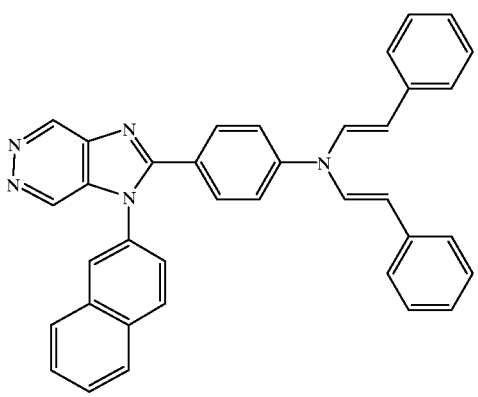
134.
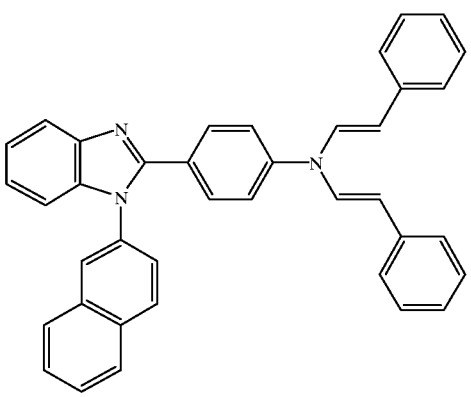

-continued
135. 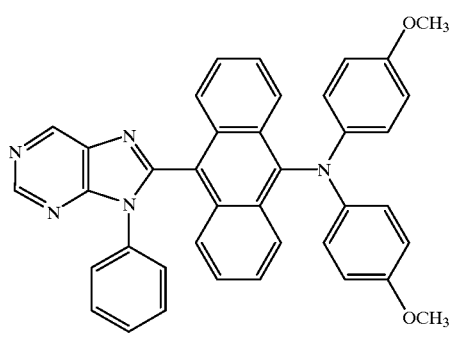
136. 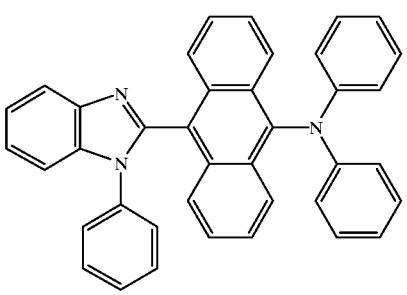
137. 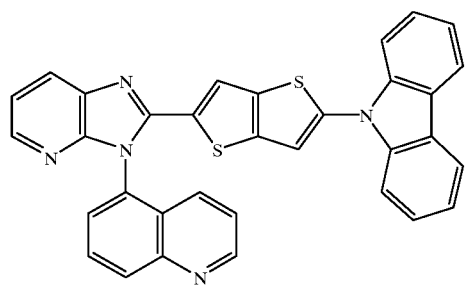
138. 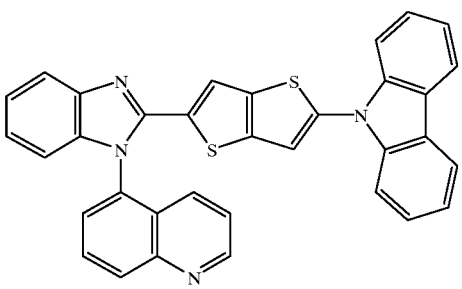
139. 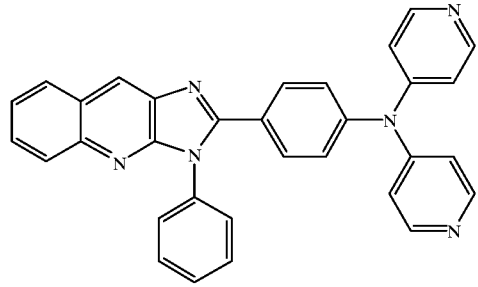
140. 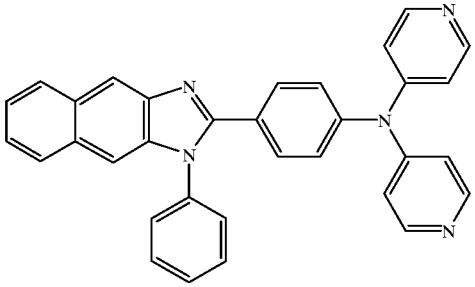
141. 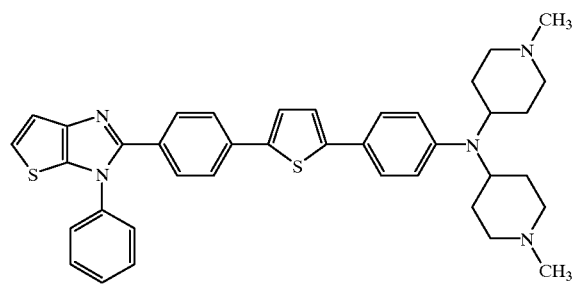
142. 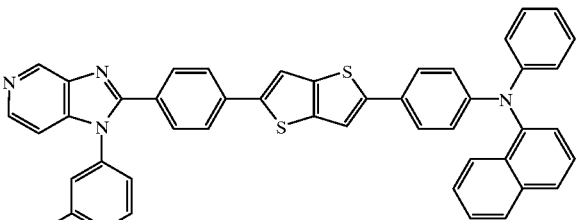
143. 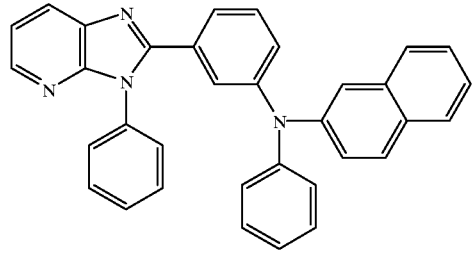
144. 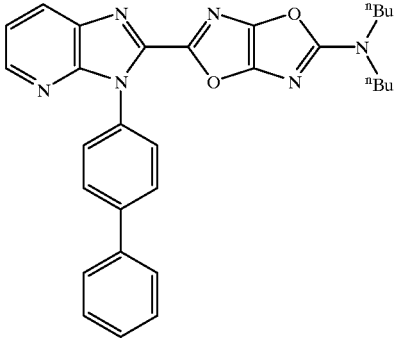

-continued
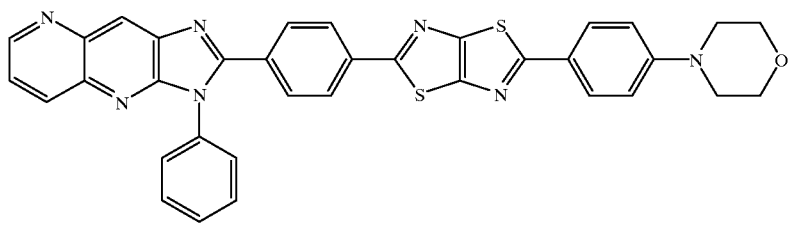 145.
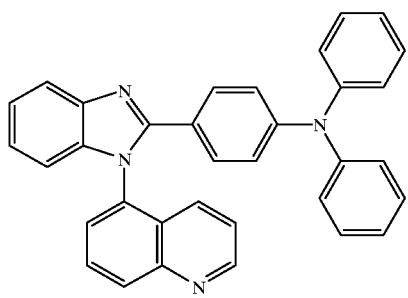 146.
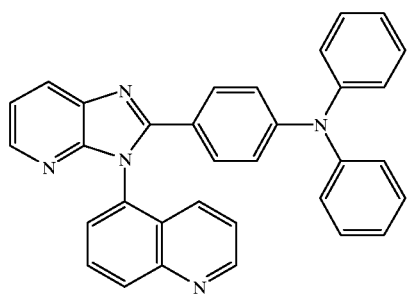 147.
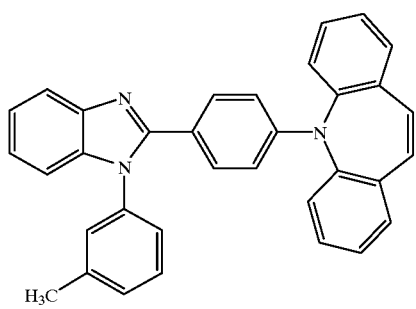 148.
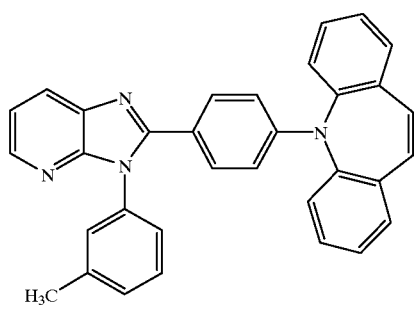 149.
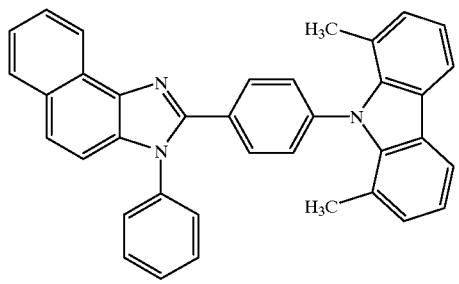 150.
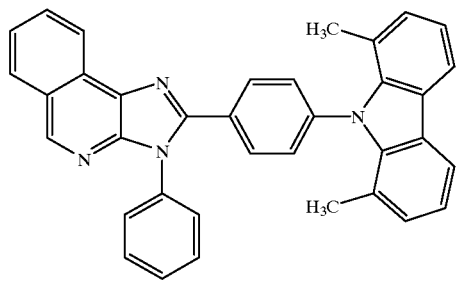 151.
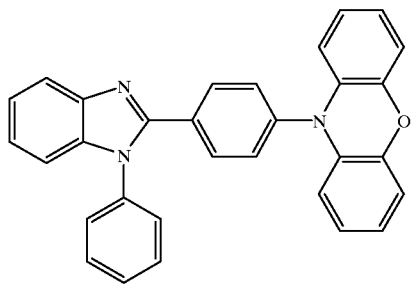 152.
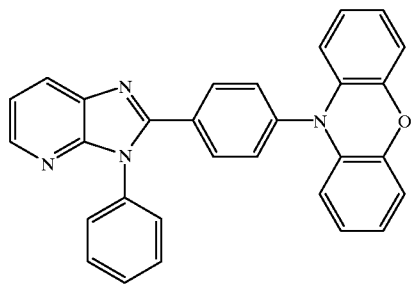 153.

-continued
154.
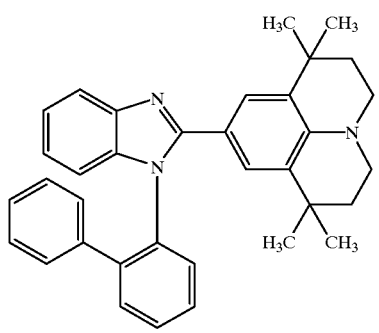
155.
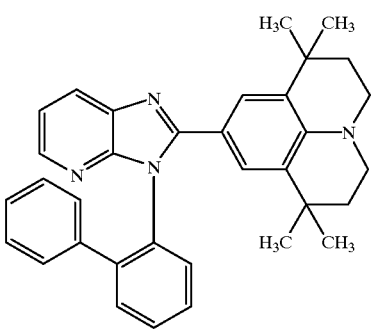
156.
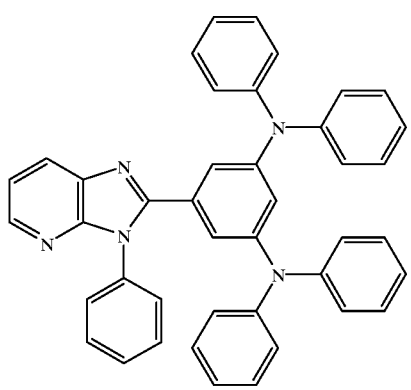
157.
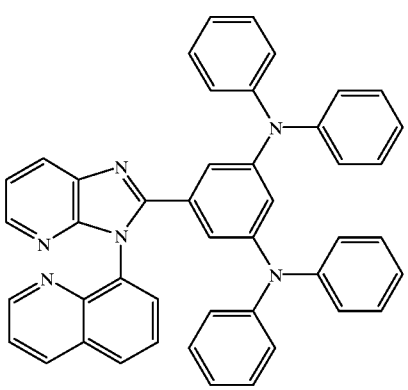
158.
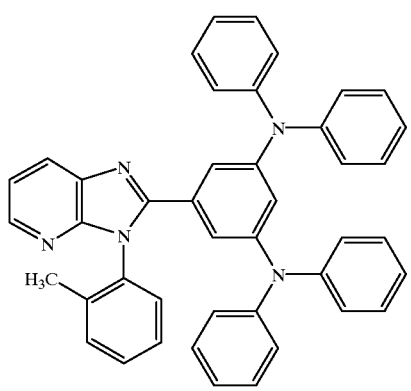
159.
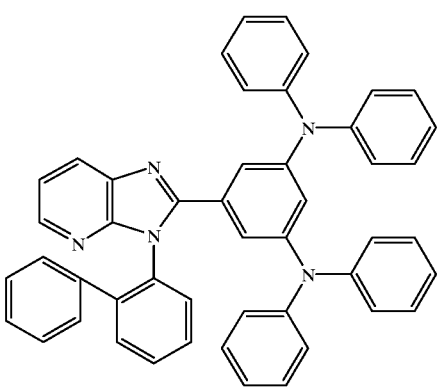
160.
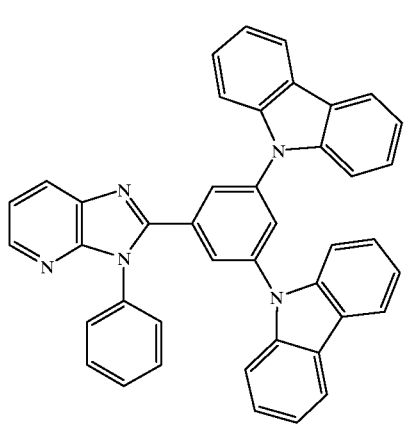
161.
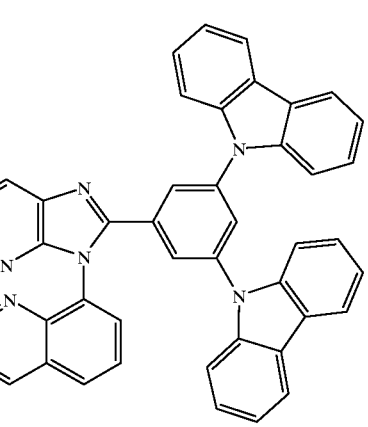

-continued
162.
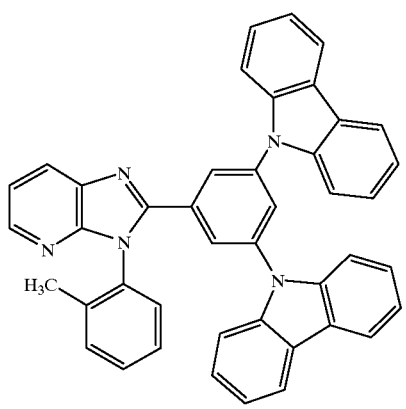
163.
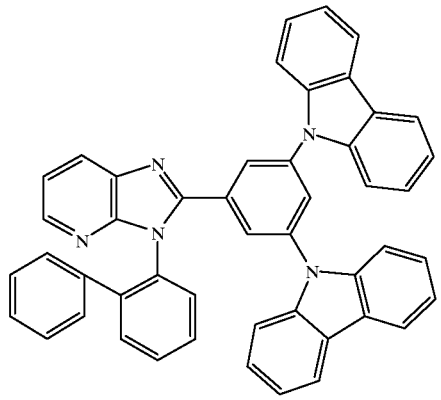
164.
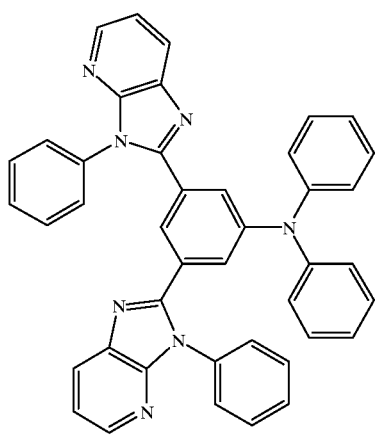
165.
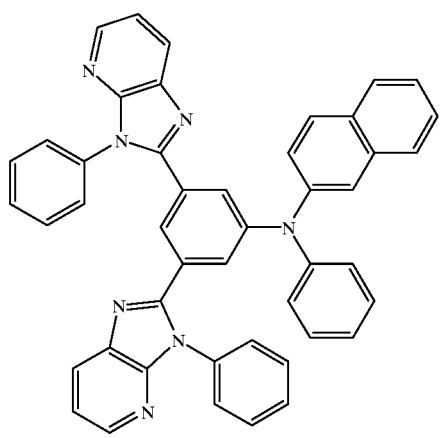
166.
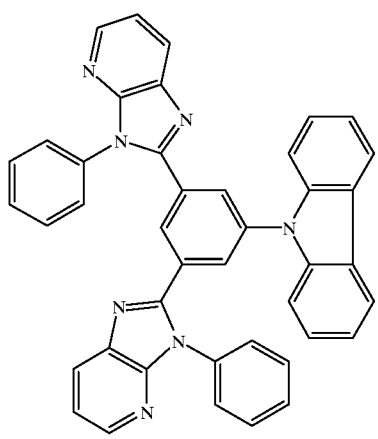
167.
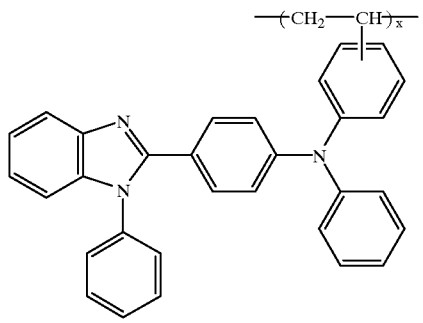
Mw: 18,000
(on polystyrene conversion)

-continued
168.
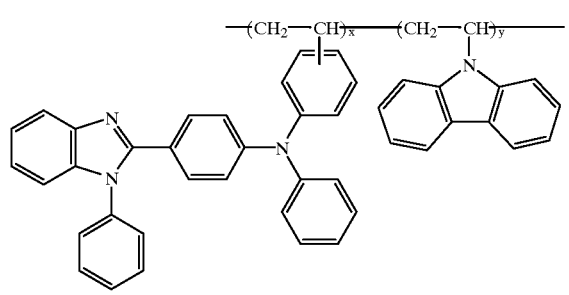
Mw: 100,000
(on polystyrene conversion)
x:y = 1:50 (by weight)
169.
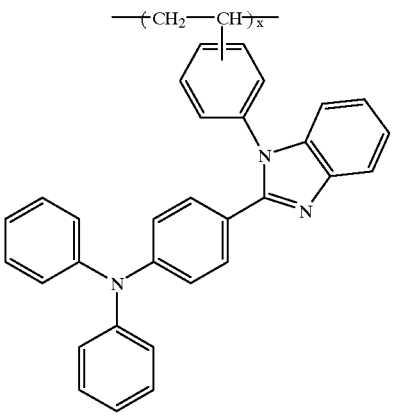
Mw: 18,000
(on polystyrene conversion)
170.
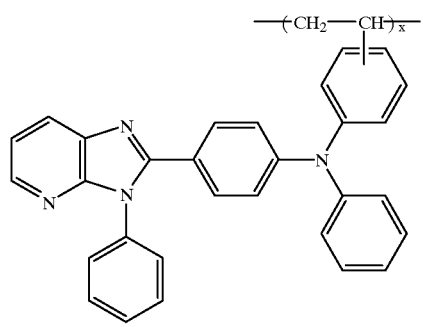
Mw: 18,000
(on polystyrene conversion)
171.
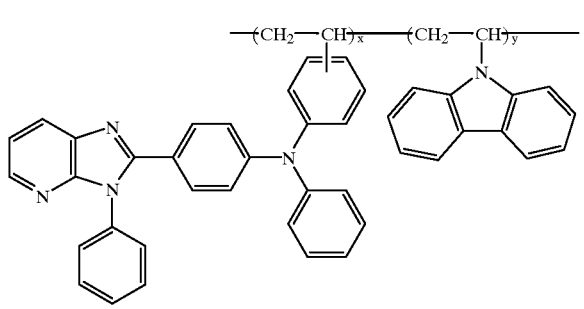
Mw: 100,000
(on polystyrene conversion)
x:y = 1:50 (by weight)
172.
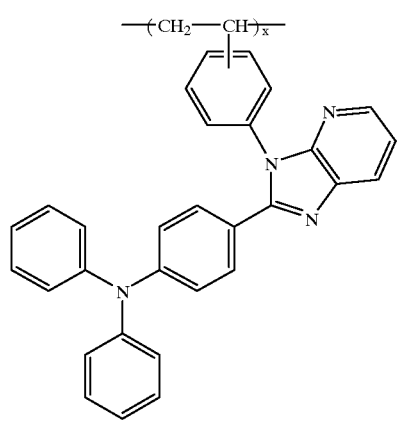
Mw: 18,000
(on polystyrene conversion)
173.
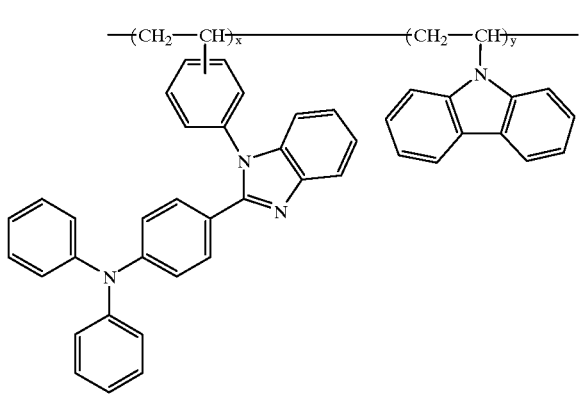
Mw: 20,000
(on polystyrene conversion)
x:y = 1:50 (by weight)

-continued
174.
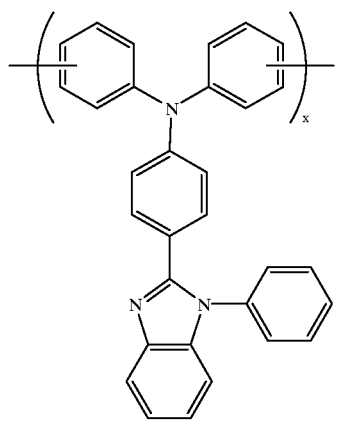
Mw: 18,000
(on polystyrene conversion)
175.
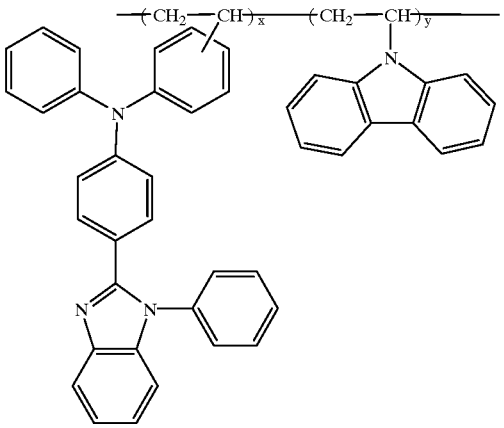
Mw: 20,000
(on polystyrene conversion)
x:y = 1:50 (by weight)
176.
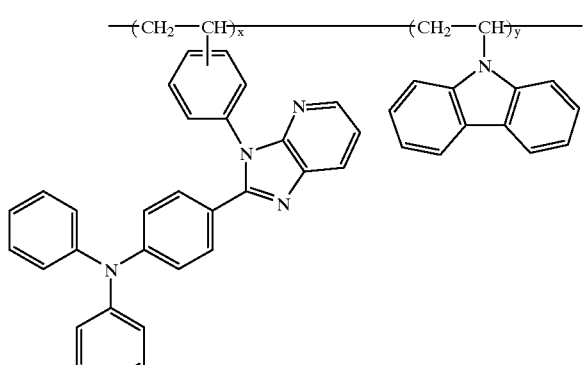
Mw: 20,000
(on polystyrene conversion)
x:y = 1:50 (by weight)
177.
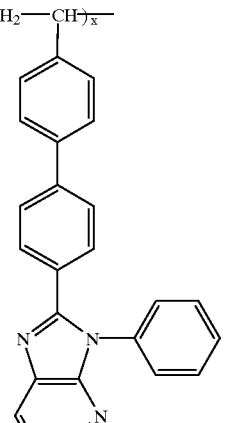
Mw: 70,000
(on polystyrene conversion)
178.
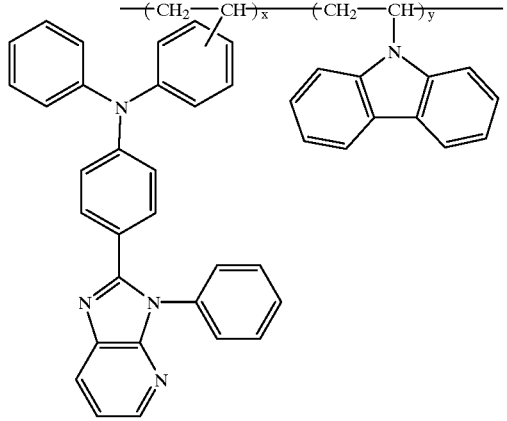
Mw: 20,000
(on polystyrene conversion)
x:y = 1:50 (by weight)
179.
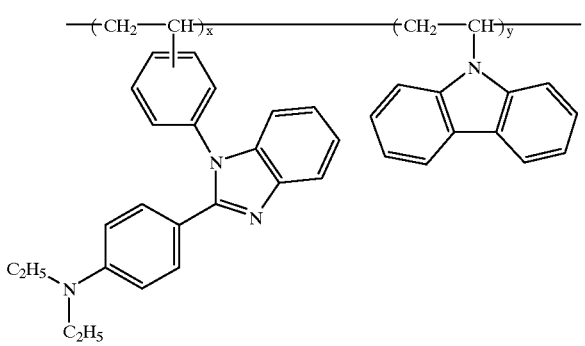
Mw: 100,000
(on polystyrene conversion)
x:y = 1:50 (by weight)

-continued
180.
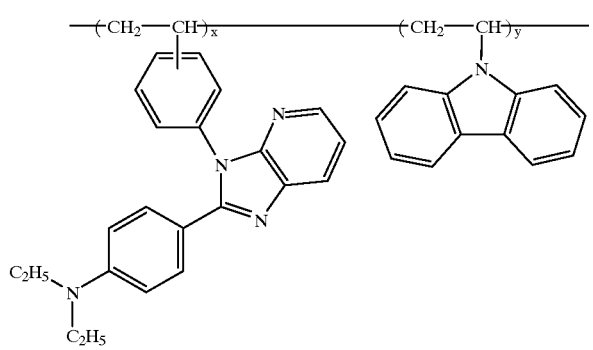
Mw: 100,000
(on polystyrene conversion)
x:y = 1:50 (by weight)
181.
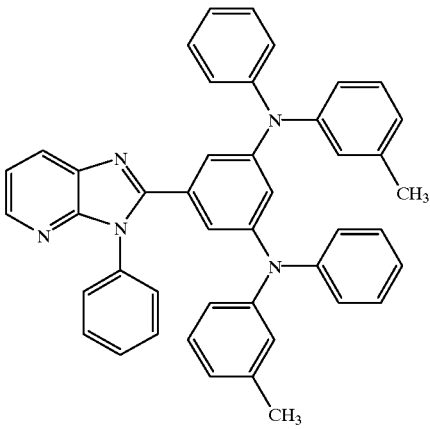
182.
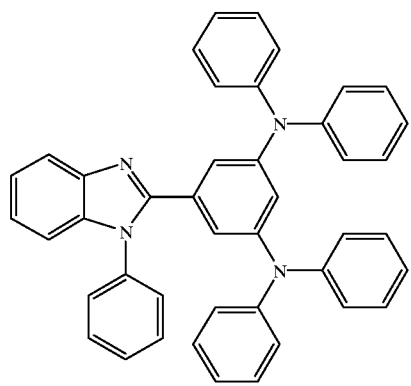
183.
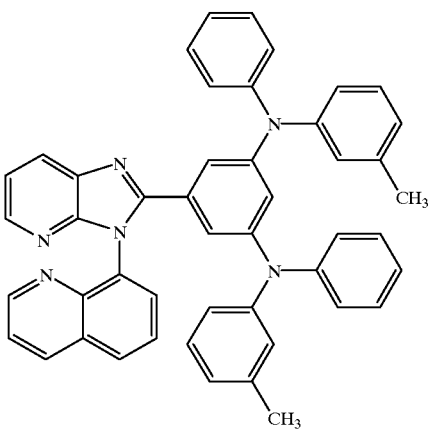
184.
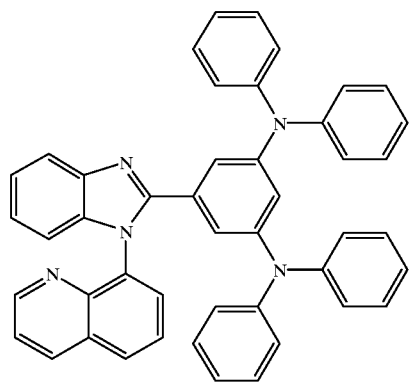
185.
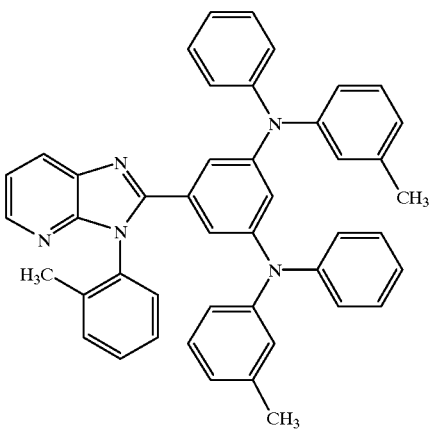

-continued
186.
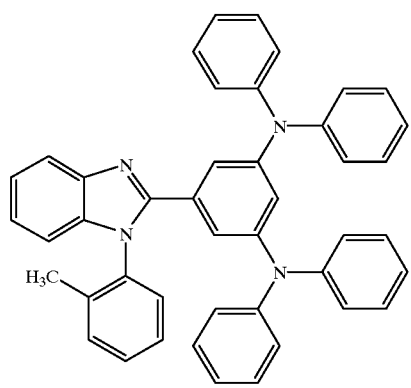
187.
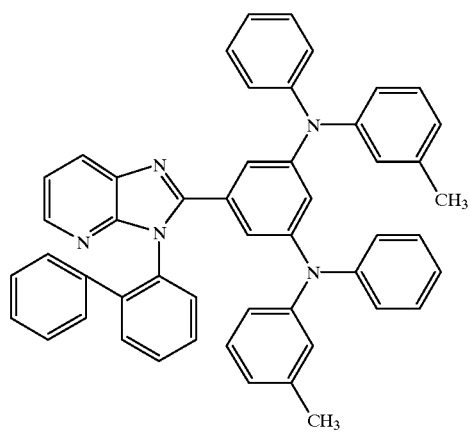
188.
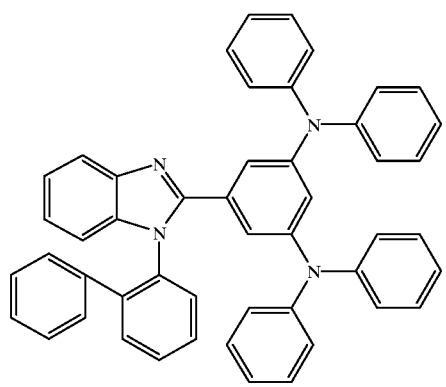
189.
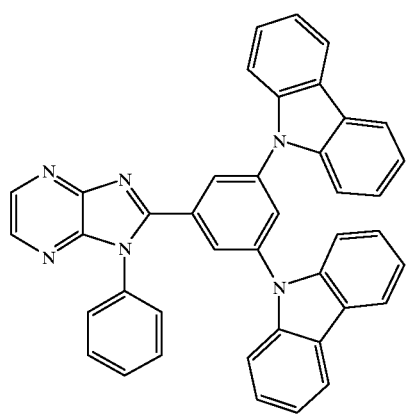
190.
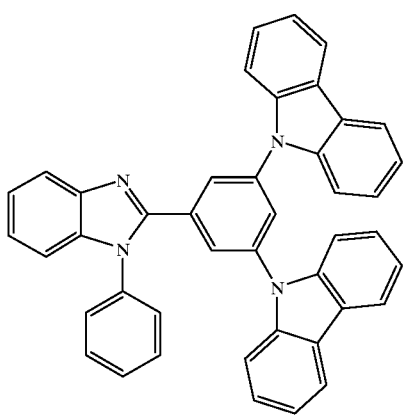
191.
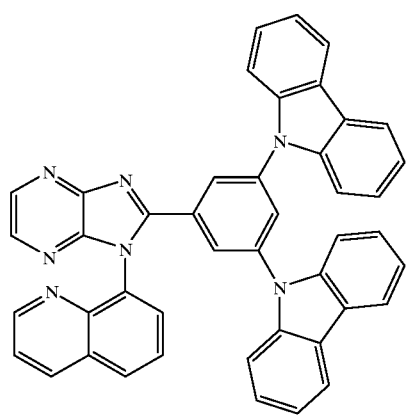

-continued
192.
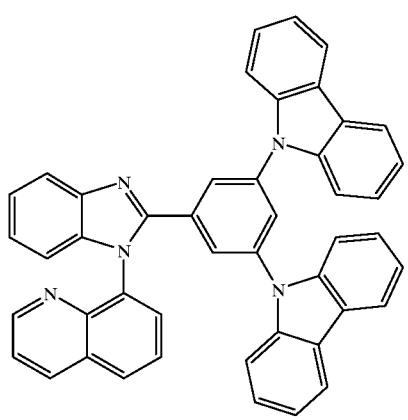
193.
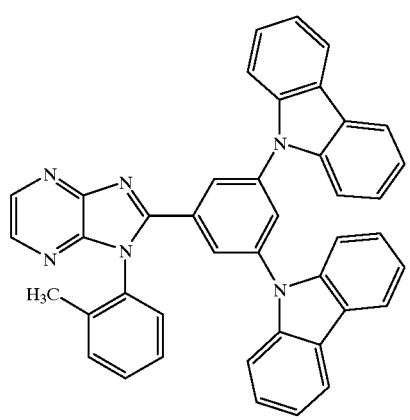
194.
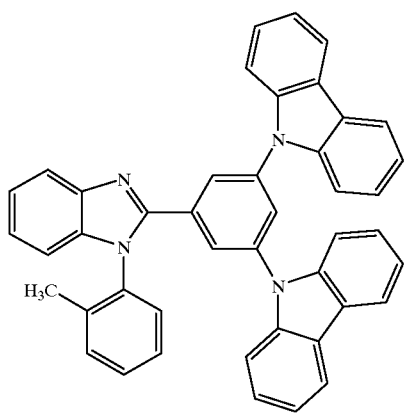
195.
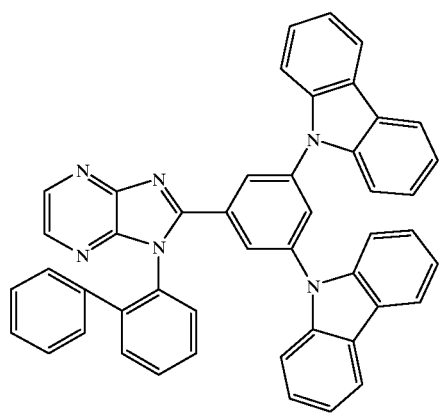
196.
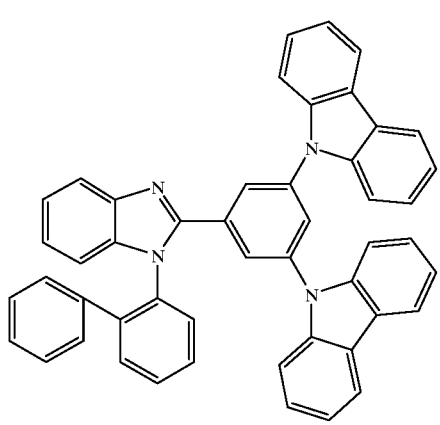
197.
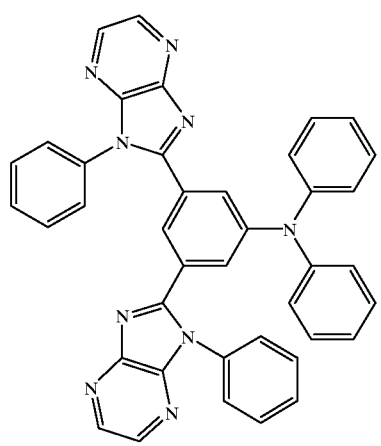

-continued
198.
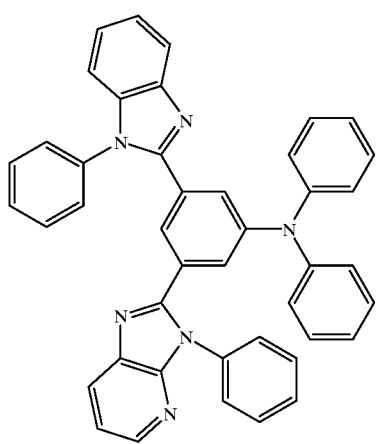
199.
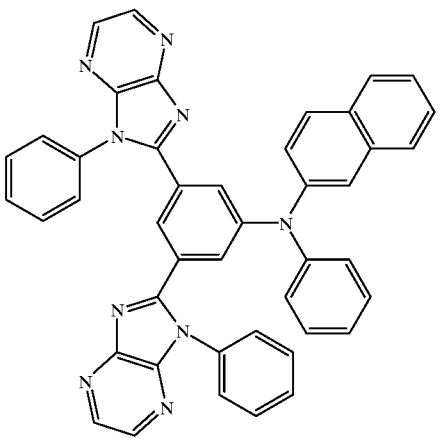
200.
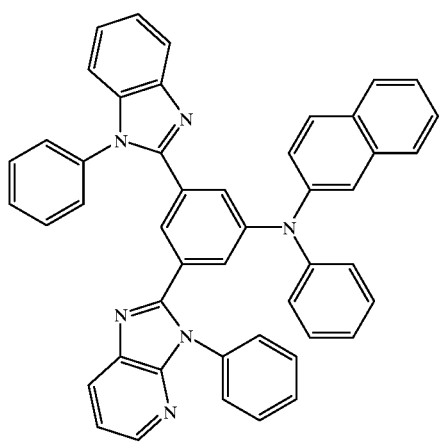
201.
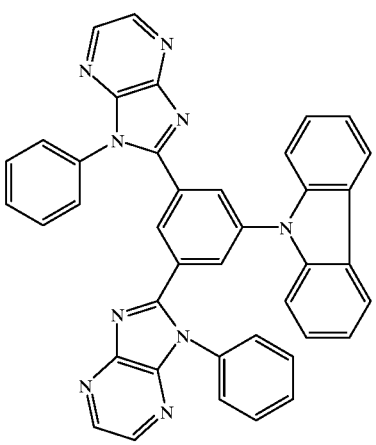
202.
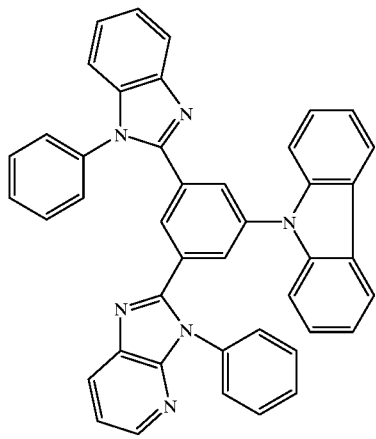
203.
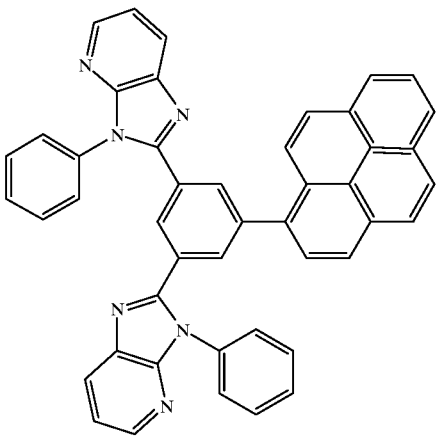

-continued
204.
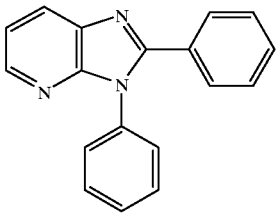
205.
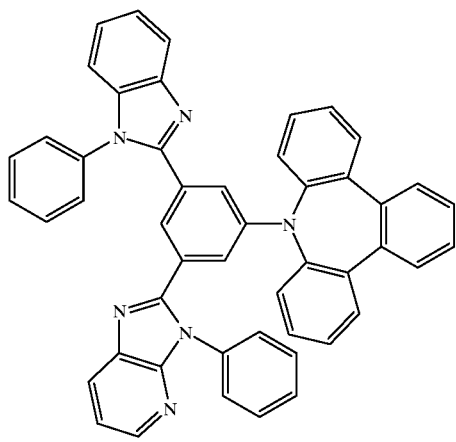
206.
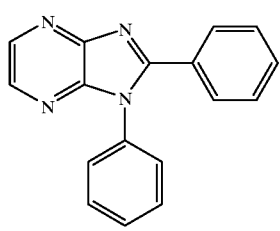
207.
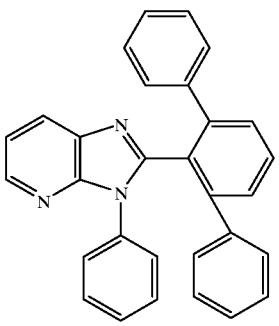
208.
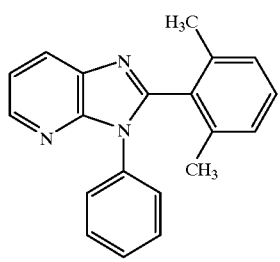
209.
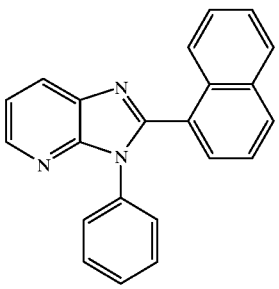
210.
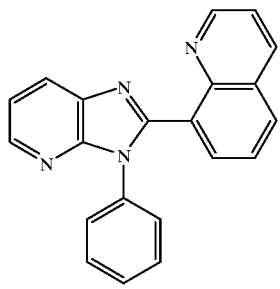
211.
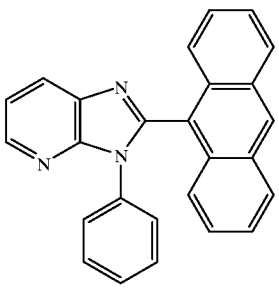

-continued
212.
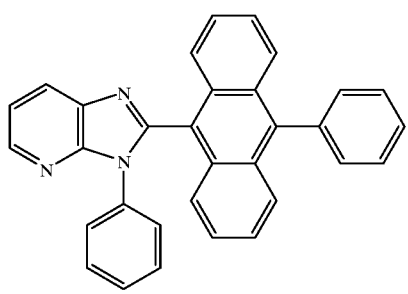
213.
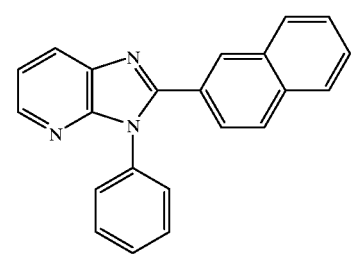
214.
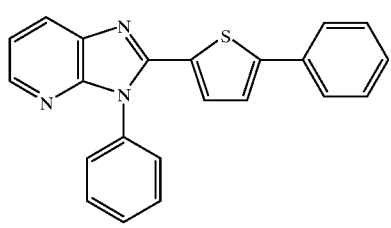
215.
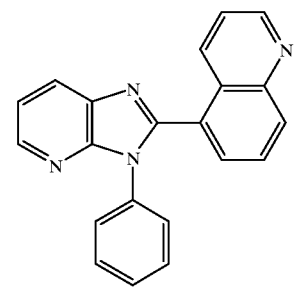
216.
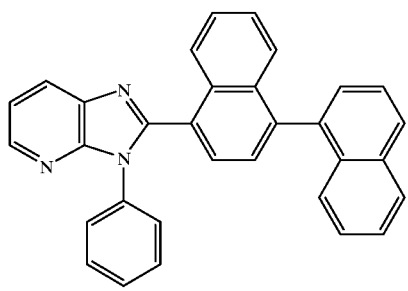
217.
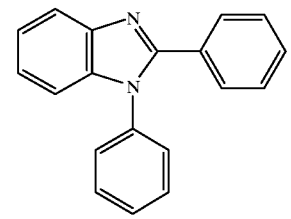
218.
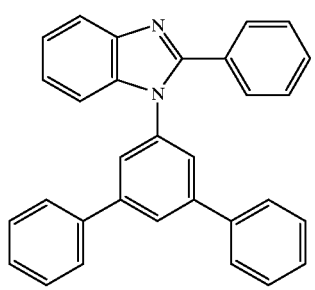
219.
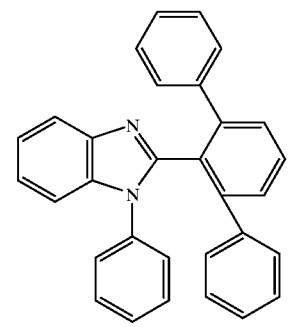
220.
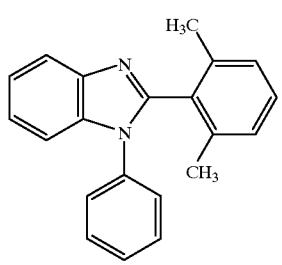
221.
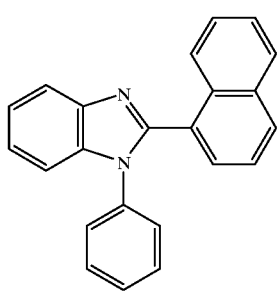

-continued
222.
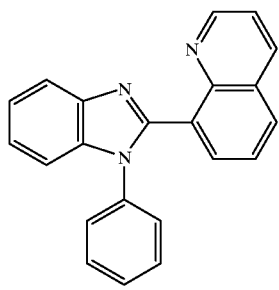
223.
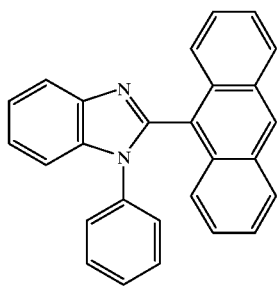
224.
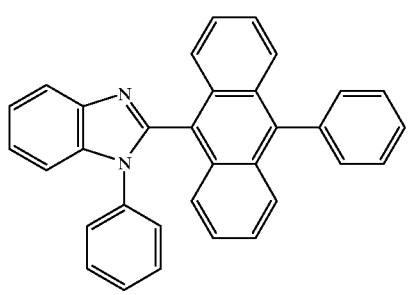
225.
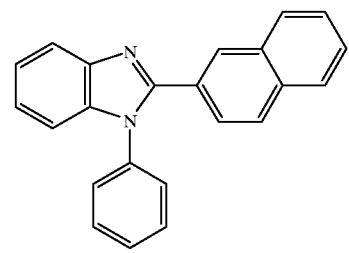
226.
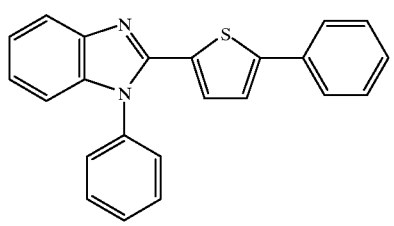
227.
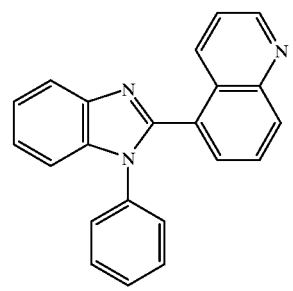
228.
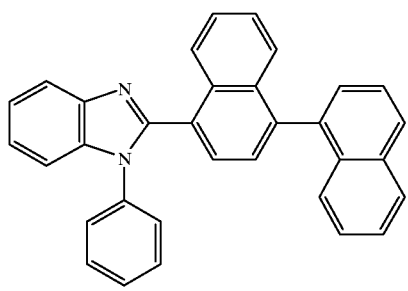
229.
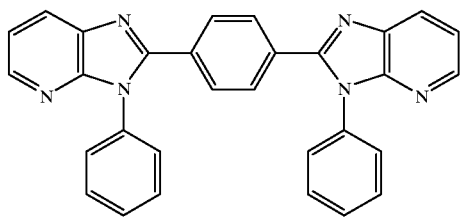
230.
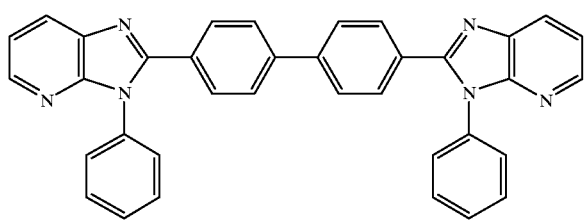
231.
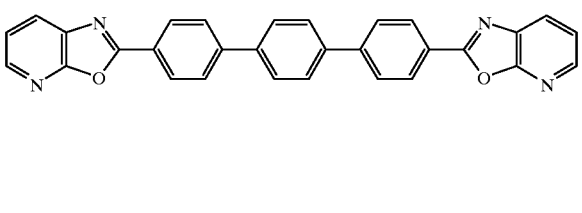

-continued
232.
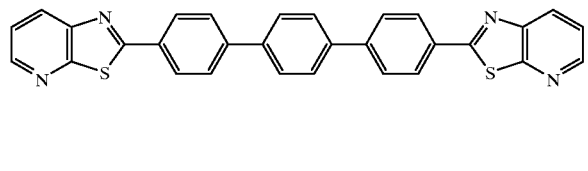
233.
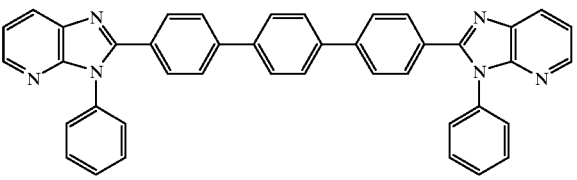
234.
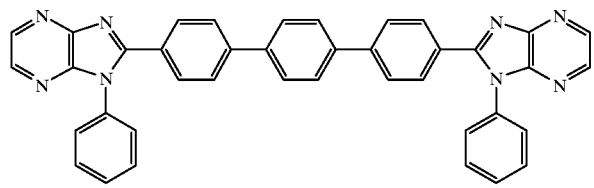
235.
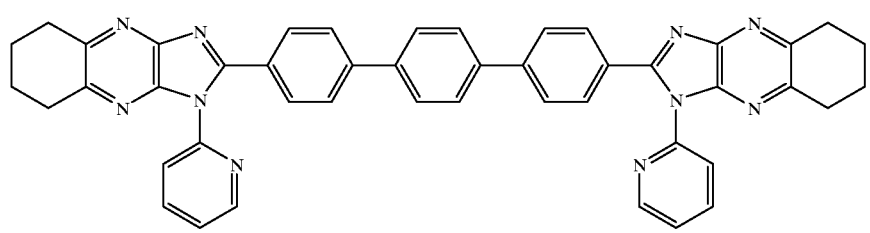
236.
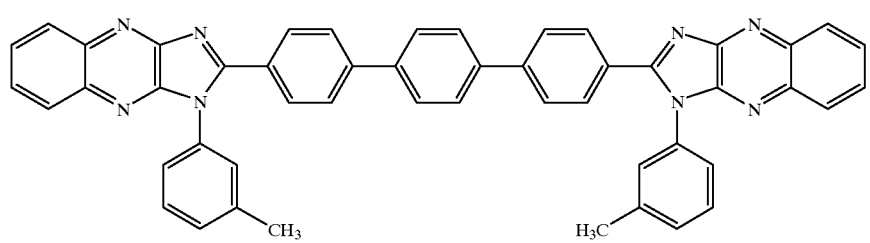
237.
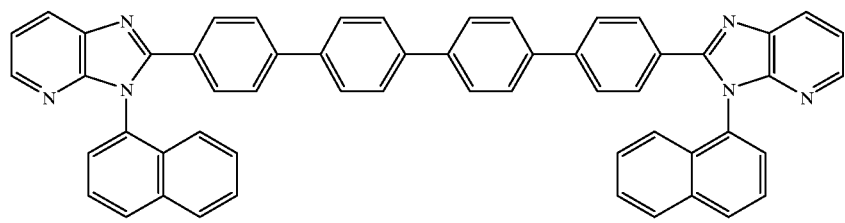
238.
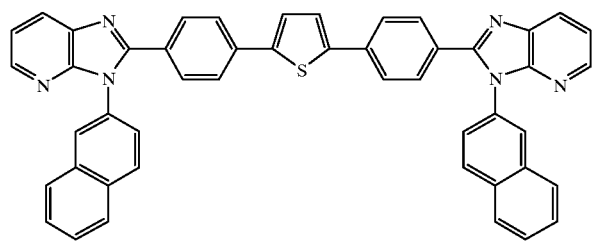
239.
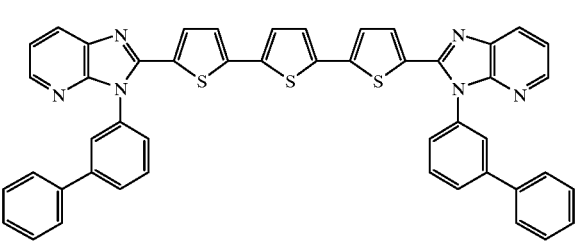

-continued
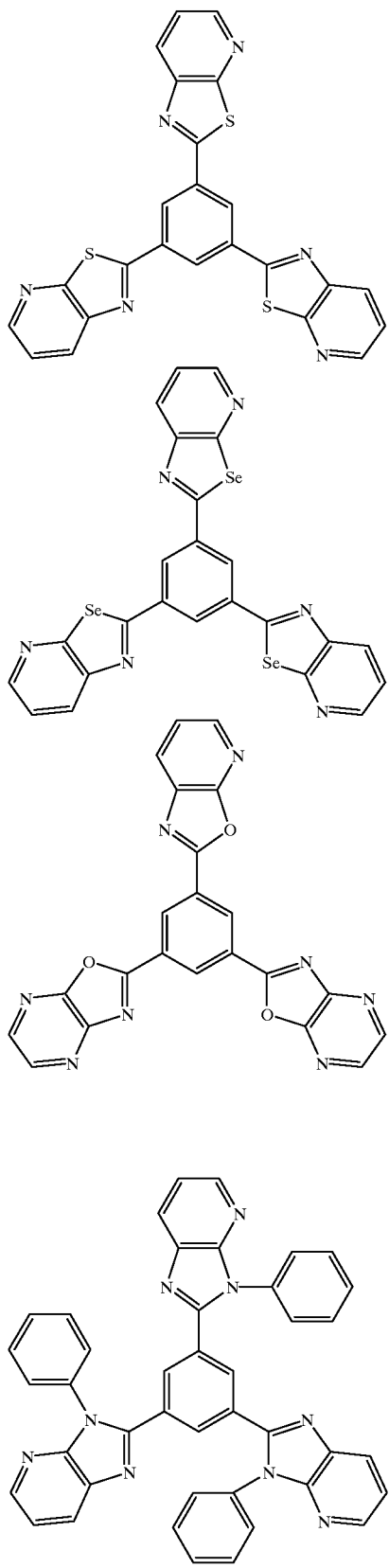
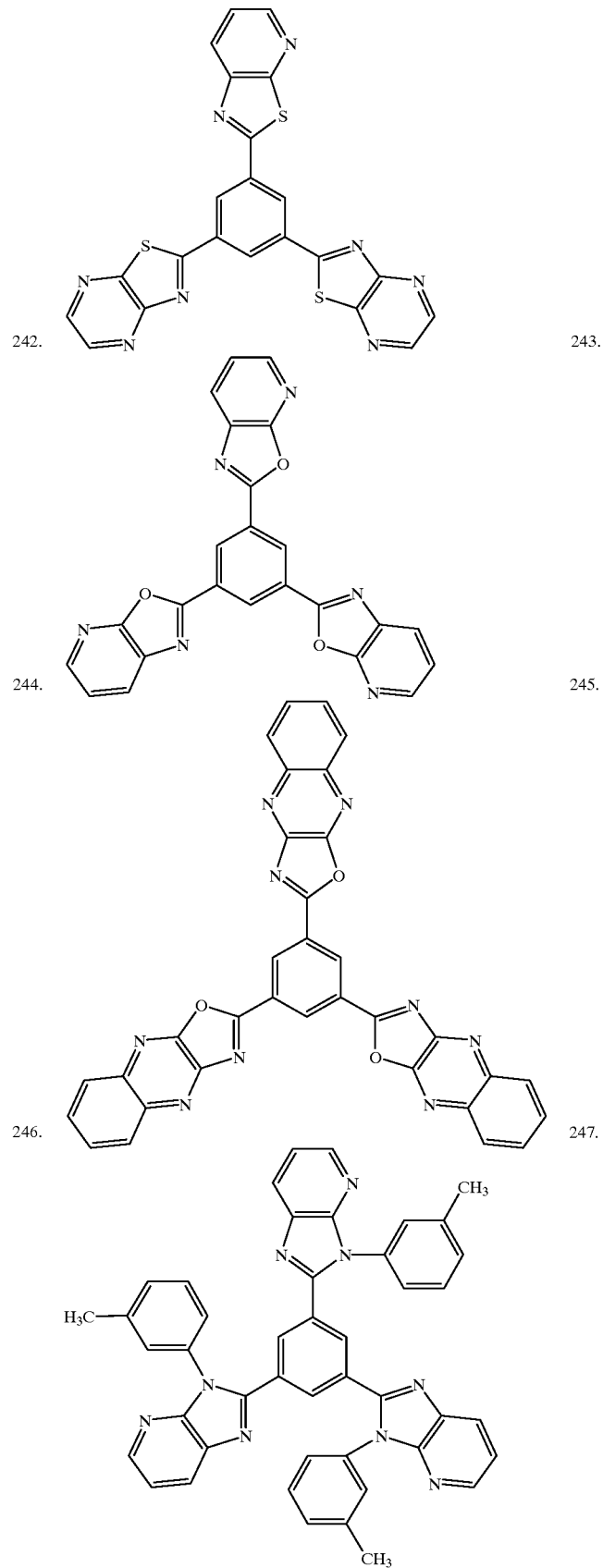

-continued
248.
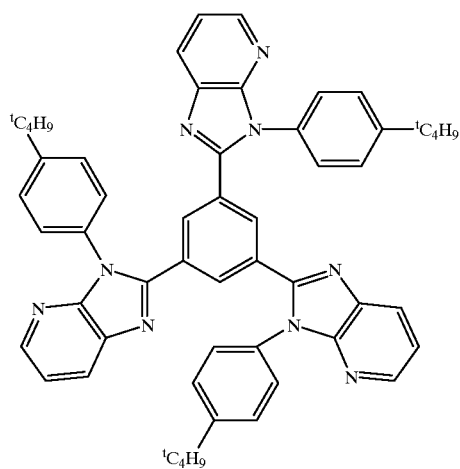
249.
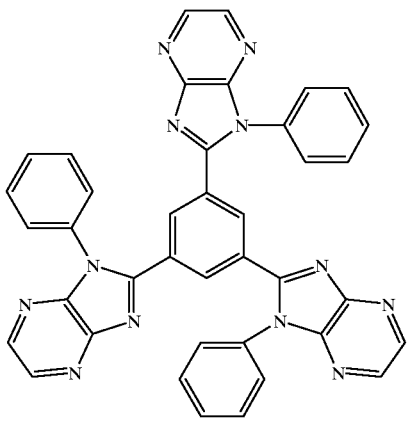
250.
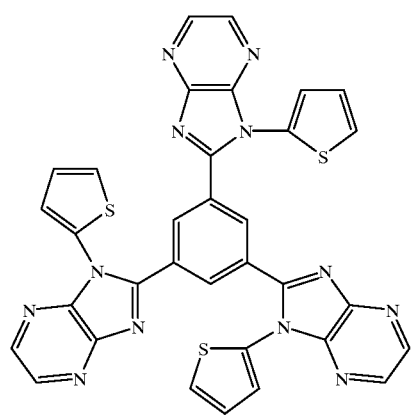
251.
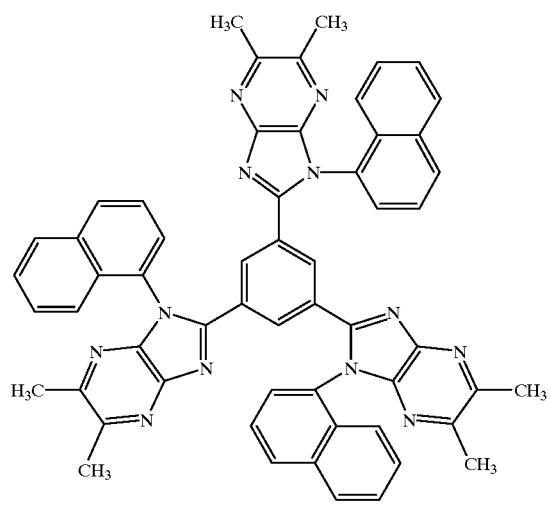
252.
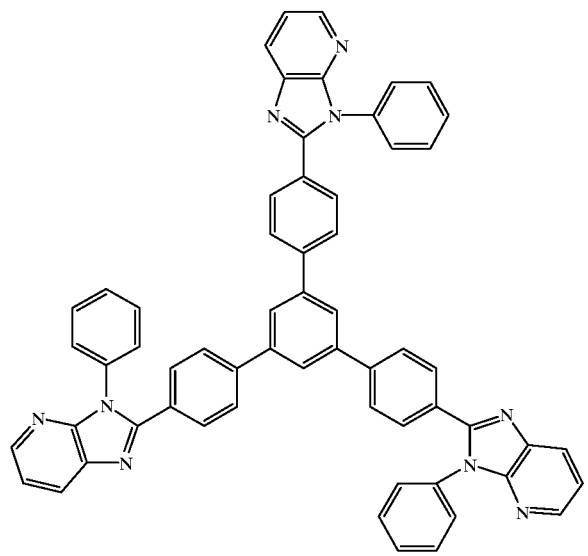
253.
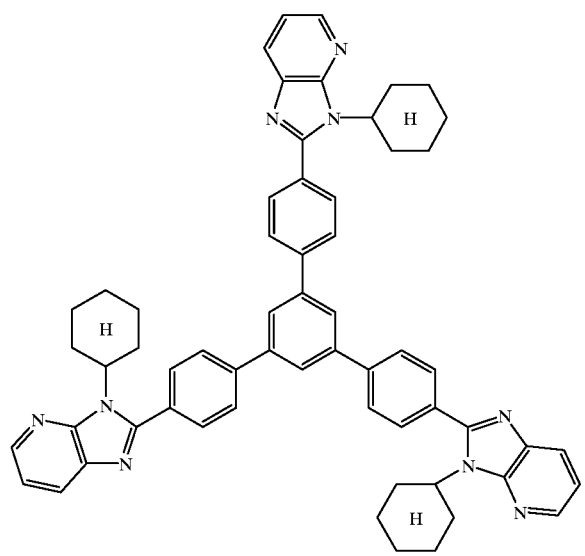

254.
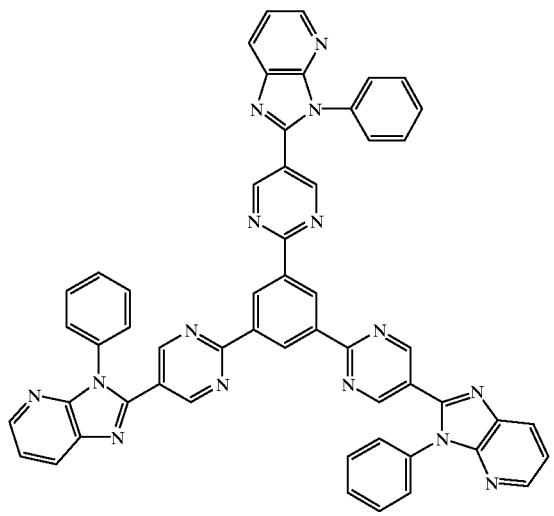
255.
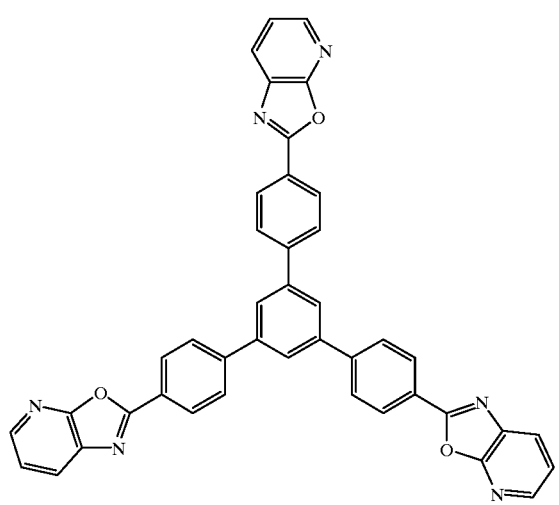
256.
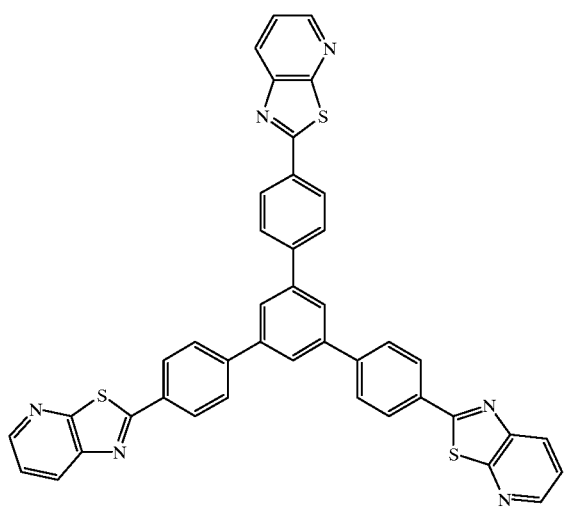
257.
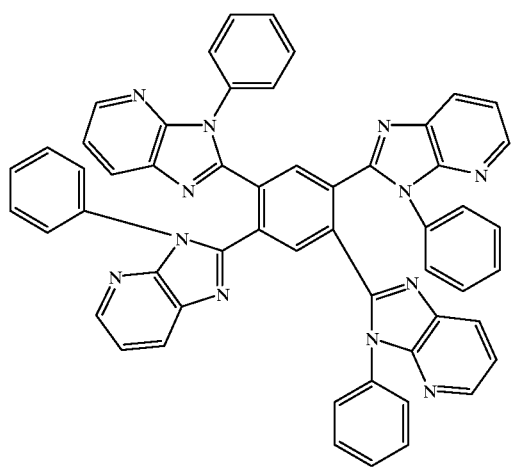
258.
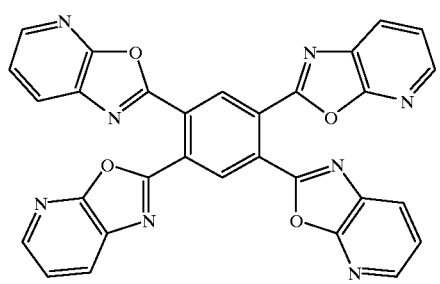
259.
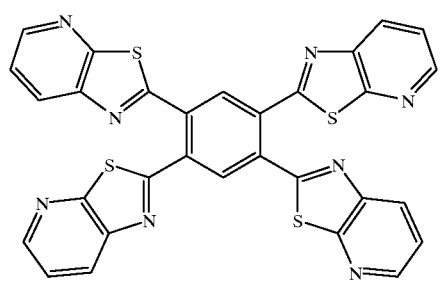

-continued
260.
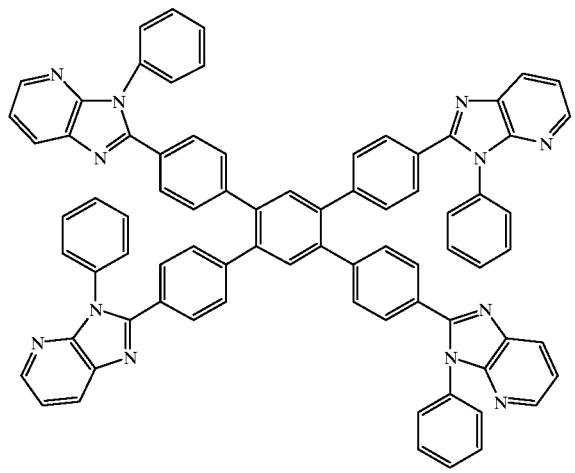
261.
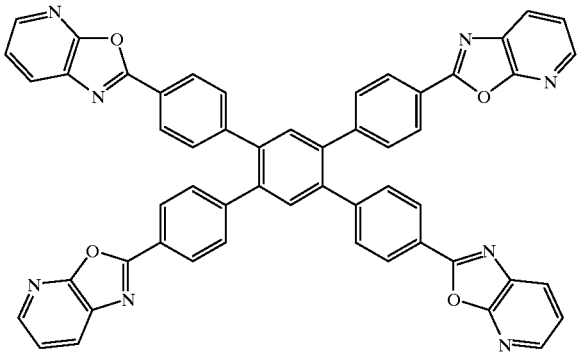
262.
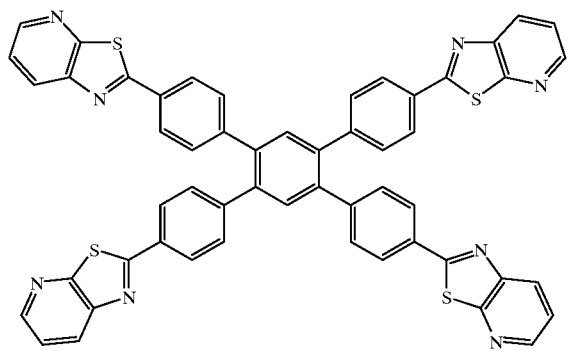
263.
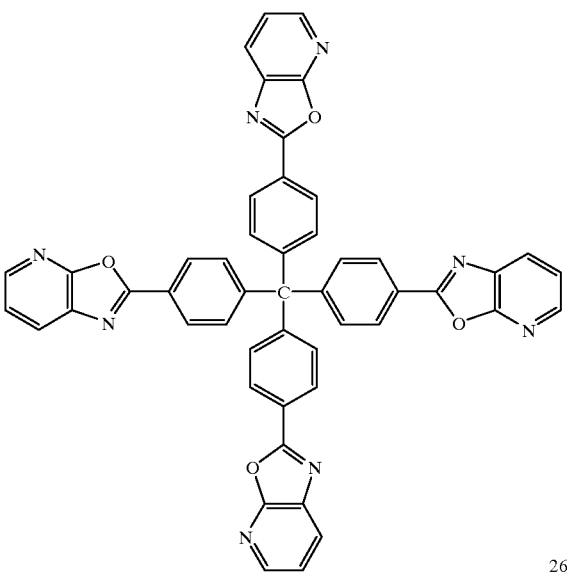
264.
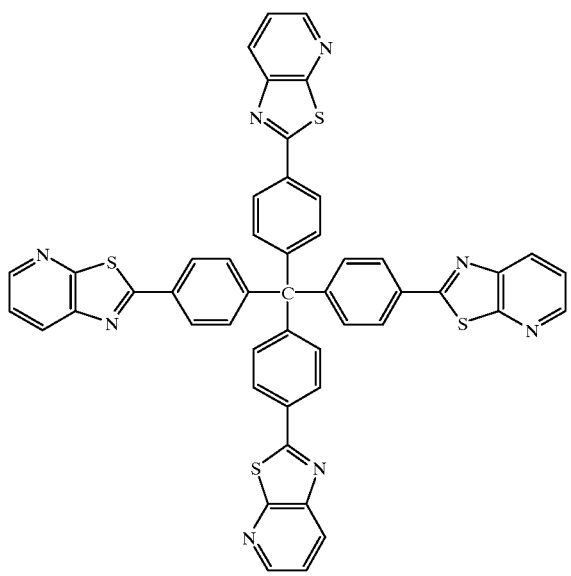
265.
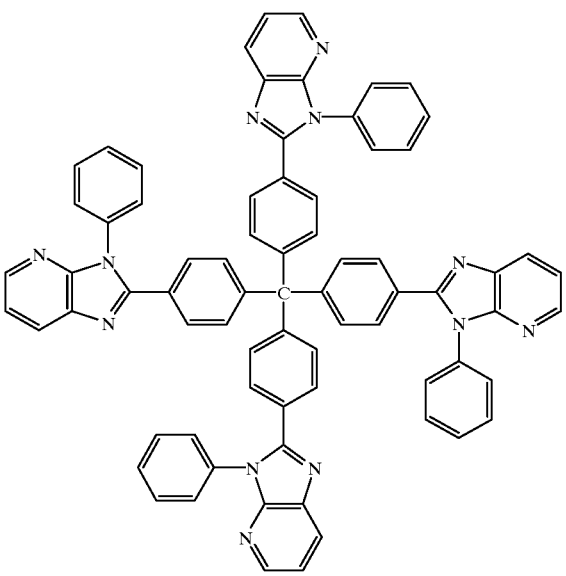

-continued
266.
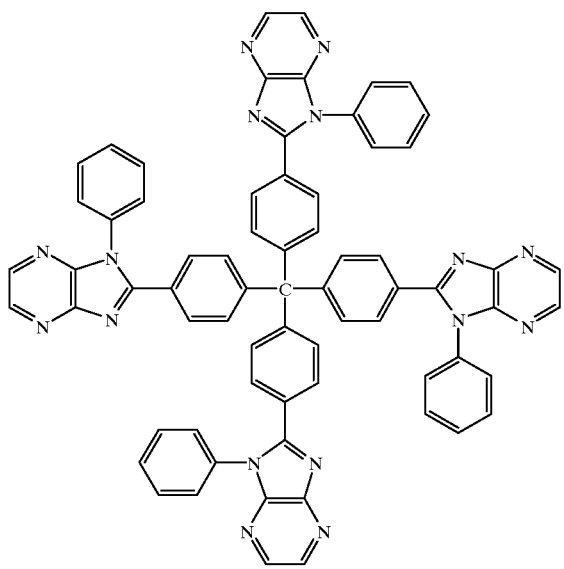
267.
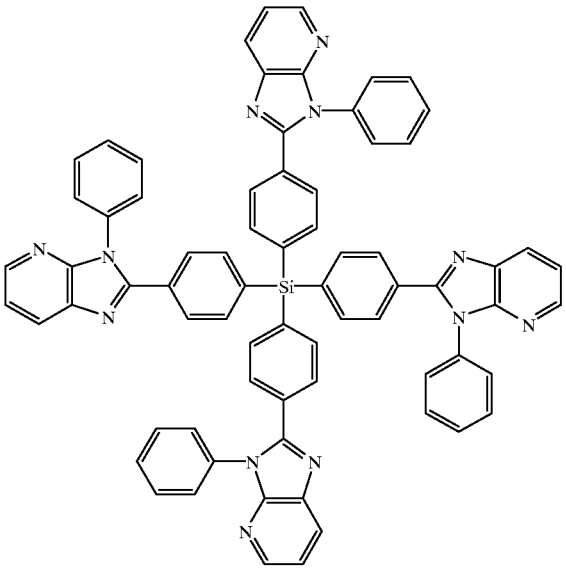
268.
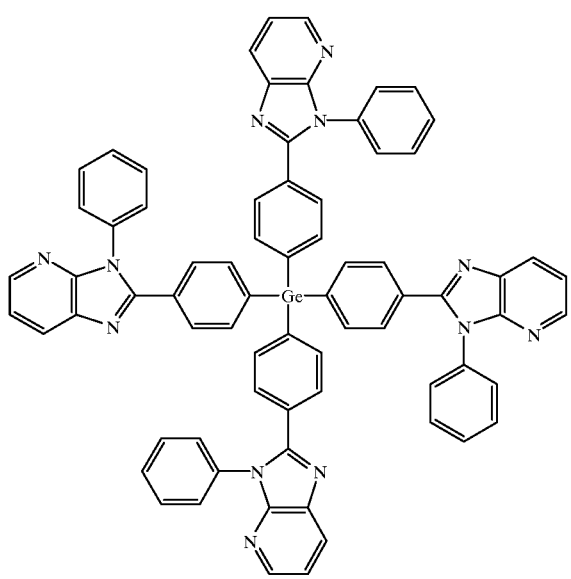
269.
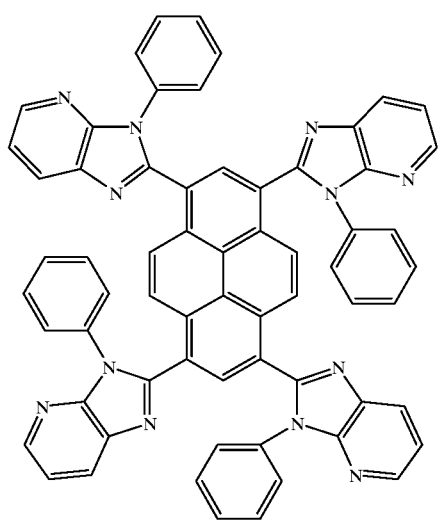
270.
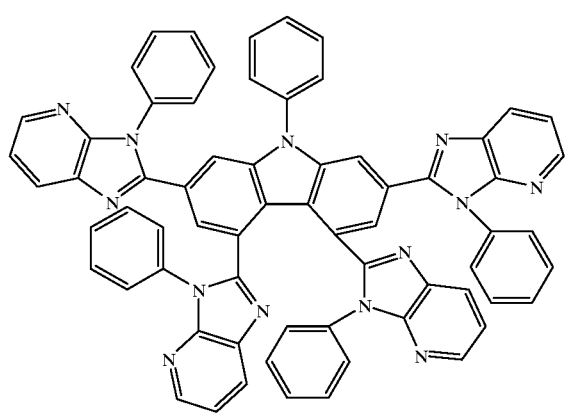
271.
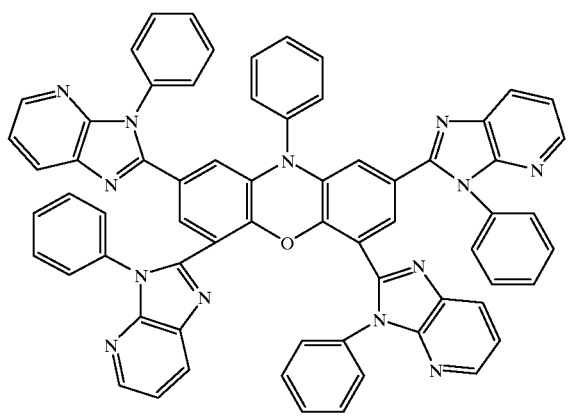

-continued
272.
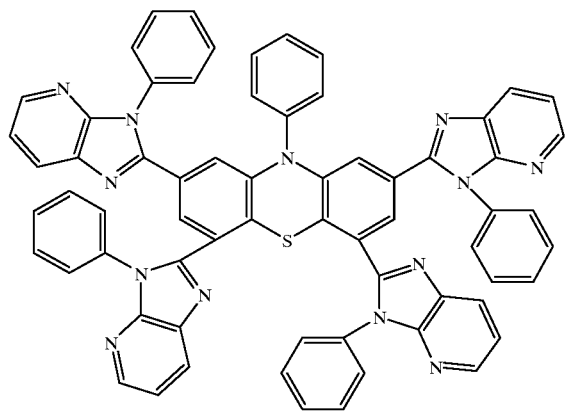
273.
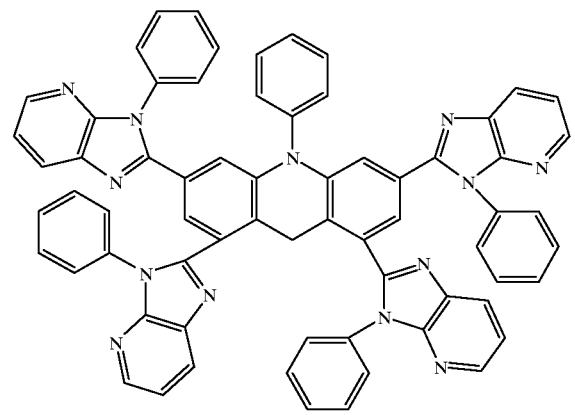
274.
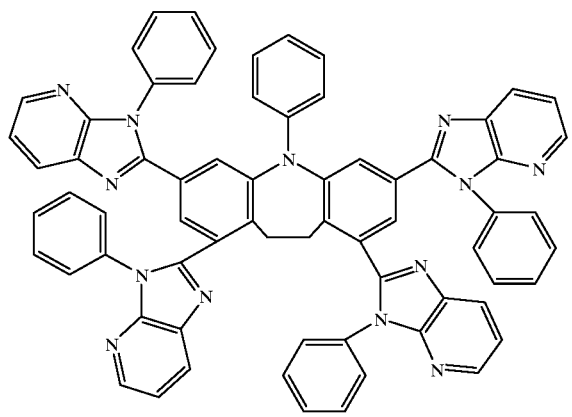
275.
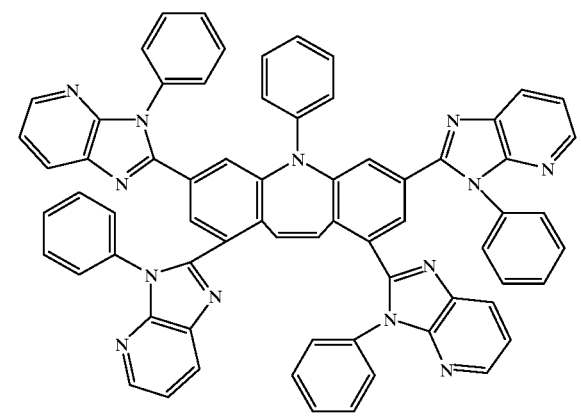
276.
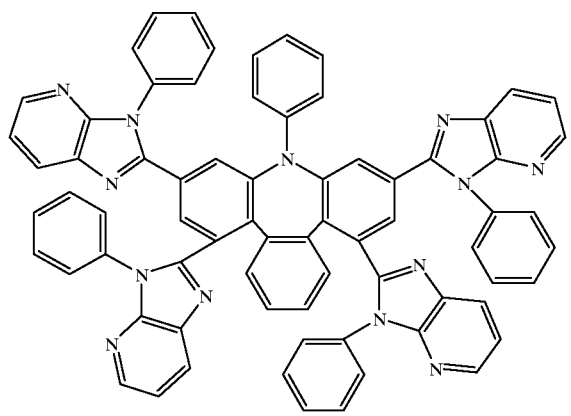
277.
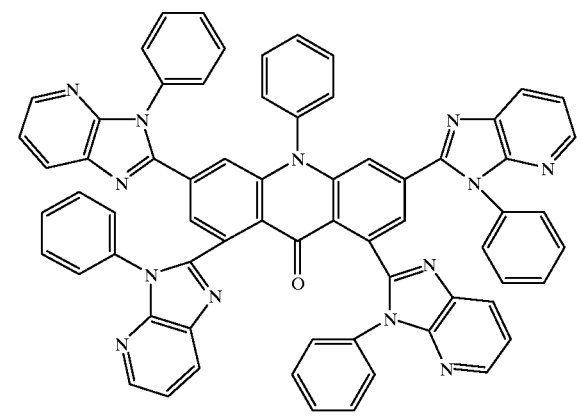

-continued
278.
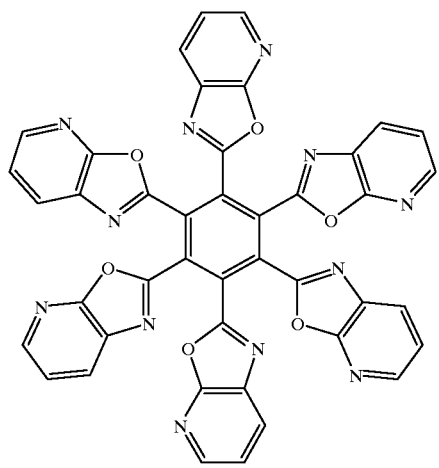
279.
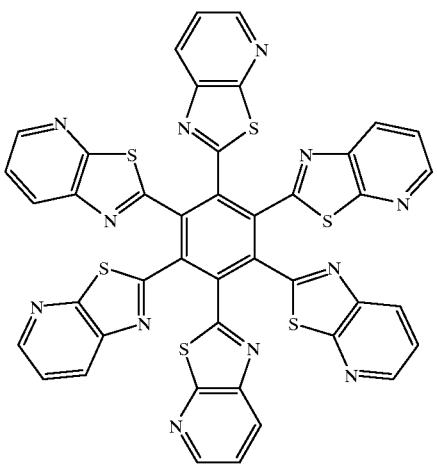
280.
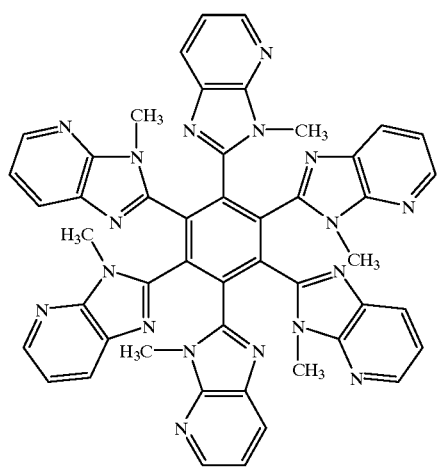
281.
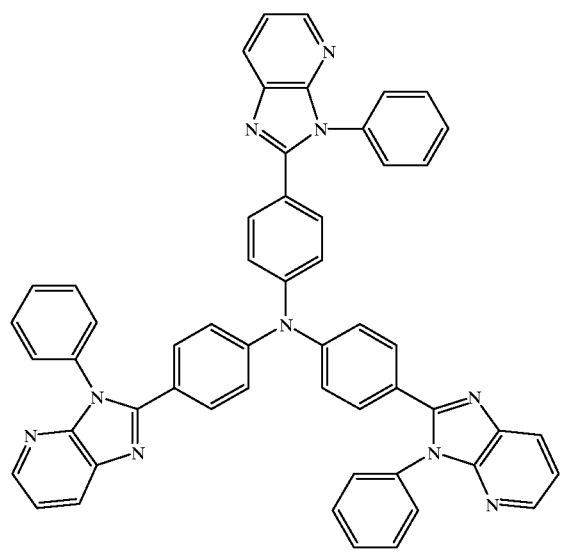
282.
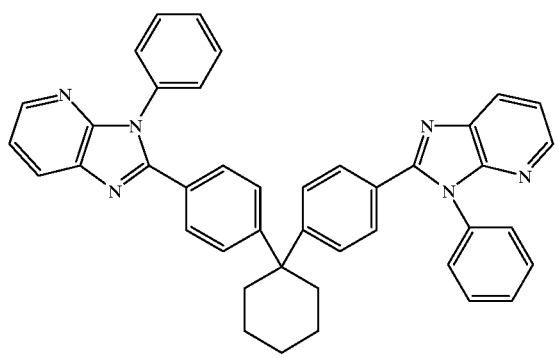

-continued
283.
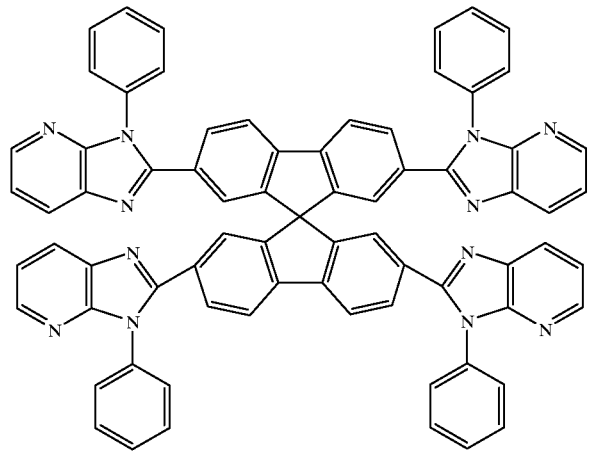
284.
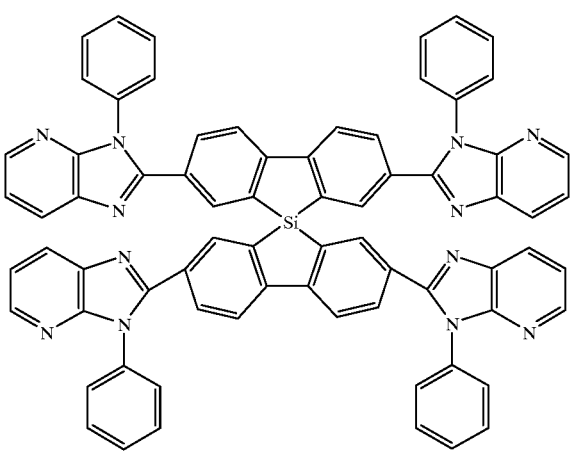
285.
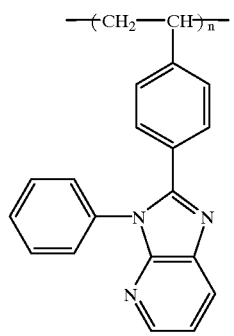
Mw: 50,000
(on polystyrene conversion)
286.
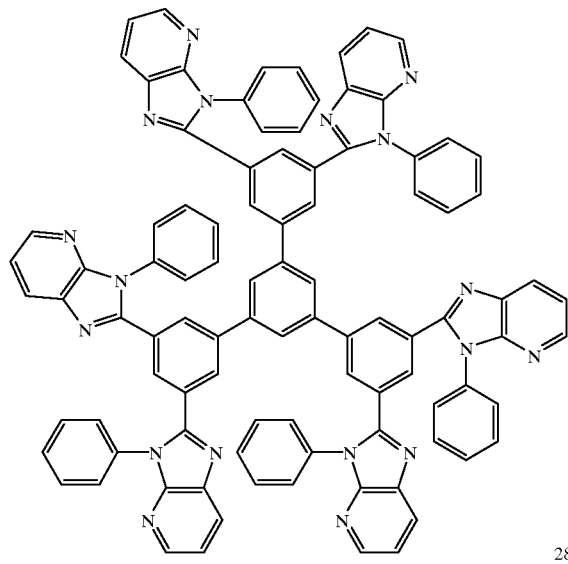
287.
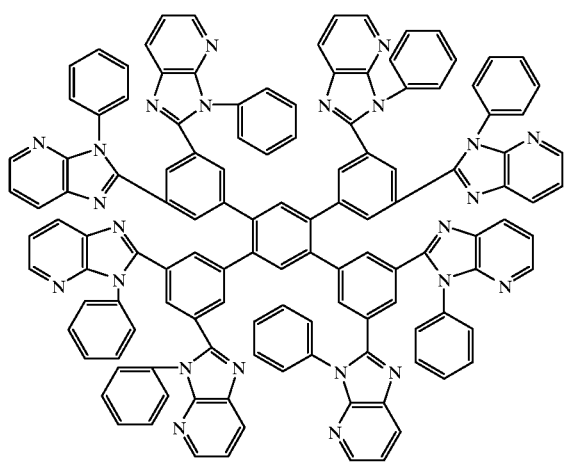
288.
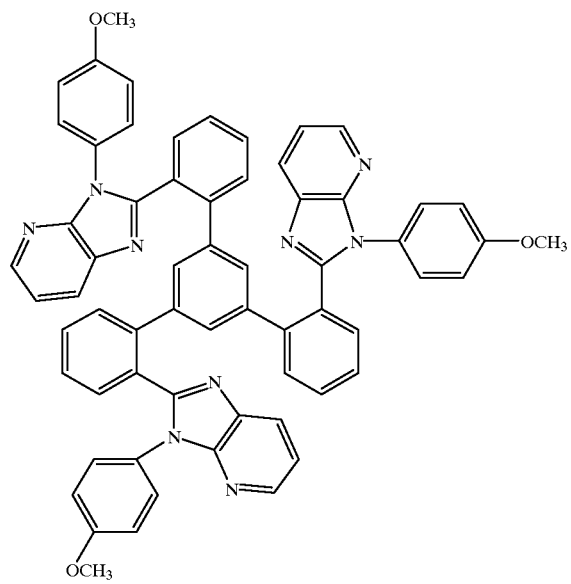

-continued
289.
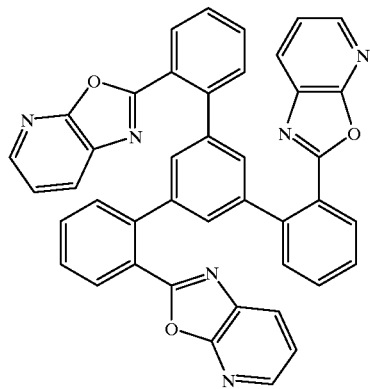
290.
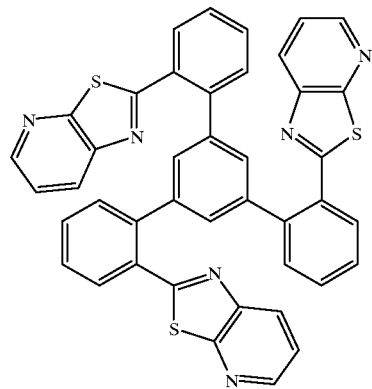
291.
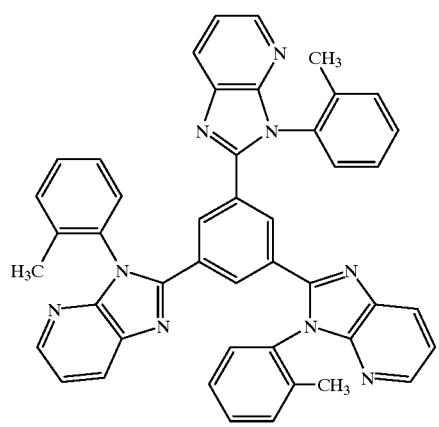
292.
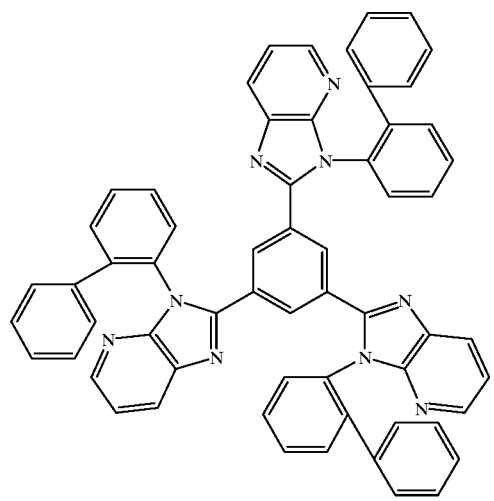
293.
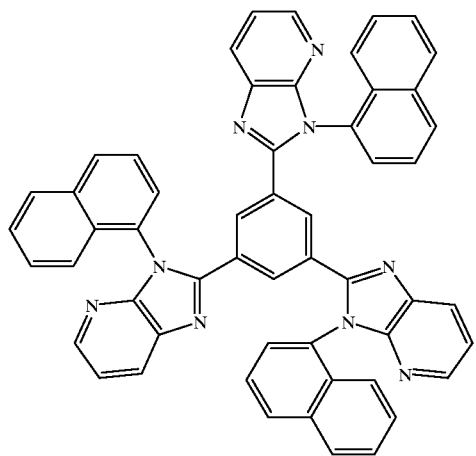
294.
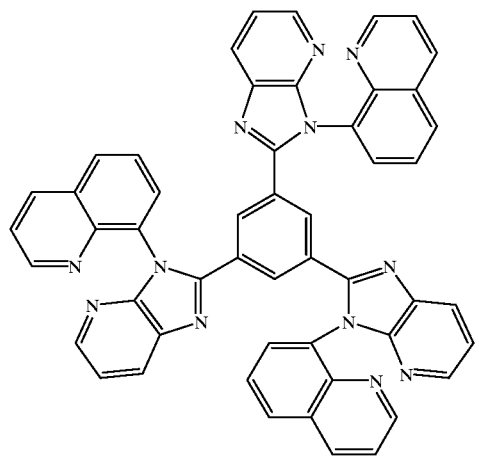

-continued
295.
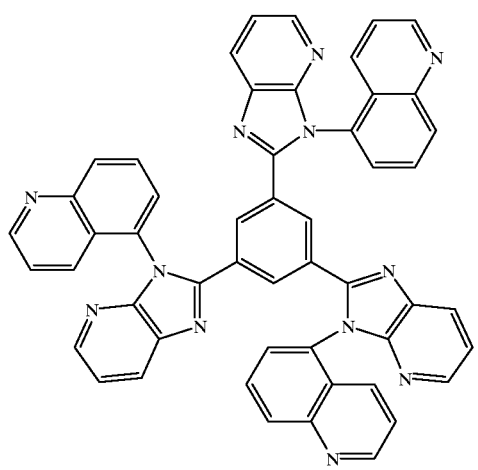
296.
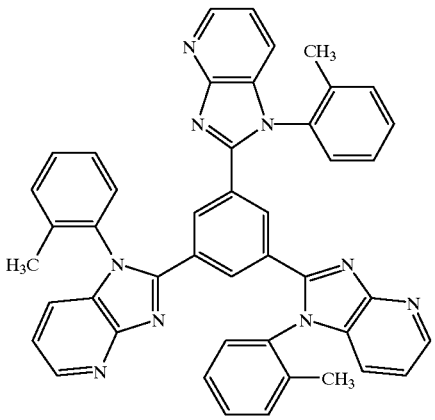
297.
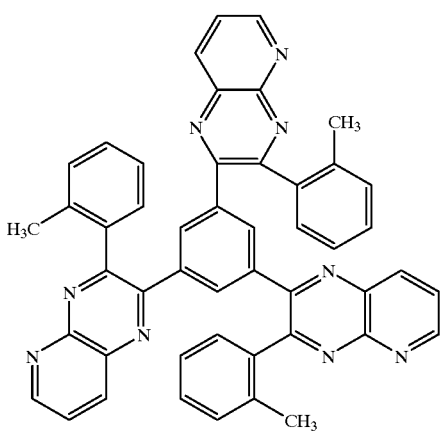
298.
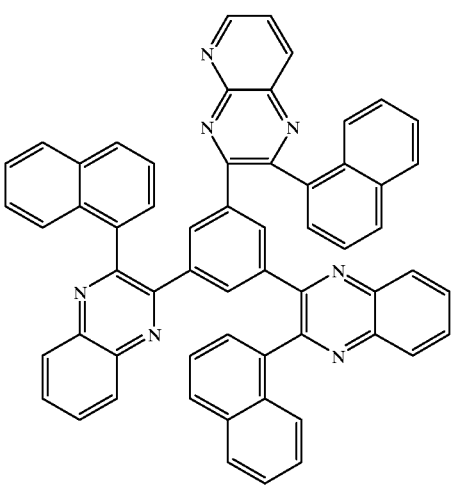
299.
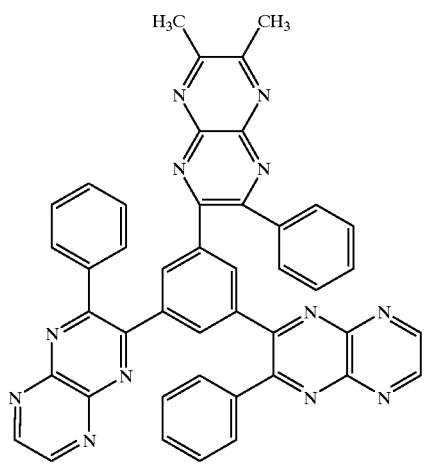
300.
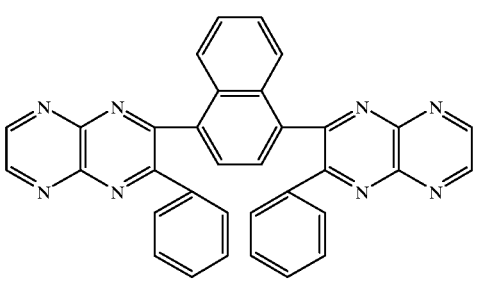

-continued
301.
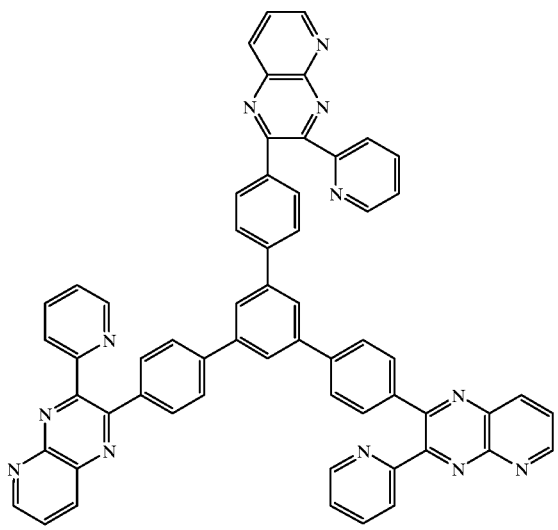
302.
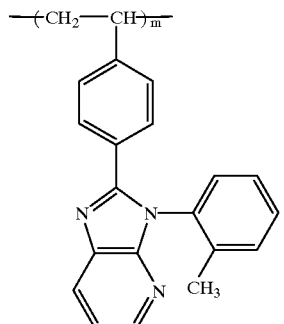
Mw: 21,000 (on polystyrene conversion)
303.
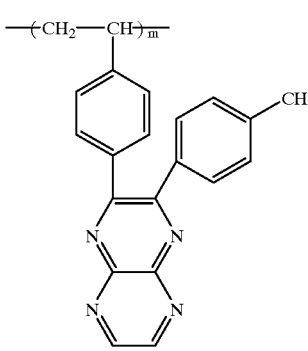
Mw: 14,000 (on polystyrene conversion)
304.
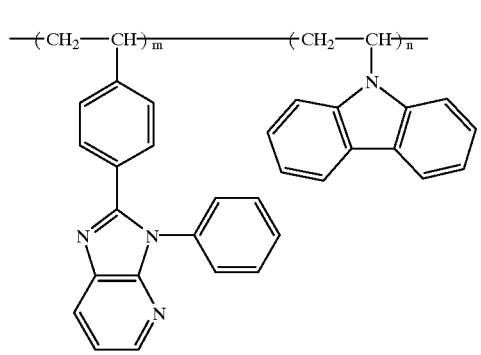
Mw: 17,000 (on polystyrene conversion)
m:n = 1:1 (molar ratio)
305.
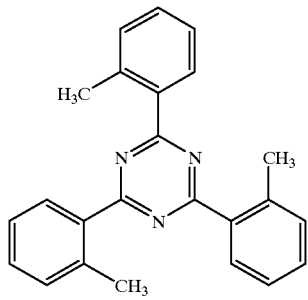
306.
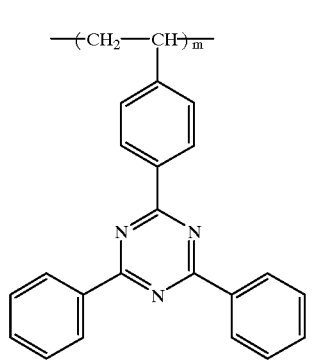
Mw: 23,000 (on polystyrene conversion)
307.
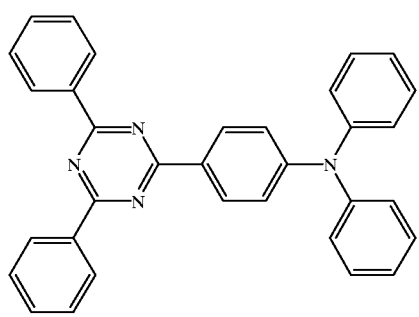
308.
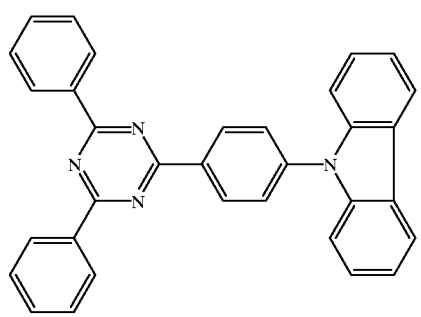

-continued
309.
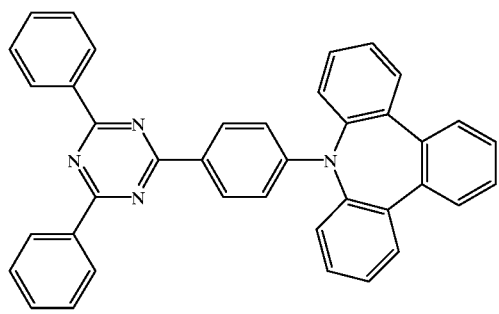
310.
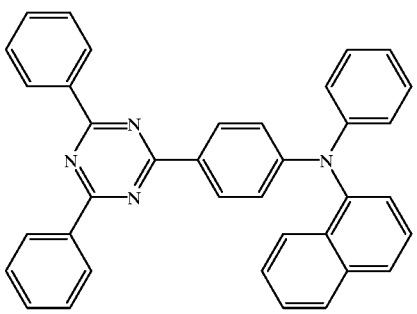
311.
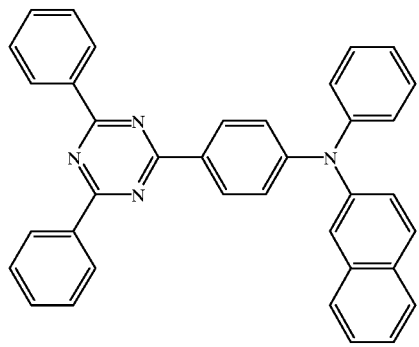
312.
313.
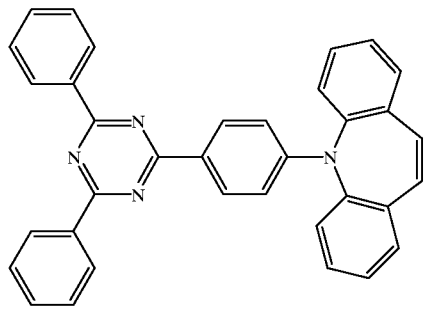
314.
315.
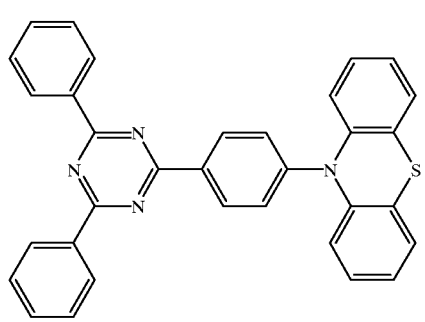
316.
317.
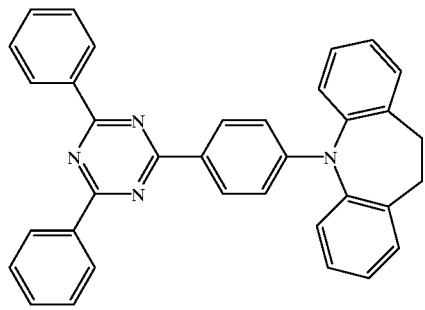
318.
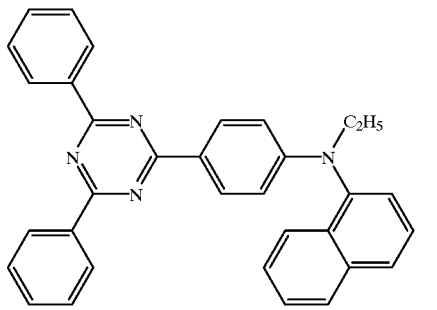

-continued
319.
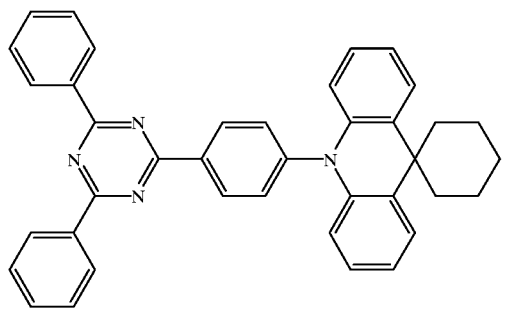
320.
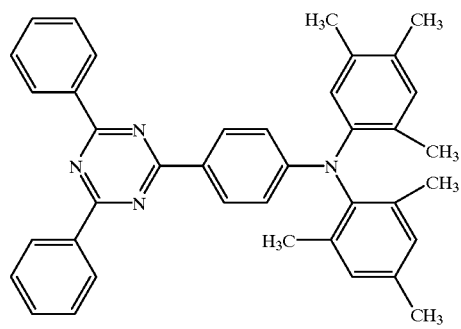
321.
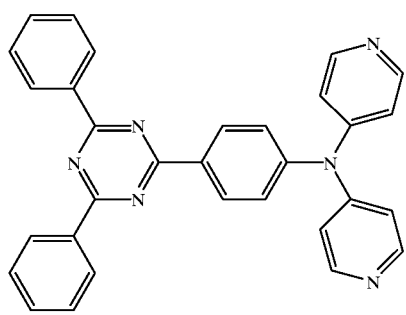
322.
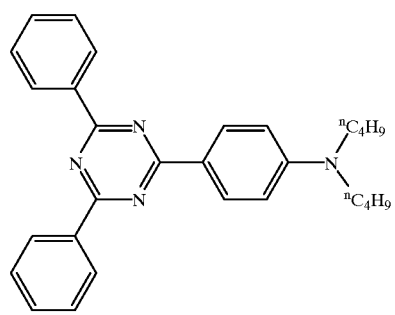
323.
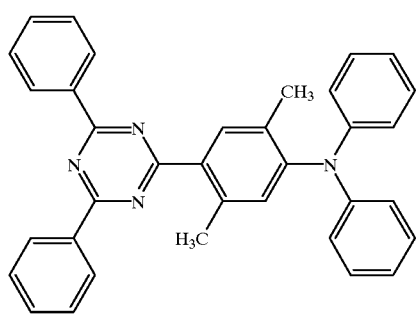
324.
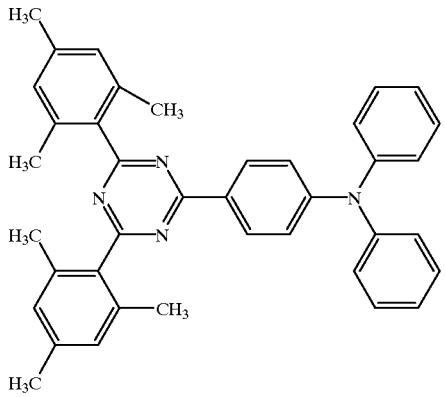
325.
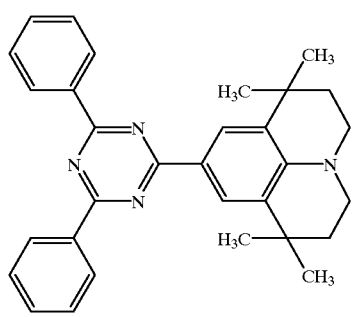
326.
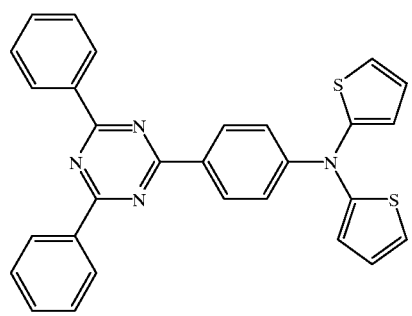

-continued
327.
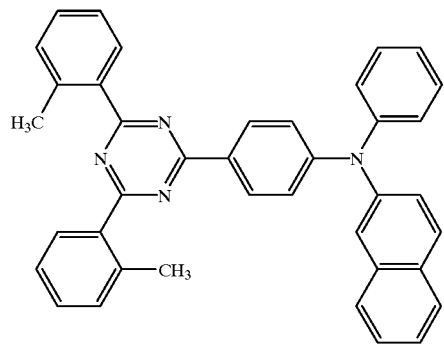
328.
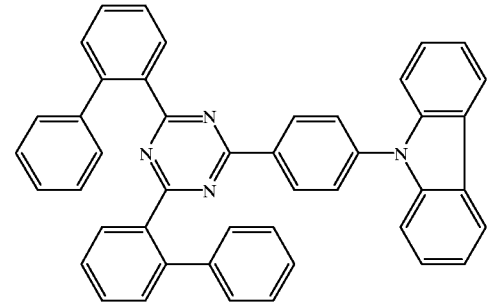
329.
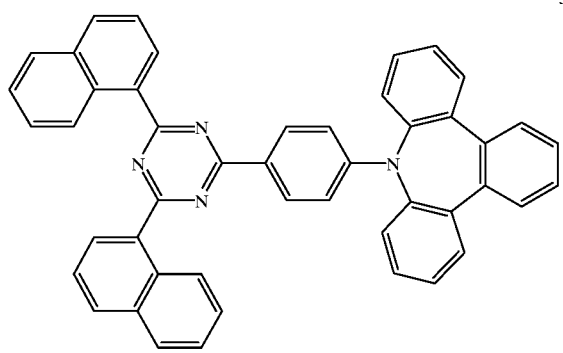
330.
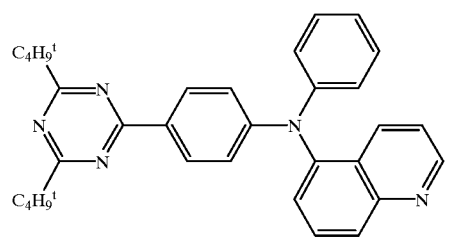
331.
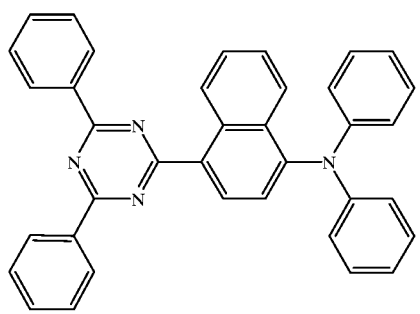
332.
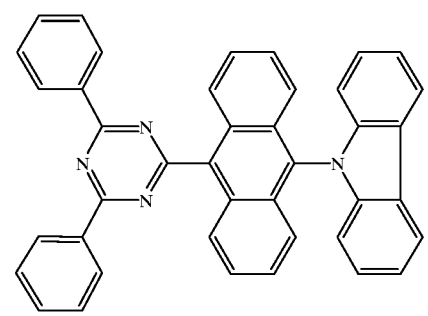
333.
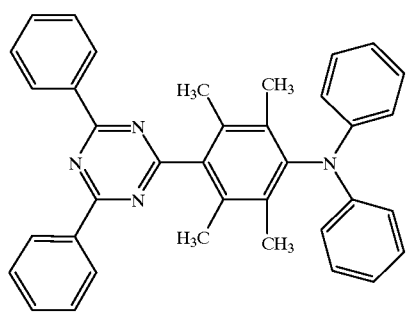
334.
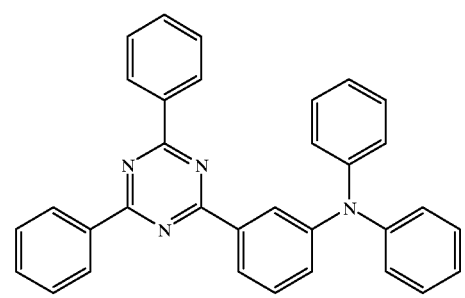

-continued
335.
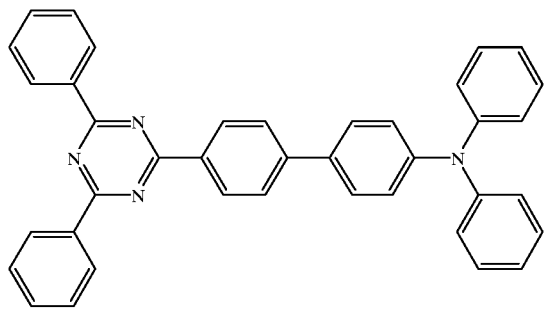
336.
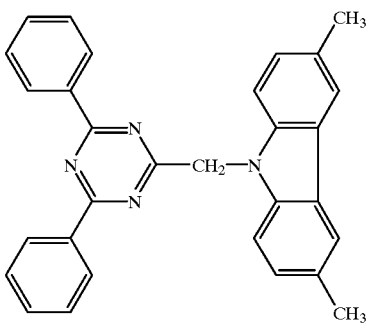
337.
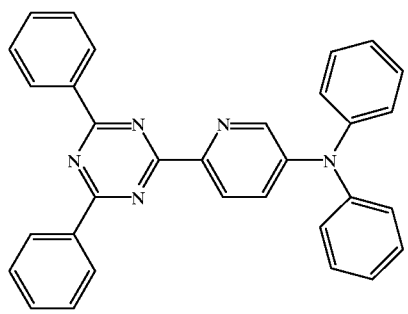
338.
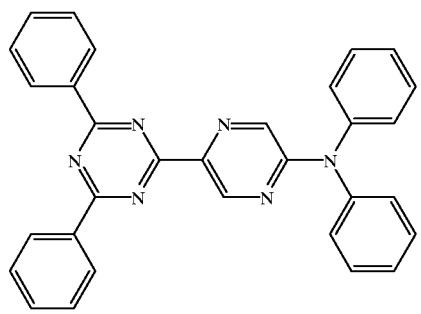
339.
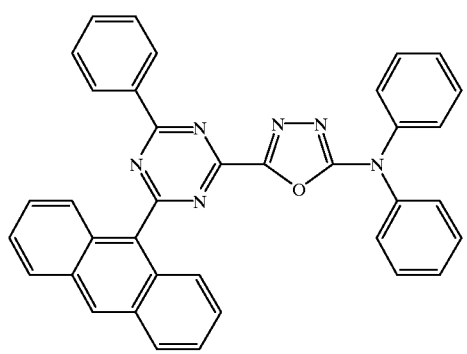
340.
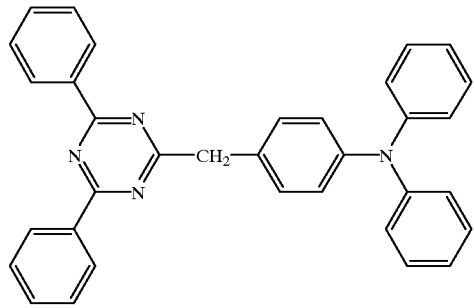
341.
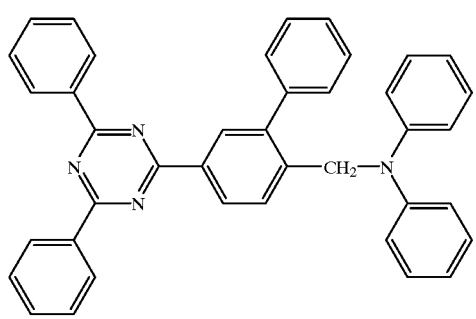
342.
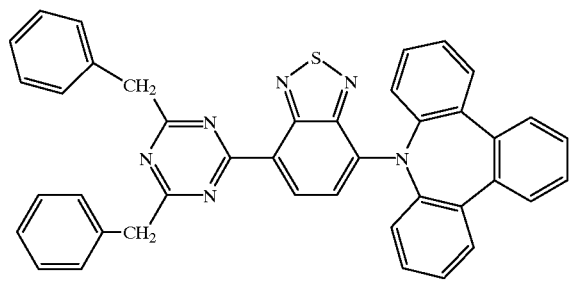

-continued
343.
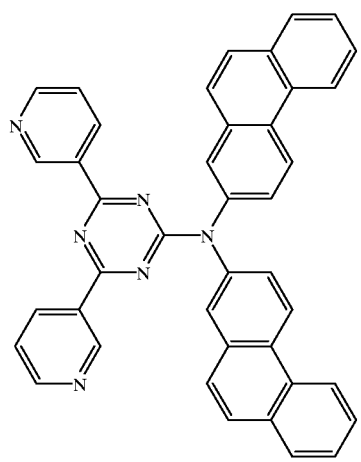
344.
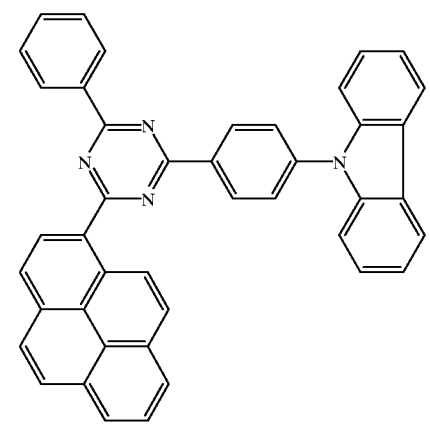
345.
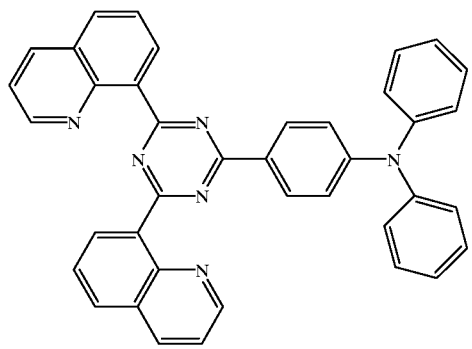
346.
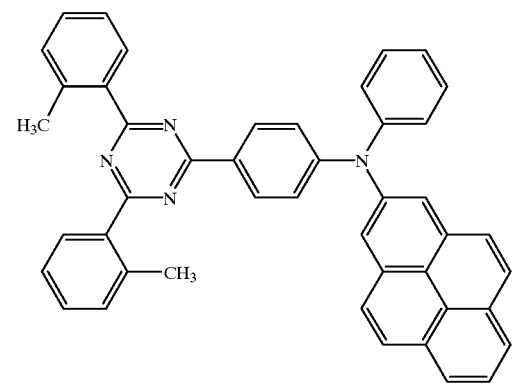
347.
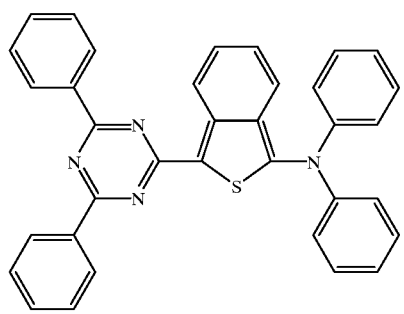
348.
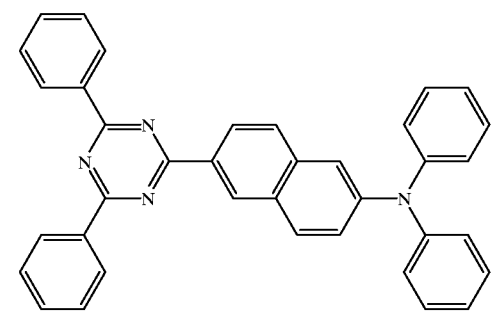
349.
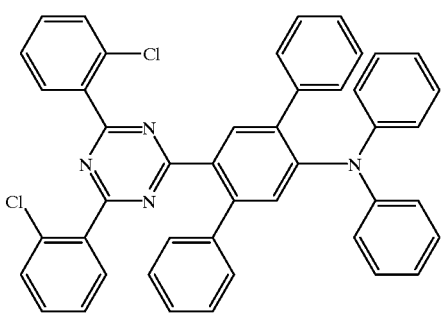
350.
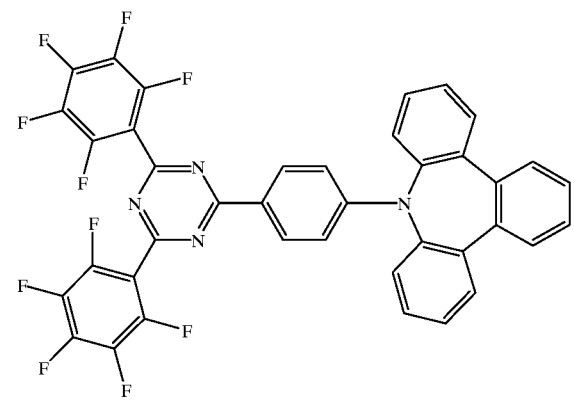

351.
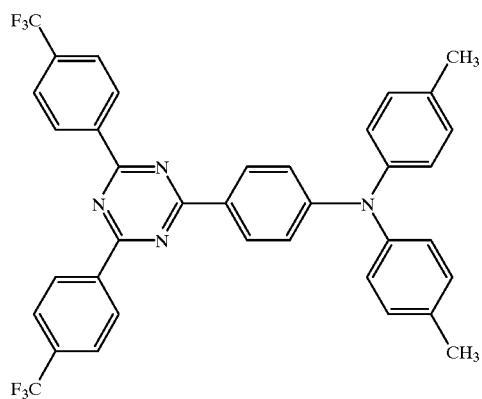
352.
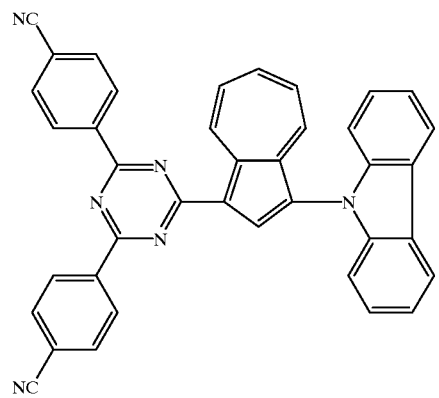
353.
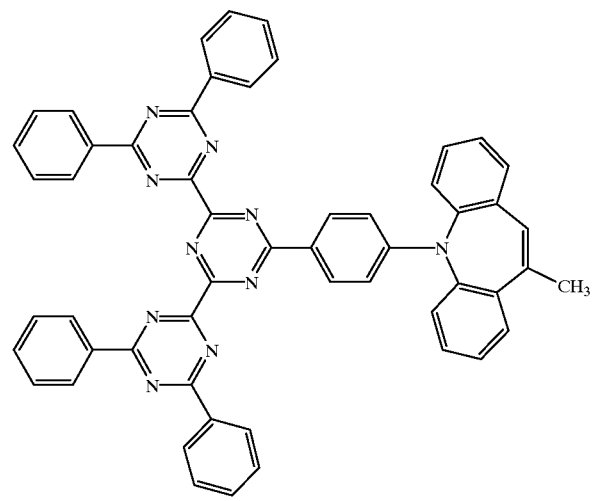
354.
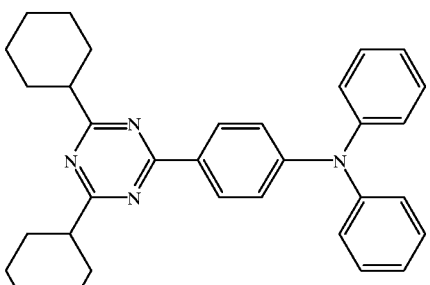
355.
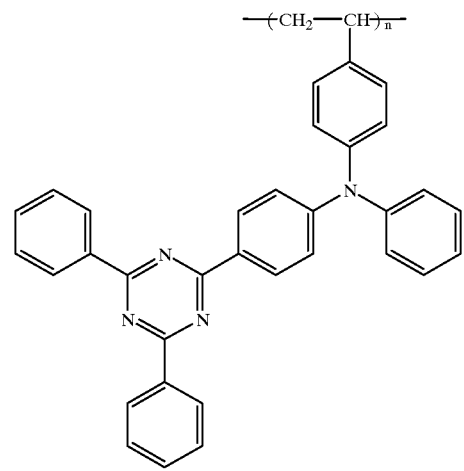
Mw: 24,000
(on polystyrene conversion)
356.
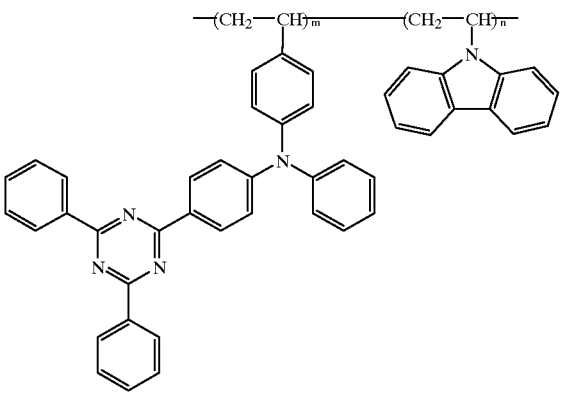
Mw: 18,000
(on polystyrene conversion)
m:n = 1:50 (by weight)

-continued
357.
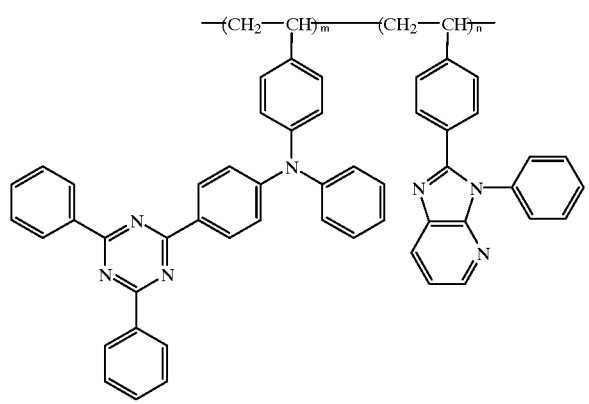
Mw: 22,000
(on polystyrene conversion)
m:n = 1:50 (by weight)
358.
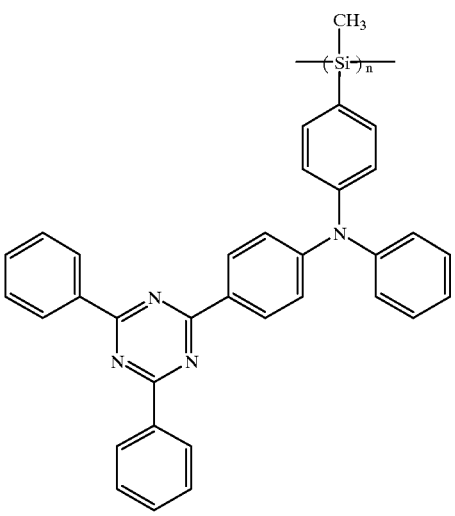
Mw: 5,000
(on polystyrene conversion)
359.
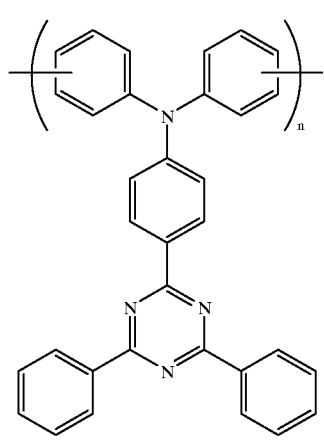
Mw: 10,000
(on polystyrene conversion)
360.
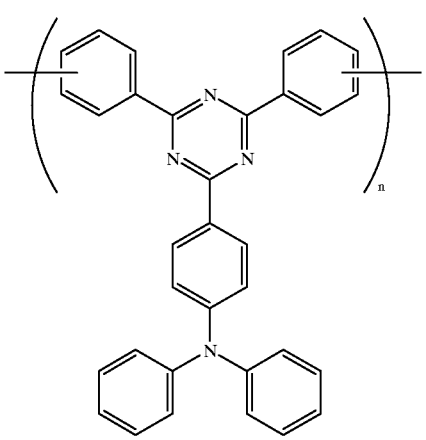
Mw: 8,000
(on polystyrene conversion)
361.
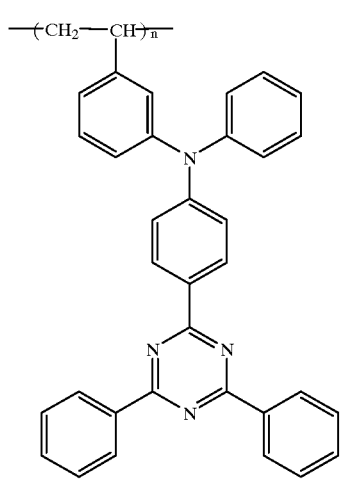
Mw: 15,000
(on polystyrene conversion)
362.
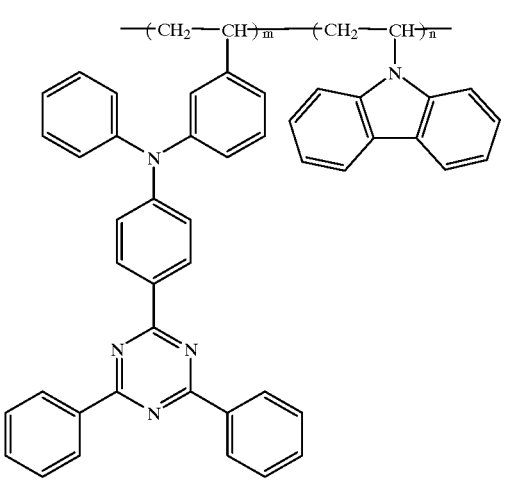
Mw: 18,000
(on polystyrene conversion)
m:n = 1:50 (by weight)

-continued
363.
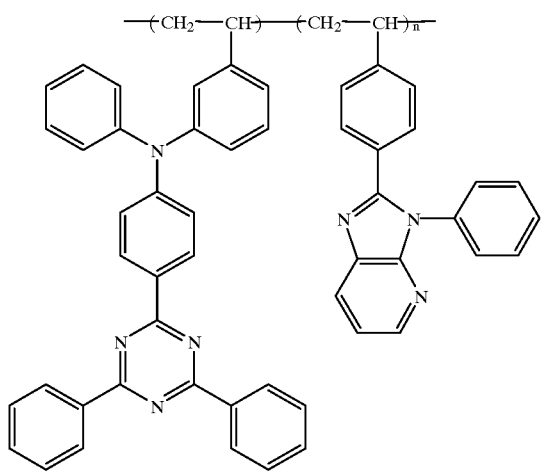
Mw: 20,000
(on polystyrene conversion)
m:n = 1:50 (by weight)
364.
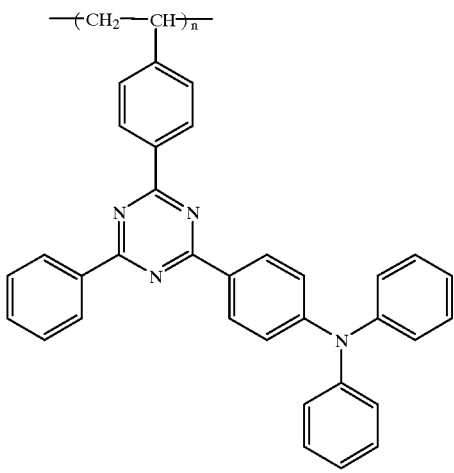
Mw: 21,000
(on polystyrene conversion)
365.
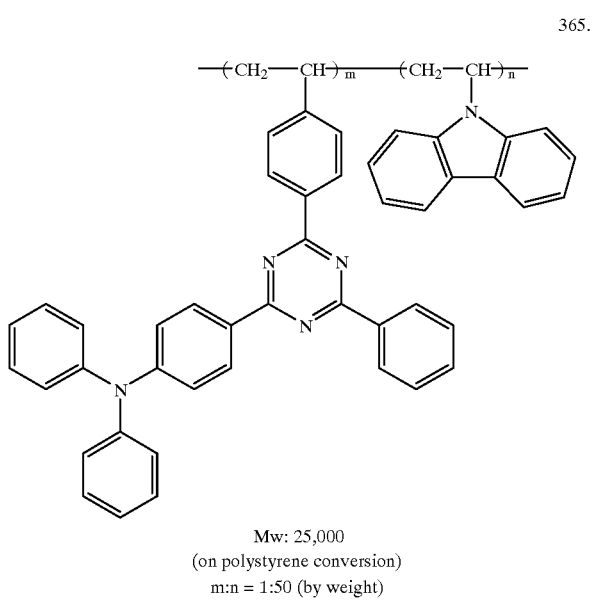
Mw: 25,000
(on polystyrene conversion)
m:n = 1:50 (by weight)
366.
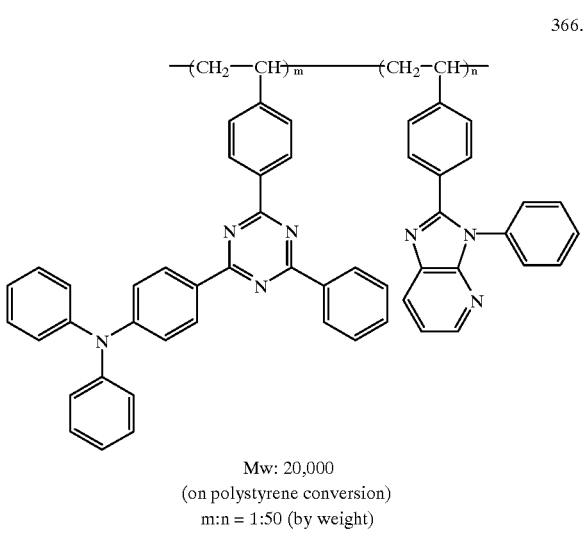
Mw: 20,000
(on polystyrene conversion)
m:n = 1:50 (by weight)
367.
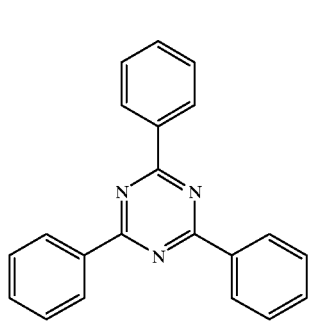
368.
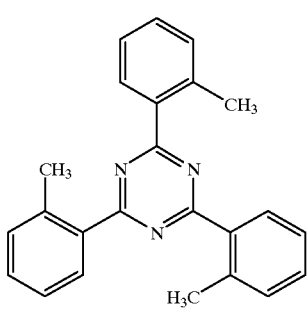

-continued
369.
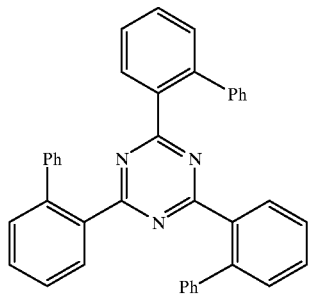
370.
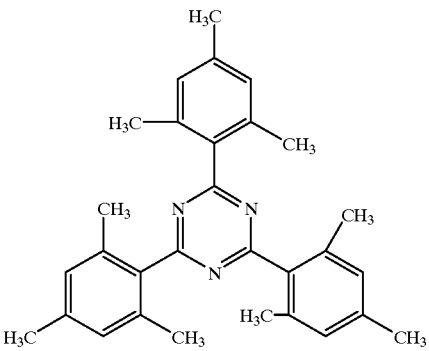
371.
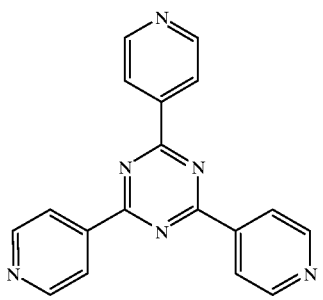
372.
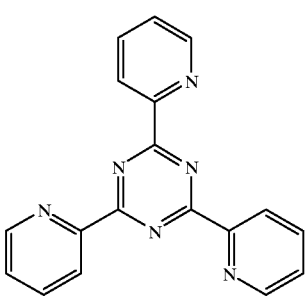
373.
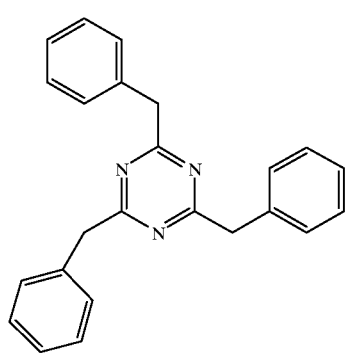
374.
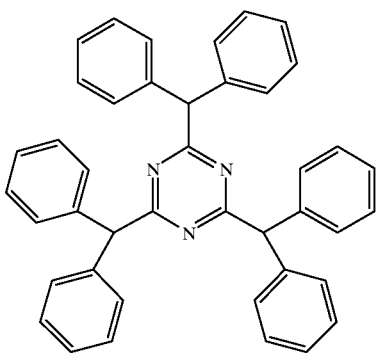
375.
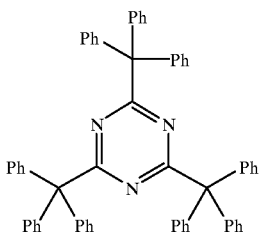
376.
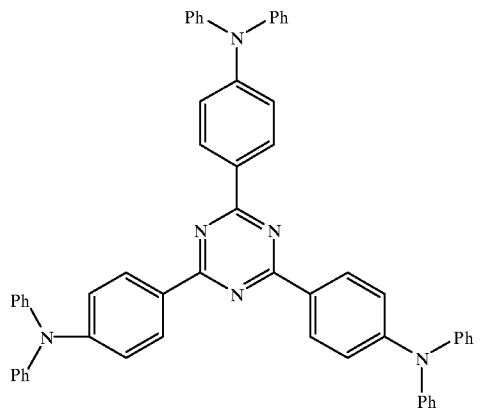

377.
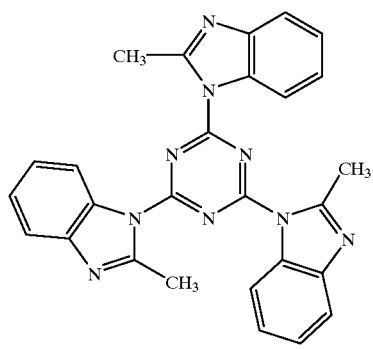

378.
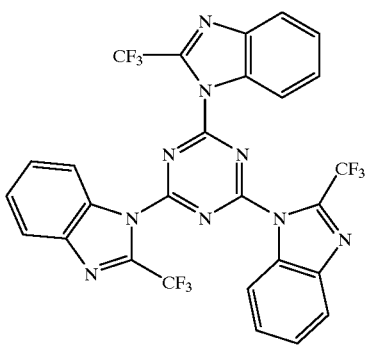

379.
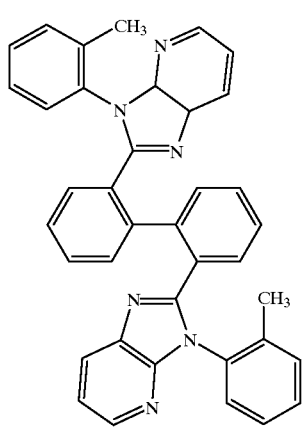

380.
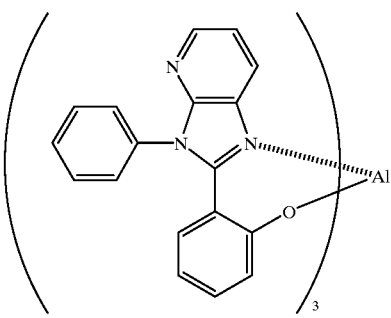

381.
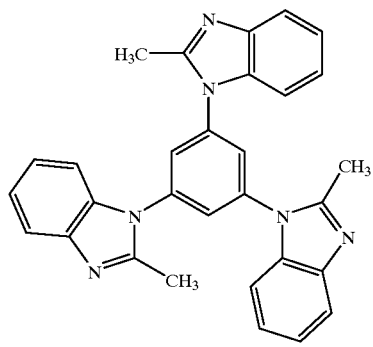

The compounds represented by formula (I) are synthesized by referring to known processes disclosed, e.g., in JP-B-44-23025, JP-B-48-8842, JP-A-53-6331, JP-A-10-92578, U.S. Pat. Nos. 3,449,255 and 5,766,779, *J. Am. Chem. Soc.*, vol. 94, p. 2414 (1972), *Helv. Chim. Acta.*, vol. 63, p. 413 (1980), and *Liebigs Ann. Chem.*, p. 1423 (1982).

Where the present invention is applied to production of light-emitting devices by a coating method which is less expensive and more suited to provide a large working area than dry film forming techniques, it is preferable for the organic layer to contain a polymer having a weight average molecular weight of 1,000 to 5,000,000, preferably 5,000 to 2,000,000, still preferably 10,000 to 1,000,000, and having at least one of an electron injecting and transporting function, a hole injecting and transporting function, a charge recombining function, a function to efficiently transfer exciting energy to the light-emitting material, and a light emitting function or having no such a function but is capable of dispersing materials having these functions and forming a film. Such polymers include polyvinylcarbazole, polyarylenevinylene, polycarbonate, and polymethyl methacrylate.

Synthesis Examples of the compounds represented by formula (I) are given below.

SYNTHESIS EXAMPLE 1

Synthesis of Compound 230

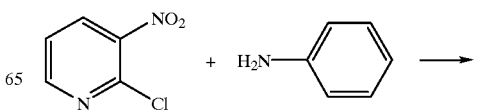

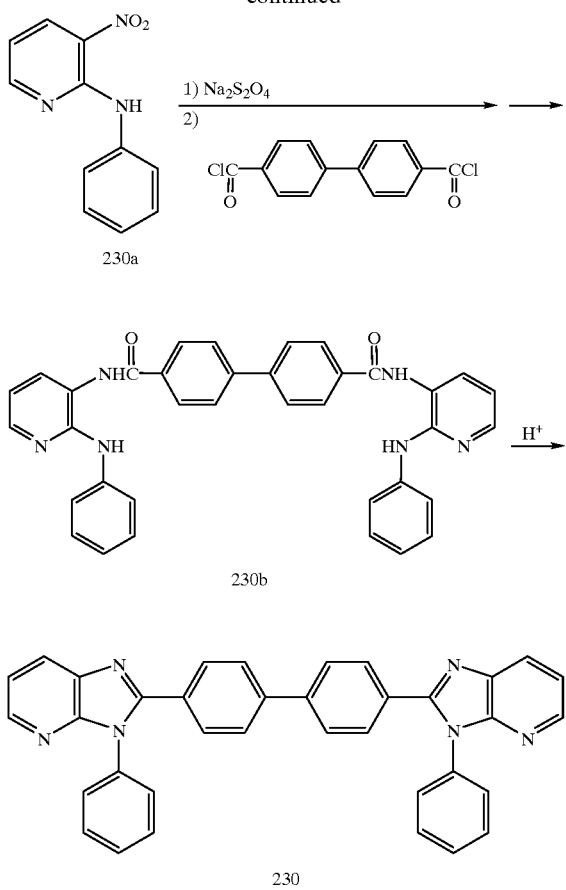

1-1. Synthesis of Compound 230a

A mixture of 50.8 g (0.320 mol) of 2-chloro-3-nitropyridine, 90.8 g (0.657 mol) of potassium carbonate, 7.90 g (0.0416 mol) of copper (I) iodide, and 300 ml of toluene was stirred at room temperature in a nitrogen atmosphere, and 45.7 g (0.490 mol) of aniline was added thereto while stirring. The mixture was heated under reflux for 5 hours, followed by filtration. The filtrate was concentrated under reduced pressure and purified by silica gel column chromatography (developing solvent: chloroform), followed by recrystallization from chloroform/hexane to give 45.7 g (0.21 mol) of compound 230a in a yield of 66%.

1-2. Synthesis of Compound 230b

In 170 ml of tetrahydrofuran was dissolved 17.0 g (0.0790 mol) of compound 230a. While the solution was stirred at room temperature in a nitrogen atmosphere, a solution of 69.0 g (0.396 mol) of sodium hydrosulfite in 220 ml of water was added thereto dropwise. After the mixture was stirred for 1 hour, 170 ml of ethyl acetate was added thereto, and a solution of 13.6 g (0.162 mol) of sodium hydrogencarbonate in 140 ml of water was then added thereto dropwise. A solution of 10.0 g (0.0358 mol) of 4,4'-biphenyldicarbonyl chloride in 100 ml of ethyl acetate was added thereto dropwise, followed by stirring at room temperature for 5 hours. The precipitated solid was collected by filtration and washed successively with water and ethyl acetate to give 16.0 g (0.0277 mol) of compound 230b (yield: 77%).

1-3. Synthesis of Compound 230

A mixture of 10.0 g (0.0173 mol) of compound 230b, 2.3 g (0.0121 mol) of p-toluenesulfonic acid monohydrate, and 300 ml of xylene was heated under reflux in a nitrogen atmosphere for 6 hours while azeotropically removing produced water. The reaction mixture was cooled to room temperature, and the precipitated solid was collected by filtration and recrystallized from dimethylformamide/acetonitrile to yield 5.20 g (9.62 mol) of compound 230 in a yield of 57%.

Melting point: 298–300° C.

SYNTHESIS EXAMPLE 2

Synthesis of Compound 246

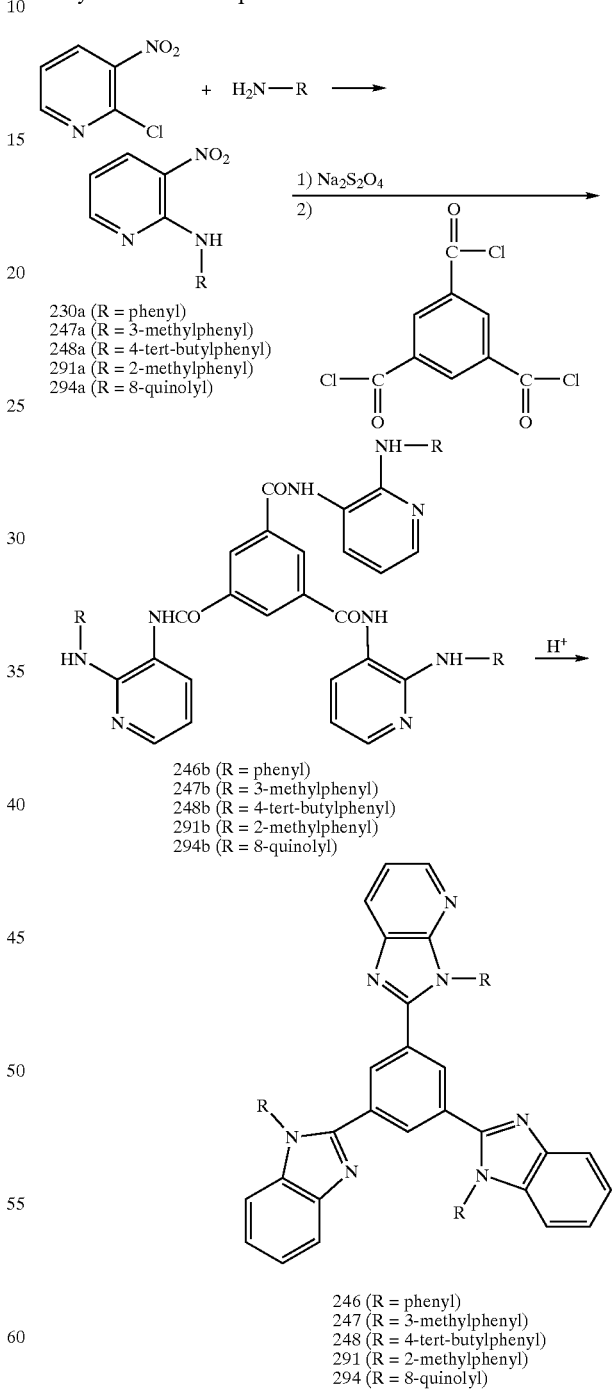

2-1. Synthesis of Compound 246b

In 150 ml of tetrahydrofuran was dissolved 15.0 g (0.0697 mol) of compound 230a. While the solution was stirred at room temperature in a nitrogen atmosphere, a solution of 60.9 g (0.345 mol) of sodium hydrosulfite in 200 ml of water was added thereto dropwise. After stirring for 2 hours, 150 ml of ethyl acetate was added, and a solution of 12.0 g (0.143 mol) of sodium hydrogencarbonate in 120 ml of water was then added dropwise. A solution of 5.2 g (0.0196 mol) of trimesic acid chloride in 50 ml of ethyl acetate was added thereto dropwise, followed by stirring at room temperature for 3 hours. A saturated aqueous solution of sodium chloride was added to the reaction mixture, and the mixture was extracted with ethyl acetate. The organic layer was washed with a saturated sodium chloride aqueous solution and dried over anhydrous magnesium sulfate. The solvent was evaporated under reduced pressure, and the residue was purified by silica gel column chromatography (developing solvent: chloroform/methanol=10/1 by volume) and recrystallized from dimethylformamide/acetonitrile to yield 4.1 g (5.76 mmol) of compound 246b (yield: 29%).

2-2. Synthesis of Compound 246

A mixture of 3.70 g (5.20 mmol) of compound 246b, 0.7 g (3.68 mmol) of p-toluenesulfonic acid monohydrate, and 100 ml of xylene was heated under reflux in a nitrogen atmosphere for 3 hours while azeotropically removing produced water. The reaction mixture was cooled to room temperature, and the solvent was evaporated under reduced pressure. The residue was purified by silica gel column chromatography (developing solvent: chloroform/methanol=20/1 by volume) and recrystallized from chloroform/methanol to afford 1.70 g (2.58 mmol) of compound 246 in a yield of 50%.

Melting point: 279–281° C.

SYNTHESIS EXAMPLE 3

Synthesis of Compound 247

3-1. Synthesis of Compound 247a

A mixture of 50.0 g (0.315 mol) of 2-chloro-3-nitropyridine, 90.8 g (0.657 mol) of potassium carbonate, 7.90 g (0.0416 mol) of copper (I) iodide, and 300 ml of toluene was stirred at room temperature in a nitrogen atmosphere, and 45.0 g (0.420 mol) of m-toluidine was added thereto while stirring. The mixture was heated under reflux for 8 hours and filtered. The filtrate was concentrated under reduced pressure, and the residue was purified by silica gel column chromatography (developing solvent: chloroform), followed by recrystallization from chloroform/hexane to give 51.0 g (0.222 mol) of compound 247a in a yield of 71%.

3-2. Synthesis of Compound 247b

In 320 ml of tetrahydrofuran was dissolved 32.5 g (0.142 mol) of compound 247a. While the solution was stirred at room temperature in a nitrogen atmosphere, a solution of 124 g (0.712 mol) of sodium hydrosulfite in 320 ml of water was added thereto dropwise, and 100 ml of methanol was then added thereto. After the mixture was stirred for 1 hour, 380 ml of ethyl acetate was added, and a solution of 24.4 g (0.290 mol) of sodium hydrogencarbonate in 55 ml of water was added dropwise. To the mixture was further added dropwise a solution of 10.5 g (0.0396 mol) of trimesic acid chloride in 100 ml of ethyl acetate, followed by stirring at room temperature for 3 hours. A saturated aqueous solution of sodium chloride was added to the reaction mixture, and the mixture was extracted with ethyl acetate. The organic layer was washed with a saturated aqueous solution of sodium chloride and dried over anhydrous magnesium sulfate. The solvent was evaporated under reduced pressure, and the residue was purified by silica gel column chromatography (developing solution: chloroform/methanol=10/1 by volume) to furnish 10.2 g (0.0135 mol) of compound 247b (yield: 34%).

3-3. Synthesis of Compound 247

A mixture of 3.30 g (4.38 mmol) of compound 247b, 0.5 g (2.63 mmol) of p-toluenesulfonic acid monohydrate, and 50 ml of xylene was heated under reflux for 3 hours in a nitrogen atmosphere while azeotropically removing produced water. The reaction mixture was cooled to room temperature, and the solvent was removed by evaporation under reduced pressure. The residue was purified by silica gel column chromatography (developing solvent: chloroform/methanol=20/1 by volume) and recrystallized from chloroform/methanol to give 1.97 g (2.81 mmol) of compound 247 (yield: 64%).

Melting point: 258–259° C.

SYNTHESIS EXAMPLE 4

Synthesis of Compound 248

4-1. Synthesis of Compound 248a

A mixture of 45.5 g (0.286 mol) of 2-chloro-3-nitropyridine, 81.1 g (0.587 mol) of potassium carbonate, 7.10 g (0.0373 mol) of copper (I) iodide, and 300 ml of toluene was stirred at room temperature in a nitrogen atmosphere, and 40.0 g (0.268 mol) of 4-t-butylaniline was added thereto while stirring. The mixture was heated under reflux for 8 hours and filtered. The filtrate was concentrated under reduced pressure, and the residue was purified by silica gel column chromatography (developing solvent: chloroform), followed by recrystallization from chloroform/hexane to furnish 52.0 g (0.192 mol) of compound 248a in a yield of 72%.

4-2. Synthesis of Compound 248b

In 350 ml of tetrahydrofuran was dissolved 34.8 g (0.128 mol) of compound 248a. While the solution was stirred at room temperature in a nitrogen atmosphere, a solution of 112 g (0.643 mol) of sodium hydrosulfite in 320 ml of water was added thereto dropwise, and 90 ml of methanol was then added thereto. After the mixture was stirred for 1 hour, 350 ml of ethyl acetate was added, and a solution of 22.0 g (0.262 mol) of sodium hydrogencarbonate in 50 ml of water was added dropwise. To the mixture was further added dropwise a solution of 9.5 g (0.0358 mol) of trimesic acid chloride in 90 ml of ethyl acetate, followed by stirring at room temperature for 2 hours. A saturated aqueous solution of sodium chloride was added to the reaction mixture, and the mixture was extracted with ethyl acetate. The organic layer was washed with a saturated aqueous solution of sodium chloride and dried over anhydrous magnesium sulfate. The solvent was evaporated under reduced pressure, and the residue was purified by silica gel column chromatography (developing solution: chloroform/methanol=10/1 by volume) to give 12.0 g (0.0136 mol) of compound 248b (yield: 38%).

4-3. Synthesis of Compound 248

A mixture of 3.00 g (3.41 mmol) of compound 248b, 0.3 g (1.58 mmol) of p-toluenesulfonic acid monohydrate, and 50 ml of xylene was heated under reflux for 3 hours in a nitrogen atmosphere while azeotropically removing produced water. The reaction mixture was cooled to room temperature, and the precipitate was collected by filtration and recrystallized from chloroform/methanol to afford 2.06 g (2.49 mmol) of compound 248 in a yield of 73%.

Melting point: 300° C. or higher

SYNTHESIS EXAMPLE 5

Synthesis of Compound 291

5-1. Synthesis of Compound 291a

A mixture of 50.0 g (0.315 mol) of 2-chloro-3-nitropyridine, 90.8 g (0.657 mol) of potassium carbonate, 7.90 g (0.0416 mol) of copper (I) iodide, and 300 ml of toluene was stirred at room temperature in a nitrogen atmosphere, and 45.0 g (0.420 mol) of o-toluidine was added thereto while stirring. The mixture was heated under reflux for 8 hours and filtered. The filtrate was concentrated under reduced pressure, and the residue was purified by silica gel column chromatography (developing solvent: chloroform). Recrystallization from chloroform/hexane gave 46.3 g (0.202 mol) of compound 291a (yield: 64%).

5-2. Synthesis of Compound 291b

In 320 ml of tetrahydrofuran was dissolved 32.5 g (0.142 mol) of compound 291a. While the solution was stirred at room temperature in a nitrogen atmosphere, a solution of 124 g (0.712 mol) of sodium hydrosulfite in 320 ml of water was added thereto dropwise, and 100 ml of methanol was then added thereto. After the mixture was stirred for 1 hour, 380 ml of ethyl acetate was added, and a solution of 24.4 g (0.290 mol) of sodium hydrogencarbonate in 55 ml of water was added dropwise. To the mixture was further added dropwise a solution of 10.5 g (0.0396 mol) of trimesic acid chloride in 100 ml of ethyl acetate, followed by stirring at room temperature for 3 hours. A saturated aqueous solution of sodium chloride was added to the reaction mixture, and the mixture was extracted with ethyl acetate. The organic layer was washed with a saturated aqueous solution of sodium chloride and dried over anhydrous magnesium sulfate. The solvent was evaporated under reduced pressure, and the residue was purified by silica gel column chromatography (developing solution: chloroform/methanol=10/1 by volume) to furnish 8.5 g (0.0112 mol) of compound 291b (yield: 28%).

5-3. Synthesis of Compound 291

A mixture of 3.30 g (4.38 mmol) of compound 291b, 0.5 g (2.63 mmol) of p-toluenesulfonic acid monohydrate, and 50 ml of xylene was heated under reflux for 7 hours in a nitrogen atmosphere while azeotropically removing produced water. The reaction mixture was cooled to room temperature, and the solvent was evaporated under reduced pressure. The residue was purified by silica gel column chromatography (developing solvent: chloroform/methanol=20/1 by volume). Recrystallization from chloroform/acetonitrile afforded 2.02 g (2.88 mmol) of compound 291 in a yield of 66%.

Melting point: 250° C.

SYNTHESIS EXAMPLE 6

Synthesis of Compound 294

6-1. Synthesis of Compound 294a

A mixture of 59.0 g (0.347 mol) of 2-chloro-3-nitropyridine, 105 g (0.760 mol) of potassium carbonate, 9.40 g (0.0494 mol) of copper (I) iodide, and 300 ml of toluene was stirred at room temperature in a nitrogen atmosphere, and 75.0 g (0.520 mol) of 8-aminoquinoline was added thereto while stirring. The mixture was heated under reflux for 16 hours and filtered. The filtrate was concentrated under reduced pressure, and the residue was purified by silica gel column chromatography (developing solvent: chloroform). Recrystallization from chloroform/hexane furnished 27.0 g (0.102 mol) of compound 294a (yield: 29%).

6-2. Synthesis of Compound 294b

In 220 ml of tetrahydrofuran was dissolved 25.0 g (93.9 mmol) of compound 294a. While the solution was stirred at room temperature in a nitrogen atmosphere, a solution of 82.2 g (0.472 mol) of sodium hydrosulfite in 420 ml of water was added thereto dropwise, and 70 ml of methanol was then added thereto. After the mixture was stirred for 1 hour, 380 ml of ethyl acetate was added, and a solution of 24.4 g (0.290 mol) of sodium hydrogencarbonate in 55 ml of water was added dropwise. To the mixture was further added dropwise a solution of 7.55 g (28.4 mmol) of trimesic acid chloride in 100 ml of ethyl acetate, followed by stirring at room temperature for 3 hours. A saturated aqueous solution of sodium chloride was added to the reaction mixture, and the mixture was extracted with ethyl acetate. The organic layer was washed with a saturated aqueous solution of sodium chloride and dried over anhydrous magnesium sulfate. The solvent was evaporated under reduced pressure, and the residue was purified by silica gel column chromatography (developing solution: chloroform/methanol=10/1 by volume) to yield 7.86 g (9.09 mmol) of compound 294b (yield: 32%).

6-3. Synthesis of Compound 294

A mixture of 5.00 g (5.78 mmol) of compound 294b, 0.5 g (2.63 mmol) of p-toluenesulfonic acid monohydrate, and 100 ml of xylene was heated under reflux for 5 hours in a nitrogen atmosphere while azeotropically removing produced water. The reaction mixture was cooled to room temperature, and the solvent was evaporated under reduced pressure. The residue was purified by silica gel column chromatography (developing solvent: chloroform/methanol=20/1 by volume) Recrystallization from chloroform/acetonitrile gave 1.87 g (2.31 mmol) of compound 294 in a yield of 40%.

Melting point: 384° C.

SYNTHESIS EXAMPLE 7

Synthesis of Compound 177

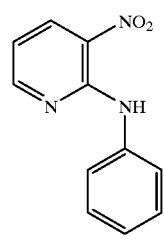

230a

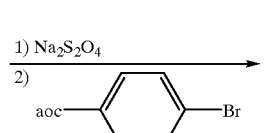

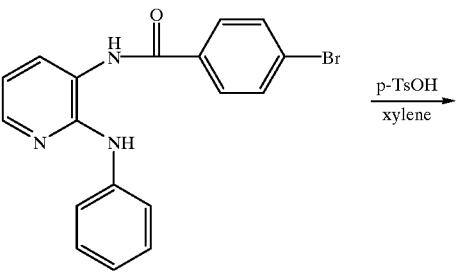

177a

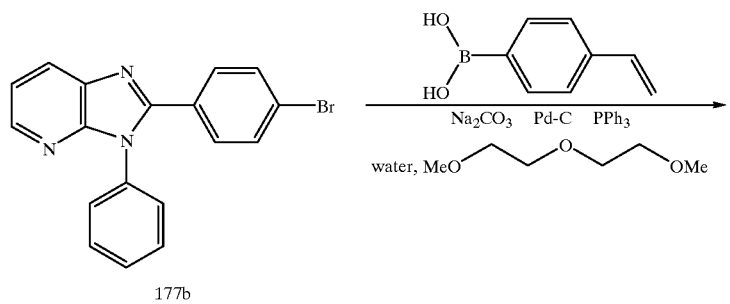

177b

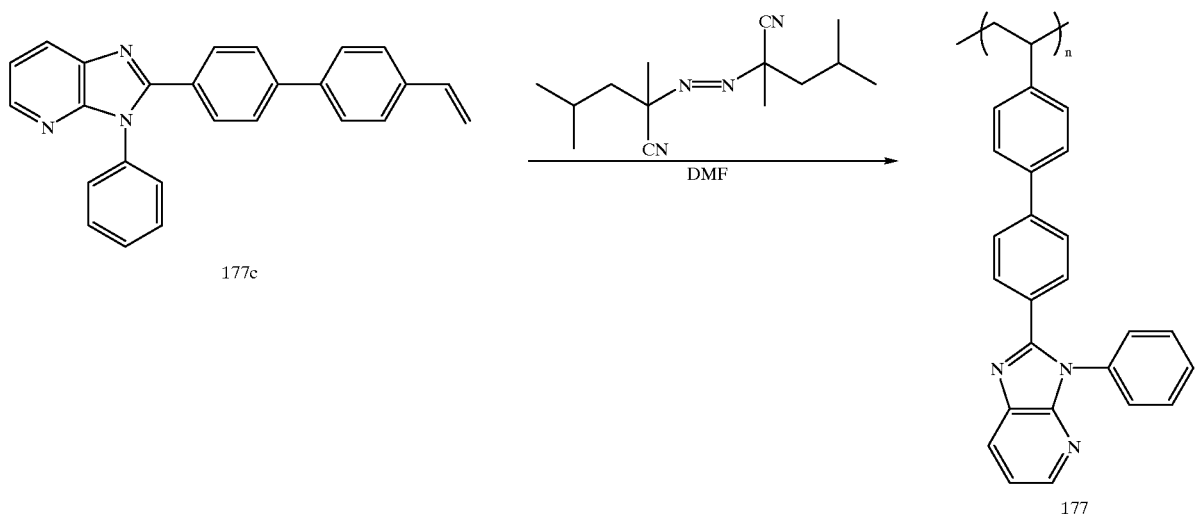

177

7-1. Synthesis of Compound 177a

In 500 ml of tetrahydrofuran was dissolved 50.0 g (0.232 mol) of compound 230a. While the solution was stirred at room temperature in a nitrogen atmosphere, a solution of 200 g (1.149 mol) of sodium hydrosulfite in 700 ml of water was added thereto dropwise, and 50 ml of methanol was then added thereto. After the mixture was stirred for 1 hour, 500 ml of ethyl acetate was added, and a solution of 40 g (0.476 mol) of sodium hydrogencarbonate in 400 ml of water was added thereto. To the mixture was further added dropwise a solution of 61 g (0.232 mol) of 4-bromobenzoyl chloride in 170 ml of ethyl acetate, followed by stirring at room temperature for 5 hours. The reaction mixture was extracted with ethyl acetate, and the extract was washed successively with water and a saturated aqueous solution of sodium chloride and dried over anhydrous magnesium sulfate. The solvent was evaporated under reduced pressure, and the residue was purified by silica gel column chromatography (developing solution: chloroform) to give 58.9 g (0.16 mol) of compound 177a (yield: 69%).

7-2. Synthesis of Compound 177b

In 1 liter of xylene was dissolved 59.5 g (0.16 mol) of compound 177a, and 9.5 g (0.05 mol) of p-toluenesulfonic acid monohydrate was added to the solution. The mixture was heated under reflux for 5 hours in a nitrogen atmosphere while azeotropically removing water. The reaction mixture was cooled to room temperature, and the precipitated solid was collected by filtration and recrystallized from ethanol/chloroform to afford 42.8 g (0.12 mol) of compound 177b (yield: 76%).

7-3. Synthesis of Compound 177c

To a mixture of 4.73 g (13.52 mmol) of compound 177b and 2.0 g (13.52 mmol) of 4-vinylphenylboronic acid were added 100 ml of diethylene glycol dimethyl ether and 50 ml of water, followed by vigorous stirring. To the reaction mixture were added 2.9 g (27.04 mmol) of sodium carbonate, 150 mg of palladium supported on carbon, and 120 mg of triphenylphosphine, followed by heat-refluxing for 5 hours. The reaction mixture was cooled to room temperature, and any insoluble matter was removed by filtration. The filtrate was extracted with ethyl acetate. The organic layer was washed successively with water and a saturated aqueous solution of sodium chloride and dried over anhydrous magnesium sulfate. The solvent was evaporated off, and the residue was recrystallized from chloroform/hexane to obtain 1.0 g (2.68 mmol) of compound 177a (yield: 20%).

7-4. Synthesis of Compound 177

In 7 ml of dimethylformamide was dissolved 175 mg (2.0 mmol) of compound 177c, and 5.8 mg of 2,2'-azobis(2,4-dimethylvaleronitrile) (available from Wako Pure Chemical Industries, Ltd.) was added thereto. The mixture was heated at 70° C. for 8 hours while stirring. After cooling to room temperature, the reaction product was re-precipitated from acetone to give 100 mg of compound 177, which had a weight average molecular weight of 70,000 and a number average molecular weight of 20,000 on polystyrene conversion.

SYNTHESIS EXAMPLE 8

Synthesis of compound 285

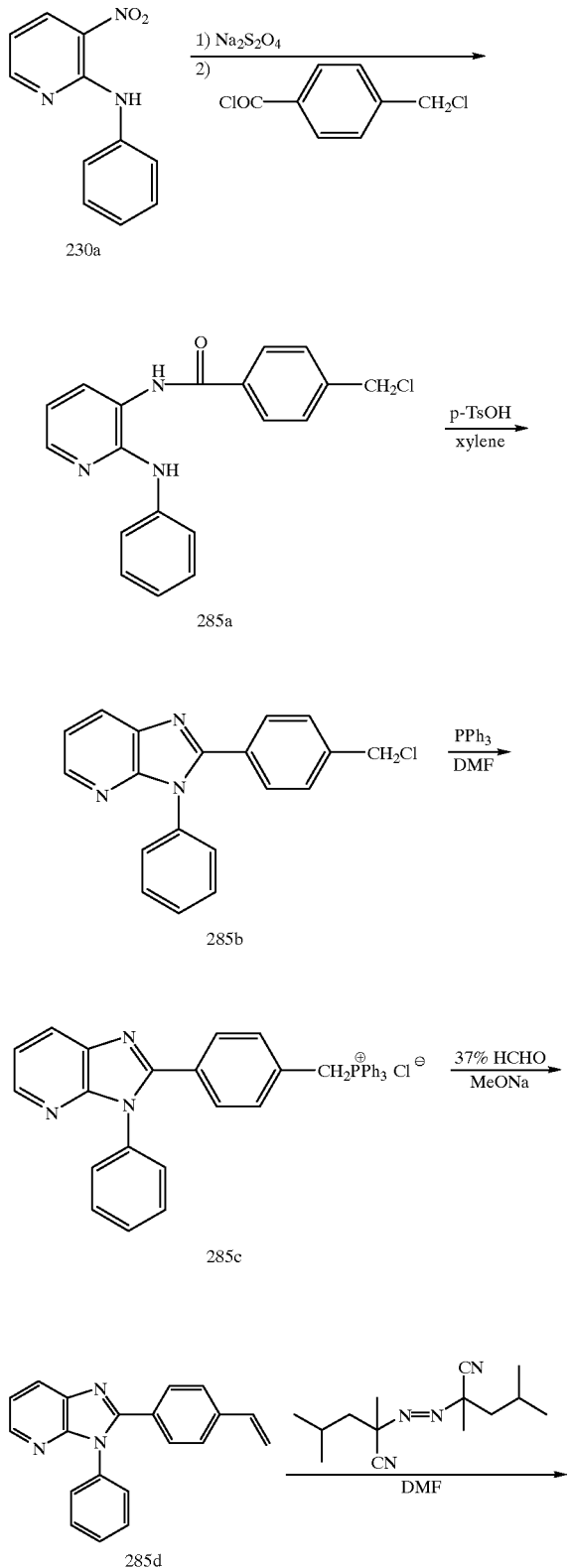

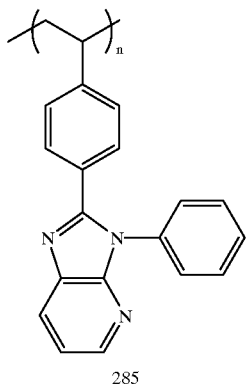

8-1. Synthesis of Compound 285a

In 500 ml of tetrahydrofuran was dissolved 50.0 g (0.232 mol) of compound 230a. While the solution was stirred at room temperature in a nitrogen atmosphere, a solution of 202 g (1.149 mol) of sodium hydrosulfite in 700 ml of water was added thereto dropwise, and 50 ml of methanol was then added thereto. After the mixture was stirred for 1 hour, 500 ml of ethyl acetate was added, and a solution of 39 g (0.464 mol) of sodium hydrogen carbonate in 400 ml of water was added thereto. To the mixture was further added dropwise a solution of 44 g (0.232 mol) of 4-chloromethylbenzoyl chloride in 170 ml of ethyl acetate, followed by stirring at room temperature for 5 hours. The reaction mixture was extracted with ethyl acetate, and the extract was washed successively with water and a saturated aqueous solution of sodium chloride and dried over anhydrous magnesium sulfate. The solvent was evaporated under reduced pressure, and the residue was purified by silica gel column chromatography (developing solution: chloroform) to give 38.5 g (0.113 mol) of compound 285a (yield: 49%).

8-2. Synthesis of Compound 285b

In 450 ml of xylene was dissolved 35 g (0.104 mol) of compound 285a, and 6.5 g (0.034 mol) of p-toluenesulfonic acid monohydrate was added to the solution. The mixture was heated under reflux for 2 hours in a nitrogen atmosphere while azeotropically removing water. The reaction mixture was cooled to room temperature, and the precipitated solid was collected by filtration and recrystallized from ethanol/chloroform to afford 19.95 g (0.0624 mol) of compound 285b (yield: 60%).

8-3. Synthesis of Compound 285c

In 300 ml of dimethylformamide were dissolved 16 g (0.050 mol) of compound 285b and 26.2 g (0.100 mol) of triphenylphosphine, and the solution was heated under reflux for 4 hours. Upon cooling to room temperature, white crystals were precipitated, which were collected by filtration under reduced pressure and repeatedly washed with diethyl ether to give 18.92 g (0.033 mol) of compound 285c (yield: 65%).

8-4. Synthesis of Compound 285d

To 5.8 g (9.96 mmol) of compound 285c were added 40 ml of methanol and 6 ml of a 37% formaldehyde solution, and the mixture was cooled to 0° C. while stirring. To the mixture was slowly added dropwise a 28% sodium methoxide solution, followed by stirring at 0° C. for 3 hours. The precipitate thus formed was repeatedly washed with methanol to obtain 960 mg (3.23 mmol) of compound 285d as white powder (yield: 32%).

8-5. Synthesis of Compound 285

In 2 ml of dimethylformamide was dissolved 960 mg of compound 285d, and 2 mg of 2,2'-azobis(2,4-

SYNTHESIS EXAMPLE 9

Synthesis of Compound 306

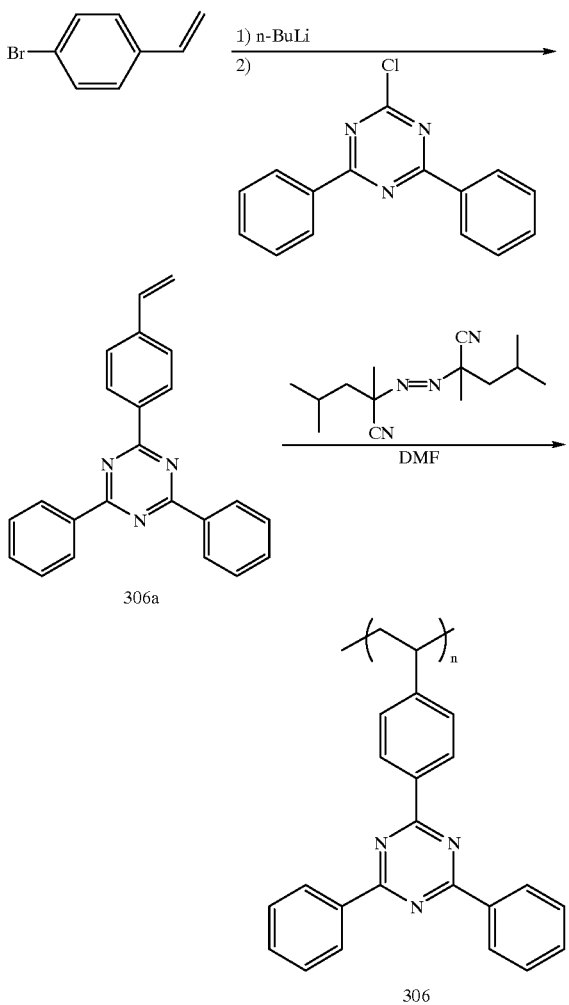

2-Chloro-4,6-diphenyl-1,3,5-triazine, a starting material, was synthesized by the process disclosed in Japanese Patent 3067878.

9-1. Synthesis of Compound 306a

In 50 ml of tetrahydrofuran was dissolved 3.67 g (20.0 mmol) of 4-bromostyrene, and the solution was cooled to −70° C. To the solution was slowly added dropwise 13.1 ml of a 1.6 mol/l solution of n-butyl lithium (21.1 mmol) in hexane, and a solution of 5.35 g (20.0 mmol) of 2-chloro-4,6-diphenyl-1,3,5-triazine in 100 ml of tetrahydrofuran was then slowly added dropwise, followed by stirring at −70° C. for 3 hours. The reaction mixture was warmed to room temperature and extracted with ethyl acetate. The organic layer was washed successively with water and a saturated sodium chloride aqueous solution and dried over anhydrous magnesium sulfate. The solvent was removed by evaporation to give 900 mg (2.68 mmol) of compound 306a (yield: 13%).

dimethylvaleronitrile) (available from Wako Pure Chemical Industries, Ltd.) was added thereto. The mixture was heated at 70° C. for 8 hours while stirring. After cooling to room temperature, the reaction product was re-precipitated from acetone to obtain 454 mg of compound 285 as white powder, which had a weight average molecular weight of 50,000 and a number average molecular weight of 20,000.

9-2. Synthesis of Compound 306

In 2 ml of dimethylformamide was dissolved 900 mg (2.68 mmol) of compound 306a, and 2 mg of 2,2'-azobis(2,4-dimethylvaleronitrile) (available from Wako Pure Chemical Industries, Ltd.) was added thereto. The mixture was heated at 70° C. for 8 hours while stirring. After cooling to room temperature, the reaction product was re-precipitated from acetone to yield 760 mg of compound 306 as white powder, which had a weight average molecular weight of 23,000 and a number average molecular weight of 12,000.

The phosphorescent compound which can be used in the present invention is defined to be a substance which emits light resulting from the transition between states of different multiplicity, typically between the lowest excited triplet state and the singlet ground state, more intensely than others. It is preferable to use a phosphorescent compound having a phosphorescence quantum yield at room temperature of at least 25%, preferably 40% or more, still preferably 60% or more, particularly preferably 80% or more. Such phosphorescent compounds include metal-free organic compounds, metal complexes having a metal-hetero atom bond, and organometal complexes having a metal-carbon bond. In particular, ortho-metalated metal complexes are preferred.

The term "organometal complex" denotes a compound having a metal and an organic group directly bonded via a metal-carbon bond as defined in Yamamoto Akio, *Yukikinzokukagaku-kiso to ohyo*, p. 6, Shokabo Publishing Co. (1982).

"Ortho-metalated (metal) complex" is a generic term given to compounds described, e.g., in Yamamoto Akio, *Yukikinzokukagaku-kiso to ohyo*, p. 150 and p. 232, Shokabo Publishing Co. (1982) and H. Yersin, *Photochemistry and Photophysics of Coordination Compounds*, pp. 71–77 and 135–146, Springer-Verlag (1987). While the center metal of these metal complexes is not particularly limited, transition metal is preferred. Among them, rhodium, platinum, gold, iridium, ruthenium, palladium, osmium, etc. are preferred in the present invention. Iridium is particularly preferred.

While the valence of the metal of the ortho-metalated metal complex is not particularly limited, a valence of 3 is preferred as for iridium. The ligands of the ortho-metalated metal complex include, but are not limited to, aryl-substituted nitrogen-containing hetero rings, in which an aryl group (e.g., phenyl, naphthyl, anthryl or pyrenyl) is bonded to the carbon atom adjacent to the nitrogen atom of the nitrogen-containing hetero ring (e.g., pyridine, pyrimidine, pyrazine, pyridazine, quinoline, isoquinoline, quinoxaline, phthalazine, quinazoline, naphthyridine, cinnoline, phenanthroline, pyrrole, imidazole, pyrazole, oxazole, oxadiazole, triazole, thiadiazole, benzimidazole, benzoxazole, benzothiazole or phenanthridine); a heteroaryl-substituted nitrogen-containing hetero ring, in which a heteroaryl group (e.g., a group having the above-described nitrogen-containing hetero ring, thienyl or furyl) is bonded to the carbon atom adjacent to the nitrogen atom of the nitrogen-containing hetero ring; 7, 8-benzoquinoline, phosphinoaryl, phsophinoheteroaryl, phosphinoxyaryl, phosphinoxyheteroaryl, aminomethylaryl, aminomethylheteroaryl; and derivatives of these rings. Preferred of them are an aryl-substituted nitrogen-containing aromatic hetero ring, a heteroaryl-substituted nitrogen-containing aromatic hetero ring, 7, 8-benzoquinoline, and their derivatives. Still preferred are phenylpyridine, thienylpyridine, 7,8-benzoquinoline, and their derivatives. Thienylpyridine and its derivatives and 7,8-benzoquinoline and its derivatives are particularly preferred.

The ortho-metalated metal complex may contain other ligands in addition to the ligands forming an ortho-metalate.

Various known ligands can be used, such as those described in the above-cited two reference books, preferably a halogen ligand (particularly chloro), a nitrogen-containing heterocyclic ligand (e.g., bipyridyl and phenanthroline), and a diketone ligand, with a chloro ligand and a bipyridyl ligand being still preferred.

The ligands per molecule may be the same, which is preferred, or different. In the latter case, the number of kinds of the ligands per molecule is preferably 2 or 3, still preferably 2.

The ortho-metalated metal complex preferably contains 5 to 100 carbon atoms, particularly 10 to 80 carbon atoms, especially 14 to 50 carbon atoms.

The ortho-metalated metal complexes which are preferred in the present invention include compounds having a partial structure represented by formula (K-1) shown below and their tautomers.

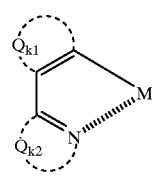

(K-1)

wherein M represents a transition metal; $Q_{k1}$ represents an atomic group necessary for forming a 5- or 6-membered aromatic ring; and $Q_{k2}$ represents an atomic group necessary for forming a 5-or 6-membered aromatic azole ring.

The transition metal as M is rhodium, platinum, gold, iridium, ruthenium, palladium or osmium, preferably rhodium, platinum or iridium, still preferably platinum or iridium, particularly preferably iridium.

The 5- or 6-membered aromatic ring completed by $Q_{k1}$ includes an aromatic hydrocarbon ring and an aromatic heterocyclic ring, such as benzene, naphthalene, anthracene, pyrene, pyridine, quinoline, isoquinoline, pyridazine, pyrimidine, pyrazine, thiophene, furan, pyrrole, pyrazole, imidazole, thiazole, oxazole, thiadiazole, oxadiazole, triazole, quinoxaline, phthalazine, naphthyridine, cinnoline, phenanthroline, benzothiazole, benzoxazole, benzimidazole, and phenanthridine; preferably benzene, naphthalene, pyridine, quinoline, isoquinoline, thiophene, and furan; still preferably benzene, naphthalene, pyridine, quinoline, isoquinoline, and thiophene; particularly preferably benzene, naphthalene and thiophene.

The 5- or 6-membered aromatic azole ring completed by $Q_{k2}$ includes pyridine, quinoline, isoquinoline, pyridazine, pyrimidine, pyrazole, imidazole, thiazole, oxazole, thiadiazole, oxadiazole, triazole, quinoxaline, phthalazine, naphthyridine, cinnoline, phenanthroline, benzothiazole, benzoxazole, benzimidazole, and phenanthridine; preferably pyridine, quinoline, isoquinoline, pyrazole, and pyridazine; still preferably pyridine, quinoline, isoquinoline, and pyrazole; particularly preferably pyridine, quinoline and isoquinoline.

The rings formed by $Q_{k1}$ or $Q_{k2}$ may have a substituent(s), such as those recited as R of formula (I). The preference among the substituents as R also applies here. The substituents may be connected together to form a ring.

The compounds having the partial structure of formula (K-1) and their tautomers may contain more than one transition metals (i.e., polynuclear metal complexes) or may contain other metals.

Of the compounds having the partial structure of formula (K-1) preferred are those represented by formula (K-II) or (K-III) shown below and their tautomers.

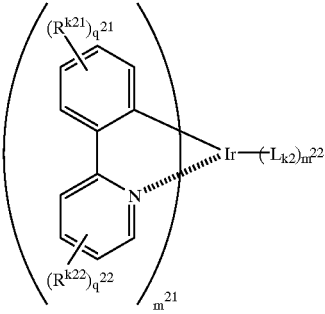

(K-II)

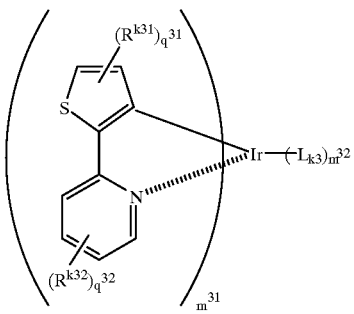

(K-III)

wherein $R^{k21}$, $R^{k22}$, $R^{k31}$, and $R^{k32}$ each represent a substituent; $q^{21}$, $q^{22}$, and $q^{32}$ each represent an integer of 0 to 4; $q^-$ represents an integer of 0 to 2; when $q^{21}$, $q^{22}$, $q^{31}$, or $q^{32}$ is 2 or greater, $R^{k21}$'s, $R^{k22}$'s, $R^{k31}$'s, and $R^{k32}$'s may be the same or different, respectively; $L_{k2}$ and $L_{k3}$ each represent a ligand; $m^{21}$ and $m^{31}$ each represent 1, 2 or 3; and $m^{22}$ and $m^{32}$ each represent an integer of 0 to 5.

The substituents represented by $R^{k21}$, $R^{k22}$, $R^{k31}$, and $R^{k32}$ include those recited as R. The substituents may be further substituted. The substituents may be linked together to form a condensed ring.

$R^{k21}$, $R^{k22}$, $R^{k31}$, and $R^{k32}$ each preferably represent an alkyl group, an aryl group, a heterocyclic group, an alkoxy group, an aryloxy group, a halogen atom, or a group forming a condensed ring on being linked with another, particularly an alkyl group, an aryl group, a fluorine atom or a group forming an aromatic condensed ring on being linked with another.

$q^{21}$, $q^{22}$, $q^{31}$, and $q^{32}$ each preferably represents 0, 1 or 2. Still preferably, $q^{21}+q^{22}=0$, 1 or 2, and $q^{31}+q^{32}=0$, 1 or 2.

The ligands represented by $L_{k2}$ and $L_{k3}$ include those necessary for forming ortho-metalated metal complexes and the other ligands as recited above. $L_{k2}$ and $L_{k3}$ each preferably represent the ligand necessary for forming an ortho-metalated metal complex, a nitrogen-containing heterocyclic ligand, a diketone ligand, or a halogen ligand, particularly the ligand necessary for forming an ortho-metalated metal complex, a diketone ligand or a bipyridyl ligand.

$m^{21}$ and $m^{31}$ are each preferably 2 or 3, still preferably 3. $m^{22}$ and $m^{32}$ are each preferably 0, 1 or 2, still preferably 0 or 1. The combination of $m^{21}$ and $m^{33}$ and the combination of $m^{31}$ and $m^{33}$ are preferably such that the metal complexes represented by formula (K-II) and (K-III) are neutral ones.

The ortho-metalated metal complexes having the partial structure of formula (K-1) may be either a low-molecular compound made up of one unit of formula (K-1) or an oligomeric or polymeric compound made up of a plurality of the units of formula (K-1) which preferably has a weight average molecular weight (Mw) of 1,000 to 5,000,000, particularly 2,000 to 1,000,000, especially 3,000 to 100,000. It is preferred to use a low-molecular weight ortho-metalated metal complex.

Specific examples of the phosphorescent compounds which can be used in the present invention are shown below for illustrative purposes only but not for limitation.

K-1

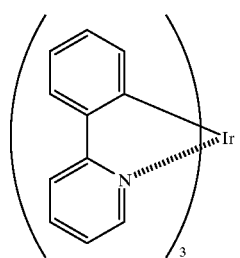

K-2

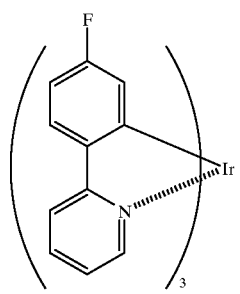

K-3

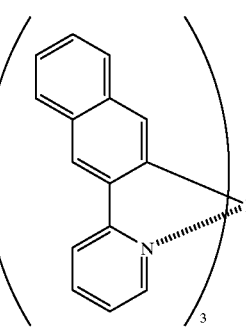

K-4

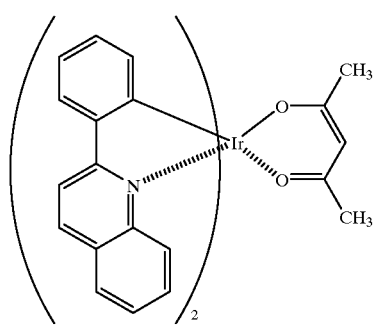

-continued

K-5

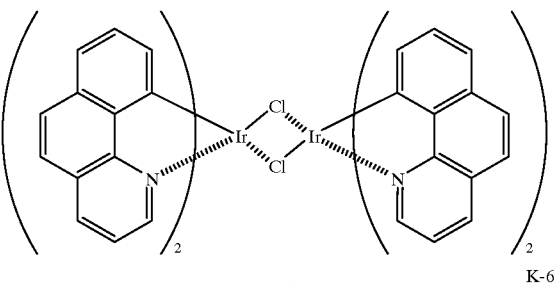

K-6

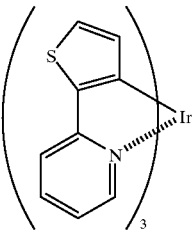

K-7

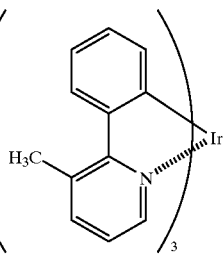

K-8

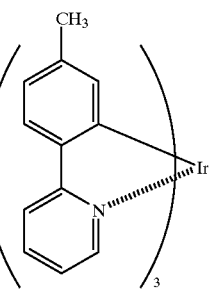

K-9

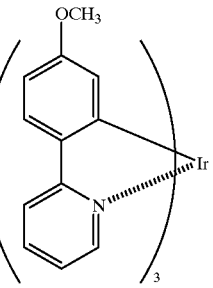

K-10

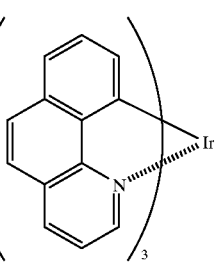

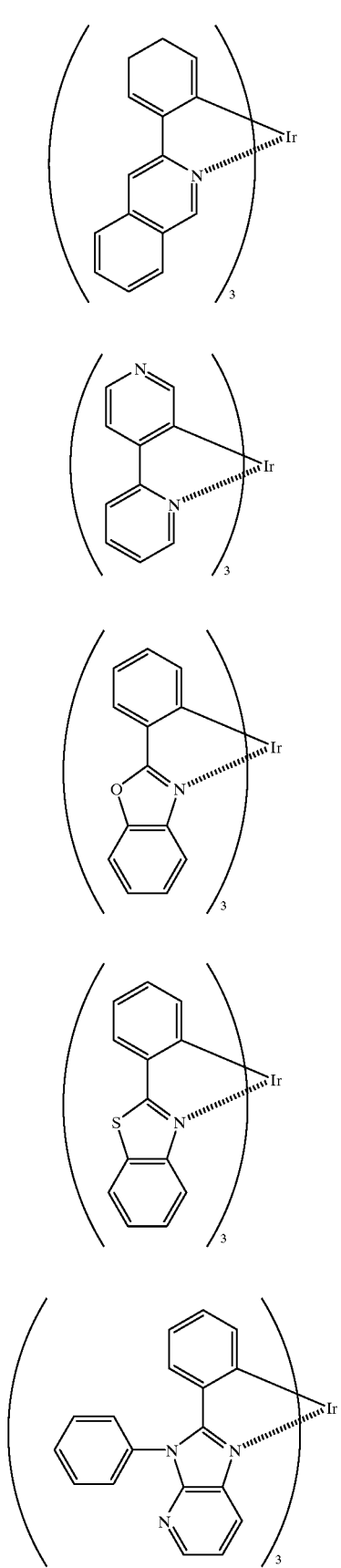
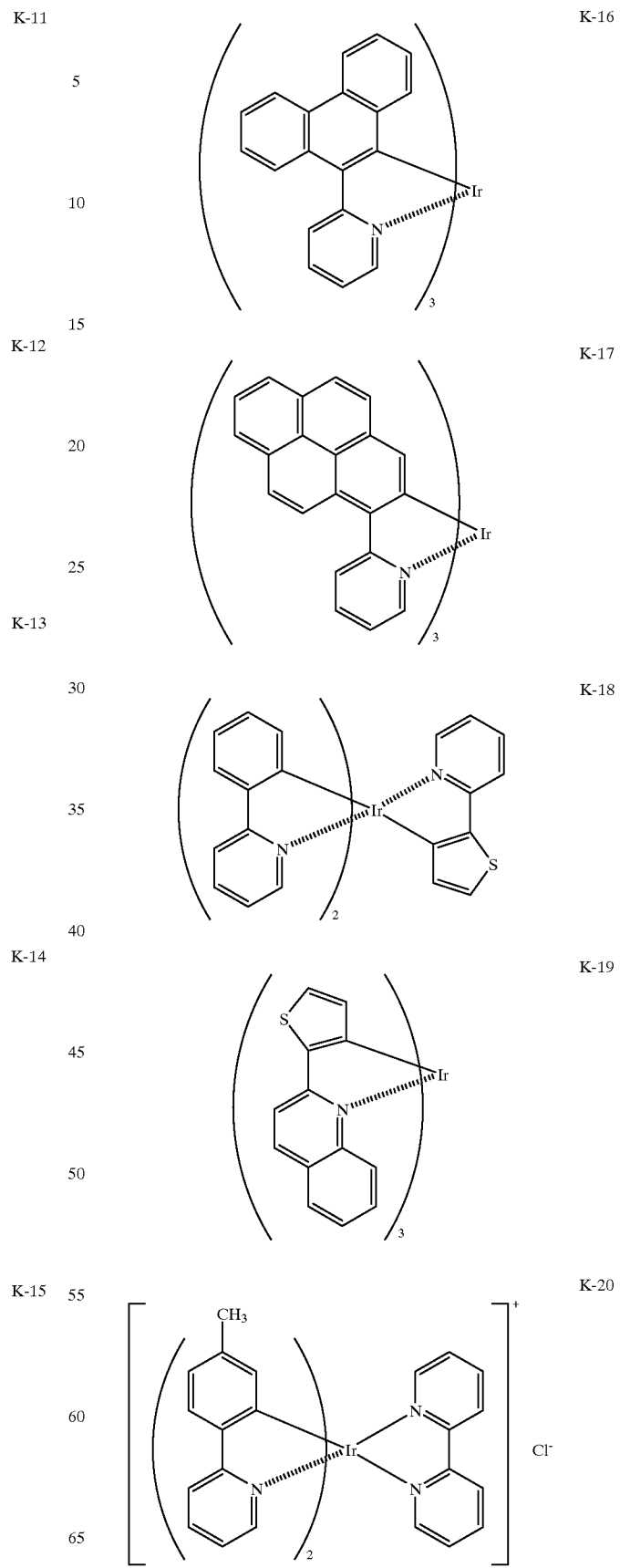

-continued
K-21
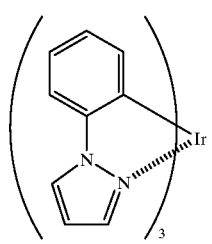
K-22
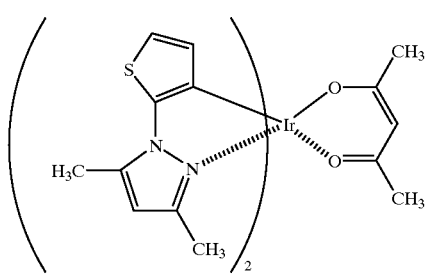
K-23
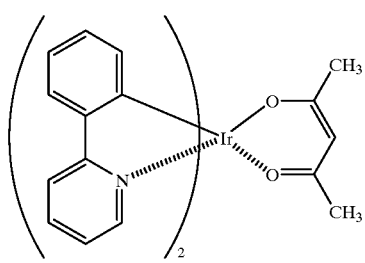
K-24
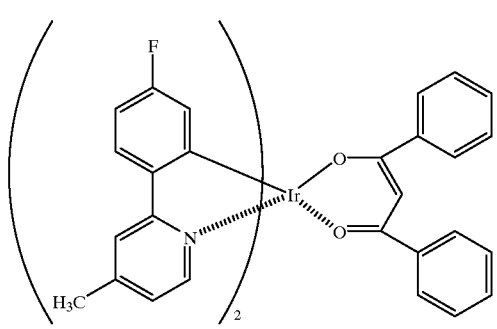
K-25
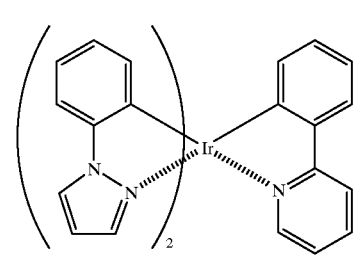
-continued
K-26
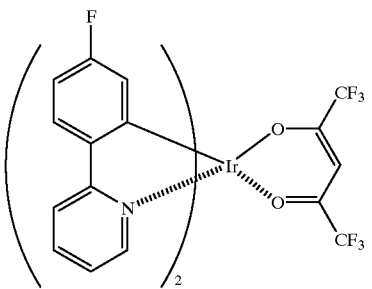
K-27
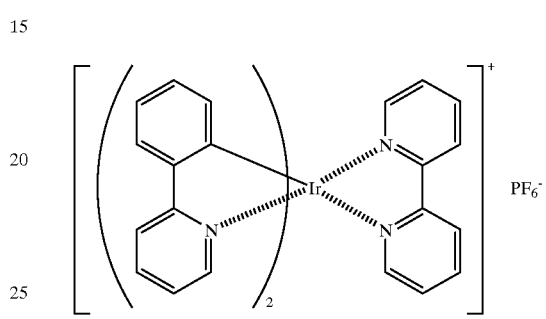
K-28
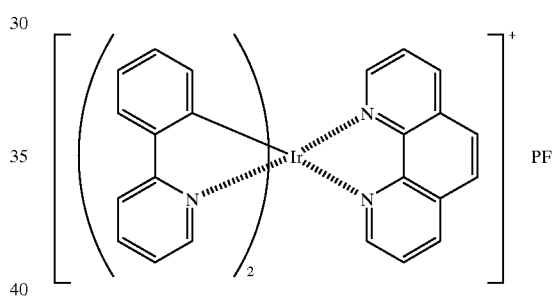
K-29
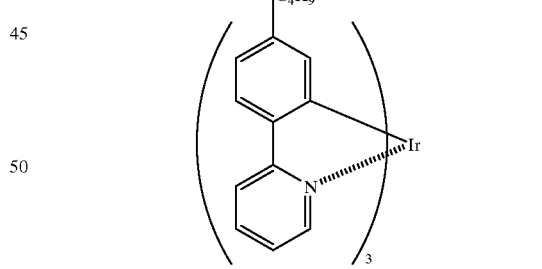
K-30
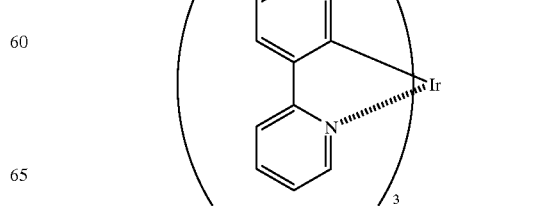

-continued
K-31
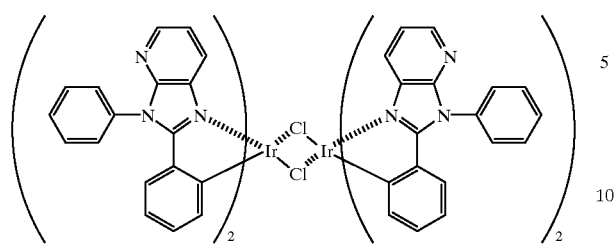
K-36
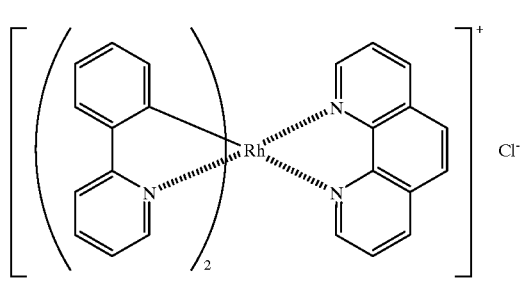
K-32
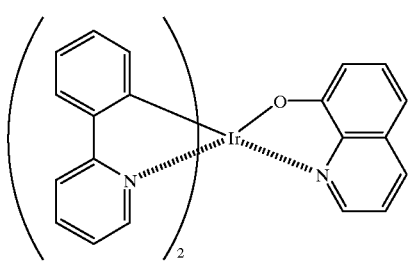
K-37
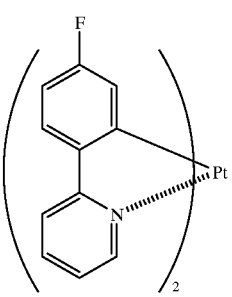
K-33
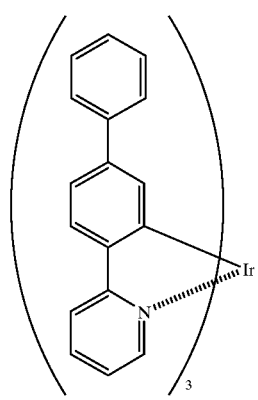
K-38
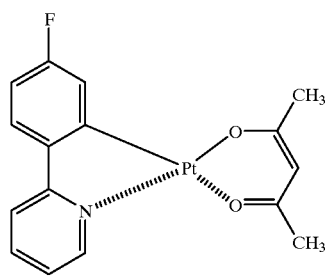
K-34
K-39
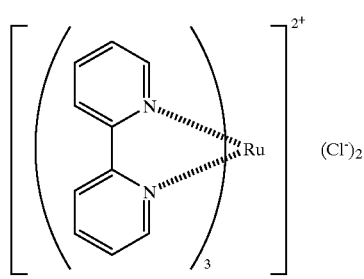
K-35
K-40
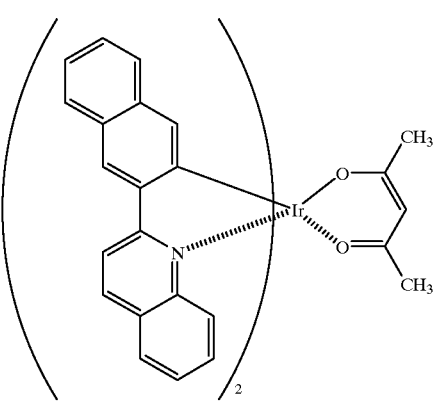

K-41
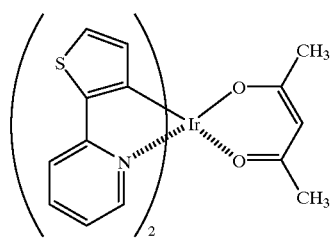
K-42
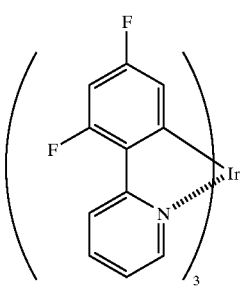
K-43
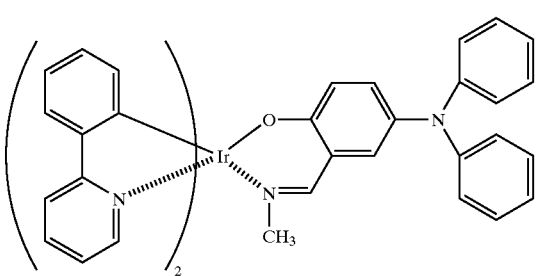
K-44
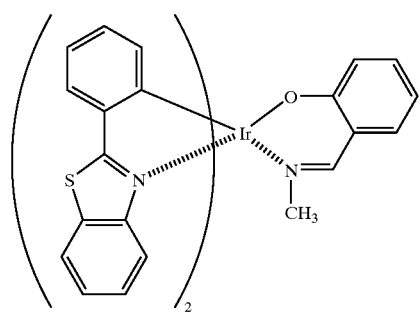
K-45
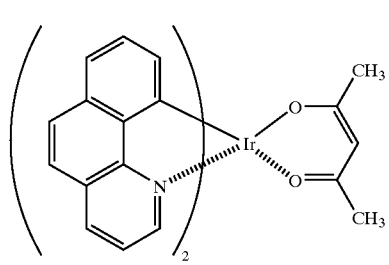
K-46
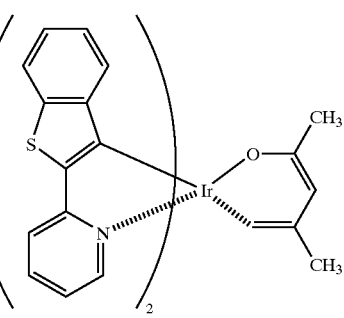
K-47
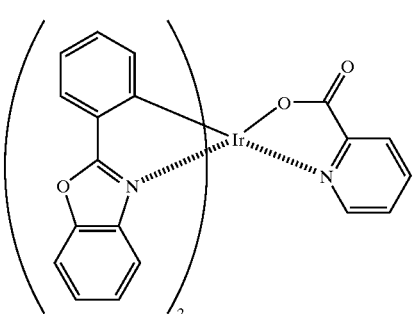
K-48
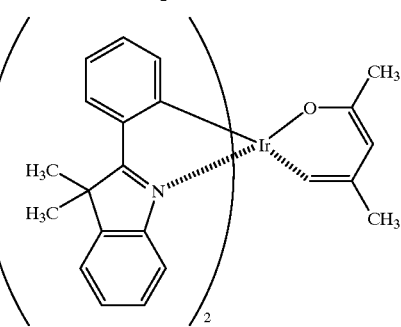
S-1
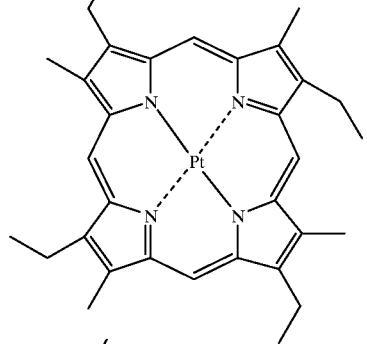
S-2
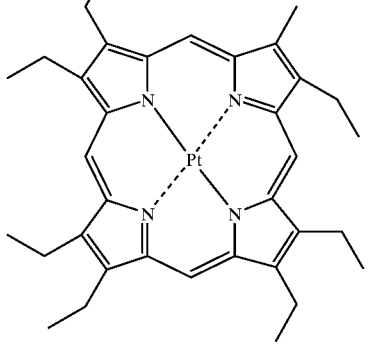

-continued

S-3
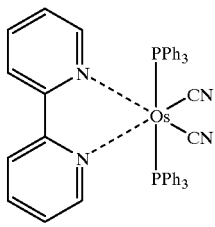

S-4
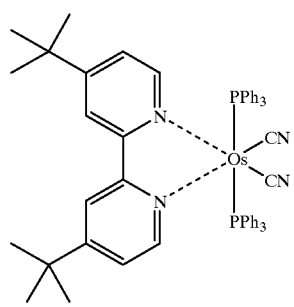

S-5
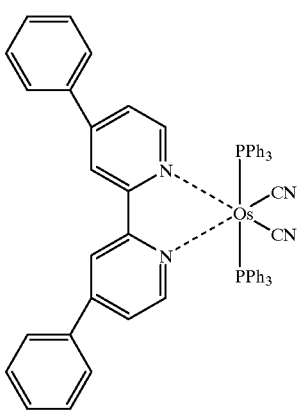

S-6
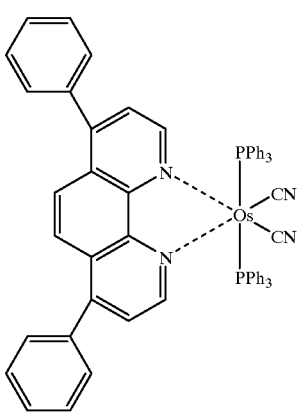

The ortho-metalated metal complexes can be synthesized by various known techniques described, e.g., in *Inorg. Chem.*, No. 30, p. 1685 (1991), ibid, No. 27, p. 3464 (1988), ibid, No.33, p.545 (1994), *Inorg. Chim. Acta*, No. 181, p.245 (1991), *J. Organomet. Chem.*, no. 335, p. 293 (1987), and *J. Am. Chem. Soc.*, No. 107, p. 1431 (1985).

The light-emitting device containing the compounds according to the invention will now be described. While not limiting, the organic layer containing the compounds of the invention can be formed by resistance heating vacuum evaporation, electron beam deposition, sputtering, molecular accumulation, coating, ink jetting, printing, transfer, and the like. From the aspects of device performance and production operation, resistance heating evaporation and coating are preferred.

The light-emitting device of the invention comprises a pair of electrodes (i.e., a positive electrode and a negative electrode) having therebetween a light-emitting layer or a plurality of organic compound layers comprising a light-emitting layer. In addition to the light-emitting layer, the device can have organic compound thin layers such as a hole-injecting layer, a hole-transporting layer, an electron-injecting layer, an electron-transporting layer, and a protective layer. Each of these layers can have other functions in addition to the designate done. Various materials are used to form the layers.

The positive electrode is to supply positive holes to a hole-injecting layer, a hole-transporting layer, a light-emitting layer, and the like. The material forming the positive electrode includes metals, alloys, metal oxides, electrically conductive compounds and mixtures thereof, preferably materials having a work function of 4 eV or higher. Examples include conductive metal oxides, such as tin oxide, zinc oxide, indium oxide, and indium tin oxide (ITO); metals, such as gold, silver, chromium, and nickel; mixtures or laminates composed of these metals and conductive metal oxides; inorganic conductive substances, such as copper iodide and copper sulfide; organic conductive materials, such as polyaniline, polythiophene, and polypyrrole; and laminates of these organic conductive materials and ITO. Conductive metal oxides are preferred. ITO is particularly preferred for productivity, high conductivity, and transparency. The thickness of the positive electrode, while being of choice according to the material used, preferably ranges from 10 nm to 5 µm, particularly 50 nm to 1 µm, especially 100 nm to 500 nm.

The positive electrode is usually formed in a layer on a substrate, such as a soda-lime glass plate, an alkali-free glass plate or a transparent plastic plate. Of the glass materials, alkali-free glass is preferred so as to minimize ions dissolving from glass. In using soda-lime glass, it is desirable to provide a barrier coat, such as silica. The substrate maybe as thin as is consistent with mechanical strength. It is usually desirable for a glass substrate to be at least 0.2 mm thick, particularly at least 0.7 mm thick.

The positive electrode can be formed by various methods according to the material. For example, an ITO film electrode can be formed by electron beam deposition, sputtering, resistance heating vacuum evaporation, chemical reaction (e.g., a sol-gel process), coating with an ITO dispersion, and the like. The positive electrode can be subjected to a surface treatment, such as washing, so as to reduce the driving voltage of the device or to increase luminescence efficiency. For example, a UV-ozone treatment or a plasma treatment is effective for an ITO electrode.

The negative electrode is to supply electrons to an electron-injecting layer, an electron-transporting layer, a light-emitting layer, etc. The negative electrode material is selected from metals, alloys, metal halides, metal oxides, electrically conductive compounds, and mixtures thereof, taking into consideration adhesion to the adjacent layer, such as the electron-injecting layer, the electron-transporting layer or the light-emitting layer, ionizing potential, stability, and the like. Examples of useful materials include alkali metals (e.g., Li, Na, and K) and fluorides and oxides thereof, alkaline earth metals (e.g., Mg and Ca) and fluorides and oxides thereof; gold, silver, lead, aluminum; a sodium-potassium alloy or mixture; a lithium-aluminum alloy or mixture; a magnesium-silver alloy or mixture; indium; and rare earth elements, such as ytterbium. Materials having a work function of 4 eV or less are preferred. Aluminum, a lithium-aluminum alloy or mixture, and a magnesium-silver alloy or mixture are still preferred.

The negative electrode can have a single layer structure made of the above-described compound or mixture or a multilayer structure containing the above-described compound or mixture. The thickness of the negative electrode is selected appropriately according to the material. It is usually 10 nm to 5 $\mu$Mm, preferably 50 nm to 1 $\mu$m, still preferably 100 nm to 1 $\mu$m. The negative electrode is formed by electron beam deposition, sputtering, resistance heating vacuum evaporation, coating, and the like. A single metal may be deposited, or two or more metals may be co-deposited. A plurality of metals may be co-deposited to form an alloy electrode in situ. A previously prepared alloy composition may be deposited. The sheet resistivity of the positive and negative electrodes is preferably as low as possible, e.g., several hundreds of ohms or less per square.

The light-emitting layer can be made of any of materials into which holes can be injected from the positive electrode, the hole-injecting layer or the hole-transporting layer and, at the same time, into which electrons can be injected from the negative electrode, the electron-injecting layer or the electron-transporting layer on voltage application, through which the injected charges are allowed to migrate, and which provide the site where holes and electrons are recombined to generate light output. While the light-emitting layer preferably contains the aforementioned ortho-metalated metal complex, it can also comprise other light-emitting materials. Useful light-emitting materials other than the ortho-metalated metal complex include various metal complexes, typically metal complexes or rare-earth element complexes of benzoxazole, benzimidazole, benzothiazole, styrylbenzene, polyphenyl, diphenylbutadiene, tetraphenylbutadiene, naphthalimide, coumarin, perylene, perinone, oxadiazole, aldazine, pyraridine, cyclopentadiene, bisstyrylanthracene, quinacridone, pyrrolopyridine, thiadiazolopyridine, styrylamine or derivatives of these compounds, aromatic dimethylidyne compounds, 8-quinolinol or derivatives thereof; and polymeric compounds, such as polythiophene, polyphenylene, polyphenylenevinylene, polythienylenevinylene.

While not limiting, the light-emitting layer usually has a thickness of 1 nm to 5 $\mu$m, preferably 5 nm to 1 $\mu$m, still preferably 10 nm to 500 nm.

The light-emitting layer can be formed by, for example, resistance heating vacuum evaporation, electron beam deposition, sputtering, molecular accumulation, coating (spin coating, casting, dip coating, etc.), a Langmuir-Blodgett (LB) method, ink jetting, printing, transfer, and so forth. Resistance heating vacuum evaporation or coating is preferred.

The light-emitting layer may have a single layer structure made of one or two or more of the above-described compound or a multilayer structure containing several layers, the several layers having a same composition or a different composition.

The hole-injecting layer and the hole-transporting layer can be of materials that have any one of a function of injecting holes from the positive electrode, a function of transporting the holes, and a function of blocking the electrons injected from the negative electrode. Examples of such materials include carbazole, triazole, oxazole, oxadiazole, imidazole, polyarylalkanes, pyrazoline, pyrazolone, phenylenediamine, arylamine, amino-substituted chalcones, styrylanthracene, fluorenone, hydrazone, stilbene, silazane and derivatives of these compounds; aromatic tertiary amine compounds; styrylamine compounds; aromatic dimethylidyne compounds; porphyrinic compounds; polysilane compounds; poly(N-vinylcarbazole) and its derivatives; aniline copolymers; conductive oligomers, such as thiophene oligomers and polythiophene; a carbon film; and the like.

While not limiting, the thickness of the hole-injecting layer or the hole-transporting layer is usually 1 nm to 5 $\mu$m, preferably 5 nm to 1 $\mu$m, still preferably 10 nm to 500 nm. The hole-injecting layer and the hole-transporting layer may have a single layer structure made up of one or more than one of the above-described materials, or a multilayer structure composed of a plurality of layers having the same or different compositions.

The hole-injecting layer and the hole-transporting layer can be formed by, for example, vacuum evaporation, an LB method, ink jetting, printing, transfer, or coating (spin coating, casting, dip coating, etc.) with a solution or dispersion of a hole-injecting and/or transporting compound in a solvent. The solution or dispersion used for coating can contain a resin component, such as polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resins, ketone resins, phenoxy resins, polyamide, ethyl cellulose, polyvinyl acetate, ABS resins, polyurethane, melamine resins, unsaturated polyester resins, alkyd resins, epoxy resins, and silicone resins.

The electron-injecting layer and the electron-transporting layer can be of a material that has any one of a function of injecting electrons from the negative electrode, a function of transporting electrons, and a function of blocking the holes injected from the positive electrode. Examples of such a material include various metal complexes, typically metal complexes of triazole, oxazole, oxadiazole, fluorenone, anthraquinodimethane, anthrone, diphenylquinone, thiopyran dioxide, carbodiimide, fluorenylidenemethane, distyrylpyrazine, aromaticring (e.g., naphthaleneorperylene) tetracarboxylicacidanhydrides, phthalocyanine, 8-quinolinol, and derivatives of these compounds; and metal complexes having methallophthalocyanine, benzoxazole or benzothiazole as a ligand.

While not limiting, the thickness of the electron-injecting layer and the electron-transporting layer is usually 1 nm to 5 $\mu$m, preferably 5 nm to 1 $\mu$m, still preferably 10 nm to 500 nm. The electron-injecting layer and the electron-transporting layer may have a single layer structure made up of one or more than one of the above-described materials, or a multilayer structure composed of a plurality of layers having the same or different compositions.

The electron-injecting layer and the electron-transporting layer can be formed by, for example, vacuum evaporation, an LB method, ink jetting, printing, transfer, or coating (spin coating, casting, dip coating, etc.) with a solution or dispersion of a electron-injecting and/or transporting compound in a solvent. The solution or dispersion used for coating can contain such a resin component as mentioned above with respect to the hole-injecting layer and the hole-transporting layer.

The protective layer can be of any material that prevents substances which may accelerate deterioration of the device, such as moisture and oxygen, from entering the device. Such materials include metals, e.g., In, Sn, Pb, Au, Cu, Ag, Al, Ti, and Ni; metal oxides, e.g., MgO, SiO, $SiO_2$, $Al_2O_3$, GeO, NiO, CaO, BaO, $Fe_2O_3$, $Y_2O_3$, and $TiO_2$; nitride, e.g., SiNx and SiNxOy; metal fluorides, e.g., MgF$_2$, LiF, AlF$_3$, and CaF$_2$; polyethylene, polypropylene, polymethyl methacrylate, polyimide, polyurea, polytetrafluoroethylene, polychlorotrifluoroethylene, polydichlorodifluoroethylene, chlorotrifluoroethylene-dichlorodifluoroethylene copolymers, tetrafluoroethylene copolymers, fluorine-containing copolymers having a cyclic structure in the main chain thereof, water absorbing materials having a water absorption of 1% or more, and moisture proof materials having a water absorption of 0.1% or less.

The protective layer can be formed by, for example, vacuum evaporation, sputtering, reactive sputtering, molecular beam epitaxy, ionized cluster beam deposition, ion plating, plasma polymerization (RF-excited ion plating), plasma-enhanced CVD, laser-assisted CVD, thermal CVD, gas source CVD, coating, ink jetting, printing or transfer.

EXAMPLES

The present invention will now be illustrated in greater detail by way of Examples, but it should be understood that the invention is not limited thereto.

Example 1

A glass plate 25 mm wide, 25 mm long and 0.7 mm thick having a 150 nm thick ITO film (available from Tokyo Sanyo Shinku K.K.) was used as a transparent conductive substrate. Before use, the substrate was surface-treated by etching followed by washing. Copper phthalocyanine was deposited by vacuum evaporation to a thickness of about 10 nm. Then an about 40 nm thick layer of N,N'-bis(3-methylphenyl)-N,N'-diphenylbenzidine (TPD), an about 20 nm thick light-emitting layer shown in Table 1 below (host:light-emitting material=about 94:6 by weight), an about 6 nm thick layer of bathocuproine (2,9-dimethyl-4,7-diphenyl-1,10-phenanthroline), and an about 20 nm thick layer of Alq (tris (8-hydroxyquinolinato) aluminum) were successively deposited in the order described in a vacuum of $10^{-3}$ to $10^{-4}$ Pa at a substrate temperature of room temperature. A patterned mask (a mask providing a light-emissive area of 4 mm by 5 mm) was placed on the deposited organic thin film, and magnesium and silver were co-deposited thereon at a ratio of 10:1 to a thickness of 250 nm in a vacuum chamber. Finally, silver was vacuum deposited to a thickness of 300 nm to prepare an EL device (numbered from 101 through 115).

A DC constant voltage of 12 V was applied to the EL device by use of a source measure unit Model 2400, supplied by Toyo Corp., and the brightness (luminance) and the wavelength of the light emitted were measured with a luminance meter BM-8, available from Topcon Corp., and a spectral analyzer PMA-11, available from Hamamatsu Photonics K.K., respectively. The results obtained are shown in Table 1.

Further, the EL device was put into an autoclave purged with argon gas and kept at 85° C. for 3 days. After the storage, the luminance was measured in the same manner, and the condition of the light-emitting surface was observed. The light-emitting surface which developed dark spots (non-luminescent spots) slightly was judged "good", and the light-emitting surface which developed dark spots considerably was judged "bad". The results obtained are also shown in Table 1.

TABLE 1

| | Light-emitting Layer | | EL Characteristics Immediately after Preparation | | | EL Characteristics after 85° C. Storage | | |
|---|---|---|---|---|---|---|---|---|
| EL Device No. | Host material (Compound No.) | Light-emitting Material | Wavelength $\lambda_{max}$ (nm) | Luminance at 12 V (cd/m$^2$) | External Quantum Efficiency (%) | Luminance at 12 V (cd/m$^2$) | Light-emitting Surface Condition | Remark |
| 101 | CBP* | K-1 | 513 | 36600 | 8.1 | 11700 | bad | comparison |
| 102 | CBP | K-6 | 552 | 29800 | 6.8 | 8500 | bad | " |
| 103 | 61 | K-1 | 513 | 38200 | 10.2 | 31000 | good | invention |
| 104 | 61 | K-6 | 554 | 30800 | 7.3 | 28800 | good | " |
| 105 | 62 | K-1 | 514 | 37400 | 9.3 | 30600 | good | " |
| 106 | 62 | K-6 | 553 | 31000 | 7.6 | 29000 | good | " |
| 107 | 205 | K-1 | 514 | 37000 | 9.0 | 34400 | good | " |
| 108 | 205 | K-2 | 488 | 27100 | 7.0 | 24900 | good | " |
| 109 | 205 | K-6 | 552 | 30800 | 7.3 | 26800 | good | " |
| 110 | 246 | K-1 | 513 | 38200 | 8.6 | 32200 | good | " |
| 111 | 291 | K-1 | 514 | 54000 | 14.6 | 48000 | good | " |
| 112 | 291 | K-6 | 553 | 42200 | 8.3 | 39300 | good | " |
| 113 | 291 | K-40 | 633 | 30500 | 7.1 | 26200 | good | " |
| 114 | 297 | K-1 | 515 | 35900 | 8.0 | 30700 | good | " |
| 115 | 297 | K-6 | 555 | 29900 | 6.9 | 26700 | good | " |

*CBP: Biscarbazolylbiphenyl of formula:

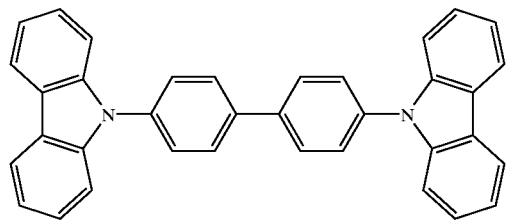

As is apparent from the results in Table 1, the light-emitting devices containing the compound of the present invention as well as those containing CBP known from the literature achieve higher external quantum efficiencies than 5%. The devices containing CBP, however, undergo a great reduction in luminance and develop dark spots considerably when stored in high temperature, whereas the devices according to the present invention show markedly improved durability against storage, sustaining satisfactory conditions of the light-emitting surface with the reduction in luminance being suppressed.

Example 2

The same ITO glass substrate as used in Example 1, as etched and washed, was spin coated with a solution of 40 mg of poly(N-vinylcarbazole) (PVK) having a weight average molecular weight of 23,000 (on polystyrene conversion), 12 mg of 2-(4-t-butylphenyl)-5-(4-biphenyl)-1,3,4-oxadiazole (PBD), and 1 mg of 3-(2'-benzothiazolyl)-7-diethylamino-coumarin commonly known as coumarin-6 in 3 ml of 1,2-dichloroethane to form an organic layer having a thickness of about 120 nm. A negative electrode was then deposited thereon in the same manner as in Example 1 to prepare an EL device (numbered 201).

EL devices 202 to 210 were prepared in the same manner as for EL device 201, except for replacing coumarin-6 with 1 mg of the light emitting material shown in Table 2 below. In the devices 202 to 210, 20 mg of each host material was employed.

EL characteristics of the resulting EL devices were evaluated in the same manner as in Example 1, except that a DC constant voltage of 18 V was applied. The results obtained are shown in Table 2.

TABLE 2

PVK

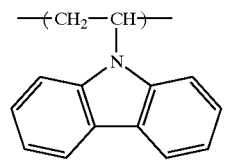

Mw: 23,000
(on polystyrene conversion)

PBP

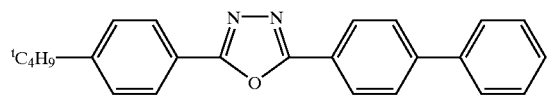

coumarin-6

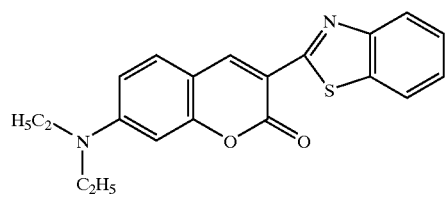

| | Light-emitting Layer | | EL Characteristics Immediately after Preparation | | | EL Characteristics after 85° C. Storage | | |
|---|---|---|---|---|---|---|---|---|
| Device No. | Host material (Compound No.) | Light-emitting Material | Wavelength $\lambda_{max}$ (nm) | Luminance at 18 V (cd/m$^2$) | External Quantum Efficiency (%) | Luminance at 18 V (cd/m$^2$) | Light-emitting Surface Condition | Remark |
| 201 | — | coumarin-6 | 527 | 2750 | 0.7 | 520 | bad | comparison |
| 202 | CBP | coumarin-6 | 526 | 2300 | 0.6 | 340 | bad | " |
| 203 | 61 | K-1 | 513 | 14800 | 3.5 | 11700 | good | invention |
| 204 | 63 | K-1 | 514 | 17200 | 3.9 | 13400 | good | " |
| 205 | 63 | K-41 | 568 | 12900 | 3.0 | 9800 | good | " |
| 206 | 65 | K-1 | 513 | 16400 | 3.7 | 12300 | good | " |
| 207 | 152 | K-1 | 512 | 15600 | 3.6 | 11900 | good | " |
| 208 | 195 | K-1 | 512 | 18100 | 3.9 | 14100 | good | " |
| 209 | 236 | K-1 | 513 | 16900 | 3.6 | 13400 | good | " |
| 210 | 281 | K-1 | 513 | 17500 | 4.0 | 14000 | good | " |

As can be seen from the results in Table 2, the EL device of the present invention which is prepared by a solvent coating method also exhibits satisfactory EL characteristics (luminance and luminescence efficiency) and excellent storage durability.

Example 3

The same ITO glass substrate as used in Example 1, as etched and washed, was provided with a hole-injecting layer of polyethylenedioxythiophene doped with polystyrenesulfonic acid and then spin coated with a solution of 26 mg of the host polymer shown in Table 3 below, 20 mg of CBP and 1 mg of the light-emitting material shown in Table 3 in 3.1 ml of 1,2-dichloroethane to form an organic layer having a thickness of about 120 nm. A negative electrode was deposited on the organic layer in the same manner as in Example 1 to prepare an EL device (numbered 301 through 313).

EL characteristics of the resulting EL devices were evaluated in the same manner as in Example 1, except that a DC constant voltage of 15 V was applied. The results obtained are shown in Table 3.

expected to have a low luminescence efficiency also exhibit high EL characteristics (luminance and luminescence efficiency) and excellent storage durability.

Example 4

On a polycarbonate film were deposited a 200 nm thick $SiO_xN_y$ (x=about 0.7; y=about 0.3) layer and a 200 nm thick ITO layer in this order by sputtering to prepare a substrate. The substrate was spin coated with a solution of PTPDES/TBPA (Tris(4-bromophenyl)aminium hexachloroantimonate) (20 mg/5 mg) in 2.5 ml of 1,2-dichloroethane to a thickness of about 20 nm. Compound H-1 was deposited thereon to a thickness of about 35 nm by vacuum evaporation. Compound 265 and compound K-2 were co-deposited at a ratio of 15:2 to a thickness of 36 nm by simultlaneous vacuum evaporation. Compound 377 was vacuum deposited to a thickness of 18 nm, and compound 291 was then vacuum deposited to a thickness of 18 nm. A patterned mask (a mask providing a light-emissive area of 2 mm by 2 mm) was placed on the deposited organic thin film, and lithium fluoride and aluminum were deposited thereon by vacuum evaporation to a thickness of 1 nm and 200 nm, respectively.

TABLE 3

| Device No. | Light-emitting Layer Host Polymer (Compound No.) | Light-emitting Material | EL Characteristics Immediately after Preparation Wave-length $\lambda_{max}$ (nm) | Luminance at 15 V (cd/m²) | External Quantum Efficiency (%) | EL Characteristics after 85° C. Storage Luminance at 15 V (cd/m²) | Light-emitting Surface Condition | Remark |
|---|---|---|---|---|---|---|---|---|
| 301 | PVK | K-1 | 513 | 500 | 0.64 | 385 | bad | comparison |
| 302 | 169 | K-1 | 514 | 8750 | 2.8 | 6950 | good | invention |
| 303 | 172 | K-1 | 516 | 6900 | 3.2 | 4920 | good | " |
| 304 | 177 | K-1 | 516 | 18900 | 3.5 | 17500 | good | " |
| 305 | 177 | K-2 | 488 | 14300 | 2.9 | 13200 | good | " |
| 306 | 177 | K-40 | 633 | 8990 | 2.2 | 7600 | good | " |
| 307 | 285 | K-1 | 513 | 19200 | 4.6 | 17650 | good | " |
| 308 | 285 | K-2 | 490 | 18750 | 3.2 | 16900 | good | " |
| 309 | 285 | K-40 | 634 | 7880 | 2.8 | 6940 | good | " |
| 310 | 304 | K-1 | 511 | 11150 | 3.3 | 9380 | good | " |
| 311 | 306 | K-1 | 514 | 17800 | 3.6 | 16900 | good | " |
| 312 | 306 | K-2 | 489 | 14320 | 2.9 | 13000 | good | " |
| 313 | 306 | K-40 | 631 | 6900 | 2.2 | 5800 | good | " |

It is seen that the devices according to the invention which are prepared by a coating method and are therefore generally Finally, silicon nitride was deposited by plasma-enhanced CVD as a sealing film to complete a light-emitting device.

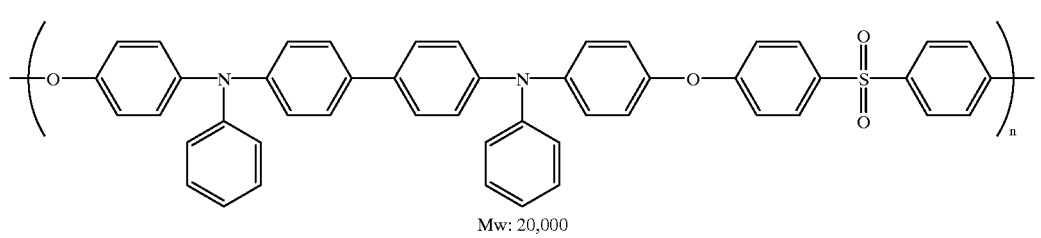

PTPDES

Mw: 20,000

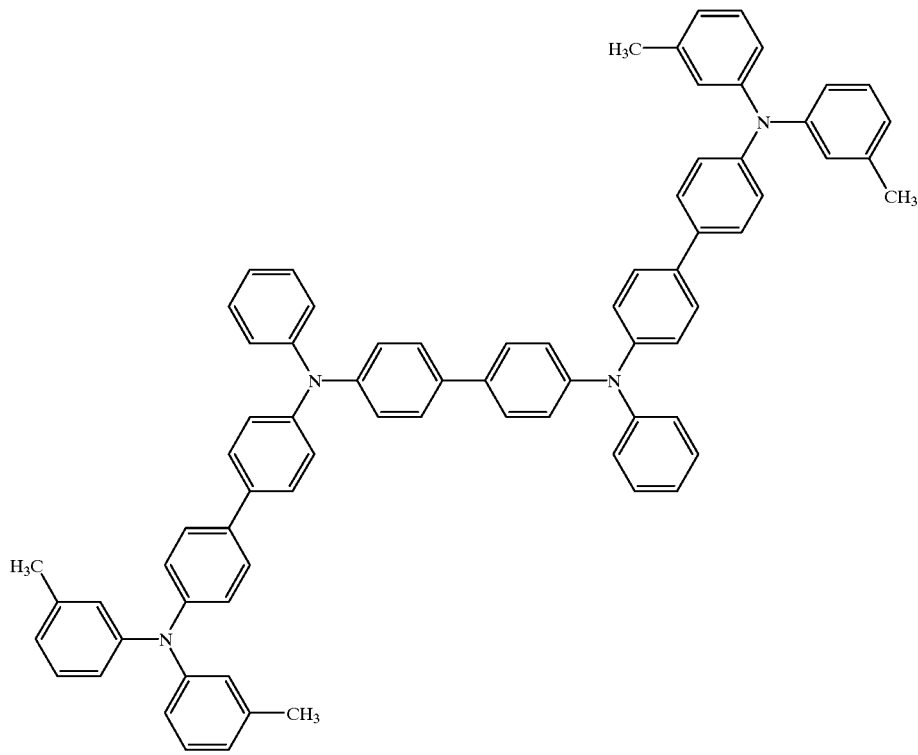

H-1

A DC constant voltage was applied to the light-emitting device by use of a source measure unit Model 2400, supplied by Toyo Corp., to make the device emit light. The brightness (luminance) was measured with a luminance meter BM-8, available from Topcon Corp., and the wavelength and the CIE chromaticity coordinates of the light emitted were measured with a spectral analyzer PMA-11, available from Hamamatsu Photonics K.K. As a result, the maximum luminescence wavelength was 484 nm; the chromaticity coordinates (x, y) were (0.19, 0.51); and the external quantum efficiency was 12%, indicating high luminescence efficiency. Example 4 additionally demonstrates applicability of the present invention to a flexible light-emitting device which achieves high luminescence efficiency.

Example 5

A cleaned ITO substrate was placed in a vacuum evaporation apparatus, and TPD was deposited to a thickness of 50 nm. Compound 75 and compound K-40 were then co-deposited on the TPD layer at a ratio of 17:1 to a thickness of 30 nm. Compound 381 and compound K-42 were co-deposited at a ratio of 17:1 to a film thickness of 2 nm. Compound 377 and compound 291 were further deposited to a thickness of 10 nm and 26 nm, respectively. A patterned mask (a mask providing a light-emissive area of 4 mm by 5 mm) was placed on the deposited organic thin film, and lithium fluoride and then aluminum were vacuum evaporated and deposited thereon to a thickness of 2 nm and 400 nm, respectively, to complete a light-emitting device.

The luminescence characteristics of the resulting device were evaluated in the same manner as in Example 4. As a result, the chromaticity coordinates (x, y) were (0.33, 0.35) (white light emission); the maximum luminance was 59,000 cd/m$^2$; and the external quantum efficiency was 13.7%. It is seen from these results that the present invention achieves high luminescence efficiency even when applied to a light-emitting device emitting white light that has achieved low efficiency and that the white light emitted has very excellent color purity.

The light-emitting device according to the invention has high luminescence brightness and efficiency. It exhibits greatly improved durability when stored in high temperature, showing a suppressed reduction in brightness and maintaining a satisfactory light-emitting surface condition. Even where the device is of the type prepared by a solvent coating method which generally has a lower luminescence efficiency, the same effects are obtained.

The entire disclosure of each and every foreign patent application from which the benefit of foreign priority has been claimed in the present application is incorporated herein by reference, as if fully set forth.

What is claimed is:

1. A polymer comprising a repeating unit represented by formula (D-I):

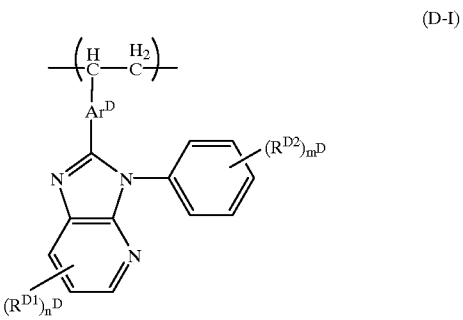

(D-I)

wherein $Ar^D$ represents an arylene group or a divalent heterocyclic group; $R^{D1}$ and $R^{D2}$ each independently represent a hydrogen atom or a substituent; $n^D$ represents an integer of 0 to 3; and $m^D$ represents an integer of 0 to 5.

2. The polymer according to claim 1, wherein $n^D$ of formula (D-I) is 0 or 1.

3. The polymer according to claim 1, wherein $m^D$ of formula (D-I) is 0 or 1.

4. The polymer according to claim 3, wherein $m^D$ of formula (D-I) is 1.

5. The polymer according to claim 1, wherein $R^{D1}$ and $R^{D2}$ each independently represents a hydrogen atom, an alkyl group, an aryl group or an aromatic heterocyclic group.

6. The polymer according to claim 5, wherein $R^{D1}$ and $R^{D2}$ each independently represents a hydrogen atom or an alkyl group.

7. The polymer according to claim 6, wherein $R^{D1}$ and $R^{D2}$ represent a hydrogen atom.

8. A light-emitting device comprising at least one organic compound layer comprising a light-emitting layer between a pair of electrodes wherein the at least one organic compound layer comprises a heterocyclic compound comprising a repeating

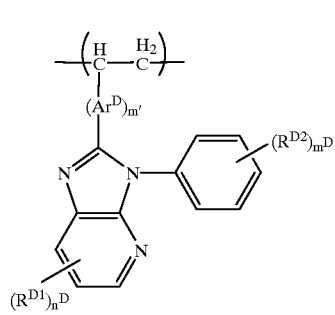

(D)

unit represented by formula (D):
wherein $Ar^D$ represents an arylene group or a divalent heterocyclic group; $R^{D1}$ and $R^{D2}$ each independently represent a hydrogen atom or a substituent; $n^D$ represents an integer of 0 to 3; $m^D$ represents an integer of 0 to 5; and m' represents 0 or 1.

9. The light-emitting device according to claim 8, wherein the substituent is a group selected from the group consisting of an alkyl group, an alkenyl group, an alkynyl group, an aryl group, an alkoxy group, an aryloxy group, an acyl group, a halogen atom, a cyano group, a heterocyclic group, and a silyl group.

10. The light-emitting device according to claim 8, wherein the organic compound layers comprise a polymer.

11. The light-emitting device according to claim 8, wherein m' of formula (D) is 1.

12. The light-emitting device according to claim 8, wherein $n^D$ of formula (D-I) is 0 or 1.

13. The light-emitting device according to claim 8, wherein $m^D$ of formula (D-I) is 0 or 1.

14. The light-emitting device according to claim 13, wherein $m^D$ of formula (D-I) is 1.

15. The light-emitting device according to claim 8, wherein $R^{D1}$ and $R^{D2}$ each independently represents a hydrogen atom, an alkyl group, an aryl group or an aromatic heterocyclic group.

16. The light-emitting device according to claim 15, wherein $R^{D1}$ and $R^{D2}$ each independently represents a hydrogen atom or an alkyl group.

17. The light-emitting device according to claim 16, wherein $R^{D1}$ and $R^{D2}$ represent a hydrogen atom.

18. The light-emitting device according to claim 8, wherein the at least one of the organic compound layers further comprises a phosphorescent compound.

19. The light-emitting device according to claim 18, wherein the phosphorescent compound has a phosphorescence quantum yield at room temperature of at least 25%.

20. The light-emitting device according to claim 18, wherein the phosphorescent compound is an organic metal complex.

21. The light-emitting device according to claim 20, wherein the organic metal complex is an ortho-metalated metal complex.

22. The light-emitting device according to claim 21, wherein the ortho-metalated metal complex contains 5 to 100 carbon atoms.

23. The light-emitting device according to claim 21, wherein the ortho-metalated metal complex is a compound having a partial structure represented by formula (K-1):

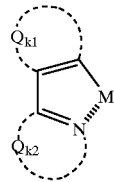

(K-1)

wherein M represents a transition metal; $Q_{k1}$ represents an atomic group necessary for forming a 5- or 6-membered aromatic ring; and $Q_{k2}$ represents an atomic group necessary for forming a 5- or 6-membered aromatic azole ring;
or tautomer of the compound.

24. The light-emitting device according to claim 21, wherein the ortho-metalated metal complex is an iridium complex.

25. The light-emitting device comprising:
at least one organic compound layer comprising a light-emitting layer between a pair of electrodes, wherein the at least one organic compound layers comprise a heterocylic compound having at least two hetero atoms and a phosphorescent compound, and wherein the heterocyclic compound is represented by formula (I):

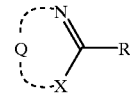

(I)

wherein R represents a hydrogen atom or a substituent; X represents =N— or =N—$R^a$; $R^a$ represents a hydrogen atom, an aliphatic hydrogen group, an aryl group or a heterocyclic group; and Q represents an atomic group necessary for forming a 5-membered hetero ring together with N and X,
wherein the heterocyclic compound is a polymer comprising a repeating unit represented by formula (E):

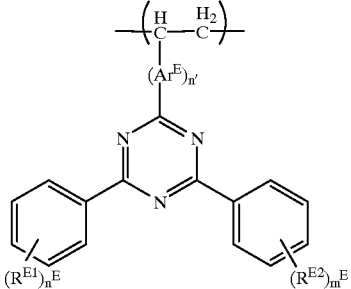

(E)

wherein $Ar^E$ represents an arylene group or a divalent heterocyclic group; $R^{E1}$ and $R^{E2}$ each independently represent a hydrogen atom or a substituent; $n^E$ and $m^E$ each independently represent an integer of 0 to 5; and n' represents 0 or 1.

26. The light-emitting device according to claim 25, wherein the phosphorescent compound is an organic metal complex.

27. The light-emitting device according to claim 26, wherein the organic metal complex is an ortho-metalated metal complex.

28. The light-emitting device according to claim 25, wherein the substituent is a group selected from the group consisting of an alkyl group, an alkenyl group, an alkynyl group, an aryl group, an alkoxy group, an aryloxy group, an acyl group, a halogen atom, a cyano group, a heterocyclic group, and a silyl group.

* * * * *